(12) United States Patent
Yamazaki et al.

(10) Patent No.: US 12,052,853 B2
(45) Date of Patent: Jul. 30, 2024

(54) SEMICONDUCTOR DEVICE AND METHOD FOR DRIVING SEMICONDUCTOR DEVICE

(71) Applicant: Semiconductor Energy Laboratory Co., Ltd., Kanagawa-ken (JP)

(72) Inventors: Shunpei Yamazaki, Tokyo (JP); Hajime Kimura, Kanagawa (JP); Takayuki Ikeda, Kanagawa (JP); Kiyoshi Kato, Kanagawa (JP); Yuta Endo, Kanagawa (JP); Junpei Sugao, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/233,172

(22) Filed: Aug. 11, 2023

(65) Prior Publication Data

US 2023/0389262 A1    Nov. 30, 2023

Related U.S. Application Data

(63) Continuation of application No. 17/503,651, filed on Oct. 18, 2021, now Pat. No. 11,729,960, which is a
(Continued)

(30) Foreign Application Priority Data

Jun. 8, 2017  (JP) .................................. 2017-113842

(51) Int. Cl.
*H10B 12/00*  (2023.01)
*G11C 5/02*  (2006.01)
(Continued)

(52) U.S. Cl.
CPC .............. *H10B 12/00* (2023.02); *G11C 5/02* (2013.01); *G11C 11/403* (2013.01); *G11C 11/409* (2013.01); *H01L 29/24* (2013.01)

(58) Field of Classification Search
CPC ..... H10B 12/00; H10B 41/70; H01L 27/1225; H01L 29/24; H01L 29/66969;
(Continued)

(56) References Cited

U.S. PATENT DOCUMENTS

| 5,528,032 A | 6/1996 | Uchiyama |
| 6,727,544 B2 | 4/2004 | Endoh et al. |

(Continued)

FOREIGN PATENT DOCUMENTS

| JP | 2011-066417 A | 3/2011 |
| JP | 2011-119674 A | 6/2011 |

(Continued)

OTHER PUBLICATIONS

International Search Report (Application No. PCT/IB2018/053786) Dated Aug. 14, 2018.
(Continued)

*Primary Examiner* — Brook Kebede
(74) *Attorney, Agent, or Firm* — Husch Blackwell LLP

(57) ABSTRACT

A semiconductor device with a large storage capacity per unit area is provided.

A semiconductor device includes a memory cell. The memory cell includes a first conductor; a first insulator over the first conductor; a first oxide over the first insulator and including a first region, a second region, and a third region positioned between the first region and the second region; a second insulator over the first oxide; a second conductor over the second insulator; a third insulator positioned in contact with a side surface of the first region; and a second oxide positioned on the side surface of the first region, with the third insulator therebetween. The first region includes a region overlapping the first conductor. The third region
(Continued)

includes a region overlapped by the second conductor. The first region and the second region have a lower resistance than the third region.

14 Claims, 33 Drawing Sheets

Related U.S. Application Data continuation of application No. 16/619,190, filed as application No. PCT/IB2018/053786 on May 29, 2018, now Pat. No. 11,152,366.

(51) Int. Cl.
*G11C 11/403* (2006.01)
*G11C 11/409* (2006.01)
*H01L 29/24* (2006.01)

(58) Field of Classification Search
CPC ..... H01L 29/7869; G11C 5/02; G11C 11/403; G11C 11/409; G11C 11/4091; G11C 13/003; G11C 11/4097; G11C 5/025
See application file for complete search history.

(56) References Cited

U.S. PATENT DOCUMENTS

| | | | |
|---|---|---|---|
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,330,208 B2 | 12/2012 | Alsmeier et al. |
| 8,349,681 B2 | 1/2013 | Alsmeier et al. |
| 8,372,720 B2 | 2/2013 | Fukuzumi et al. |
| 8,409,977 B2 | 4/2013 | Shim et al. |
| 8,450,791 B2 | 5/2013 | Alsmeier |
| 8,455,868 B2 | 6/2013 | Yamazaki et al. |
| 8,461,000 B2 | 6/2013 | Alsmeier et al. |
| 8,461,641 B2 | 6/2013 | Alsmeier et al. |
| 8,580,639 B2 | 11/2013 | Alsmeier et al. |
| 8,729,624 B2 | 5/2014 | Fukuzumi et al. |
| 8,765,543 B2 | 7/2014 | Alsmeier et al. |
| 8,829,591 B2 | 9/2014 | Alsmeier |
| 8,836,007 B2 | 9/2014 | Matsumoto et al. |
| 8,860,108 B2 | 10/2014 | Yamazaki et al. |
| 8,928,061 B2 | 1/2015 | Chien et al. |
| 8,946,810 B2 | 2/2015 | Alsmeier |
| 9,035,374 B2 | 5/2015 | Fukuzumi et al. |
| 9,070,589 B2 | 6/2015 | Kawai et al. |
| 9,117,923 B2 | 8/2015 | Shim et al. |
| 9,159,739 B2 | 10/2015 | Makala et al. |
| 9,165,940 B2 | 10/2015 | Chien et al. |
| 9,230,976 B2 | 1/2016 | Alsmeier |
| 9,312,257 B2 | 4/2016 | Yamazaki et al. |
| 9,349,735 B2 | 5/2016 | Yamazaki et al. |
| 9,356,042 B2 | 5/2016 | Fukuzumi et al. |
| 9,502,431 B2 | 11/2016 | Sakuma et al. |
| 9,514,792 B2 | 12/2016 | Kajigaya |
| 9,685,447 B2 | 6/2017 | Yamazaki et al. |
| 9,748,273 B2 | 8/2017 | Yamazaki et al. |
| 9,806,079 B2 | 10/2017 | Yamazaki et al. |
| 9,991,265 B2 | 6/2018 | Yamazaki et al. |
| 10,038,011 B2 | 7/2018 | Yamazaki et al. |
| 10,056,131 B2 | 8/2018 | Atsumi et al. |
| 10,418,381 B2 | 9/2019 | Yamazaki et al. |
| 10,553,589 B2 | 2/2020 | Yamazaki et al. |
| 10,685,984 B2 | 6/2020 | Yamazaki et al. |
| 11,133,330 B2 | 9/2021 | Yamazaki et al. |
| 11,923,372 B2 | 3/2024 | Yamazaki et al. |
| 2011/0101332 A1 | 5/2011 | Yamazaki et al. |
| 2011/0101334 A1 | 5/2011 | Yamazaki et al. |
| 2011/0101351 A1 | 5/2011 | Yamazaki |
| 2011/0156027 A1 | 6/2011 | Yamazaki et al. |
| 2011/0233648 A1 | 9/2011 | Seol et al. |
| 2012/0001243 A1 | 1/2012 | Kato |
| 2012/0156848 A1* | 6/2012 | Yang ............... H10B 43/40 257/E21.597 |
| 2012/0275213 A1 | 11/2012 | Takemura |
| 2013/0070506 A1 | 3/2013 | Kajigaya |
| 2013/0221356 A1 | 8/2013 | Yamazaki et al. |
| 2013/0292671 A1 | 11/2013 | Yamazaki et al. |
| 2013/0334593 A1 | 12/2013 | Seol et al. |
| 2014/0225181 A1 | 8/2014 | Makala. et al. |
| 2015/0179662 A1 | 6/2015 | Makala et al. |
| 2015/0311301 A1 | 10/2015 | Seol et al. |
| 2016/0079268 A1 | 3/2016 | Sakuma et al. |
| 2016/0104720 A1 | 4/2016 | Alsmeier |
| 2016/0351572 A1 | 12/2016 | Atsumi et al. |
| 2017/0110470 A1* | 4/2017 | Rabkin ............... H10B 41/27 |
| 2017/0271341 A1 | 9/2017 | Tanaka et al. |
| 2019/0074049 A1 | 3/2019 | Atsumi et al. |
| 2019/0371821 A1 | 12/2019 | Yamazaki et al. |
| 2020/0176450 A1 | 6/2020 | Yamazaki et al. |
| 2023/0387130 A1 | 11/2023 | Yamazaki et al. |
| 2023/0395609 A1 | 12/2023 | Yamazaki et al. |

FOREIGN PATENT DOCUMENTS

| | | |
|---|---|---|
| JP | 2011-151383 A | 8/2011 |
| JP | 2013-065638 A | 4/2013 |
| JP | 2013-201396 A | 10/2013 |
| JP | 2013-211537 A | 10/2013 |
| JP | 2014-175348 A | 9/2014 |
| JP | 2016-063027 A | 4/2016 |
| JP | 2016-225613 A | 12/2016 |
| WO | WO 2011/077967 A1 | 6/2011 |

OTHER PUBLICATIONS

Written Opinion (Application No. PCT/IB2018/053786) Dated Aug. 14, 2018.

* cited by examiner

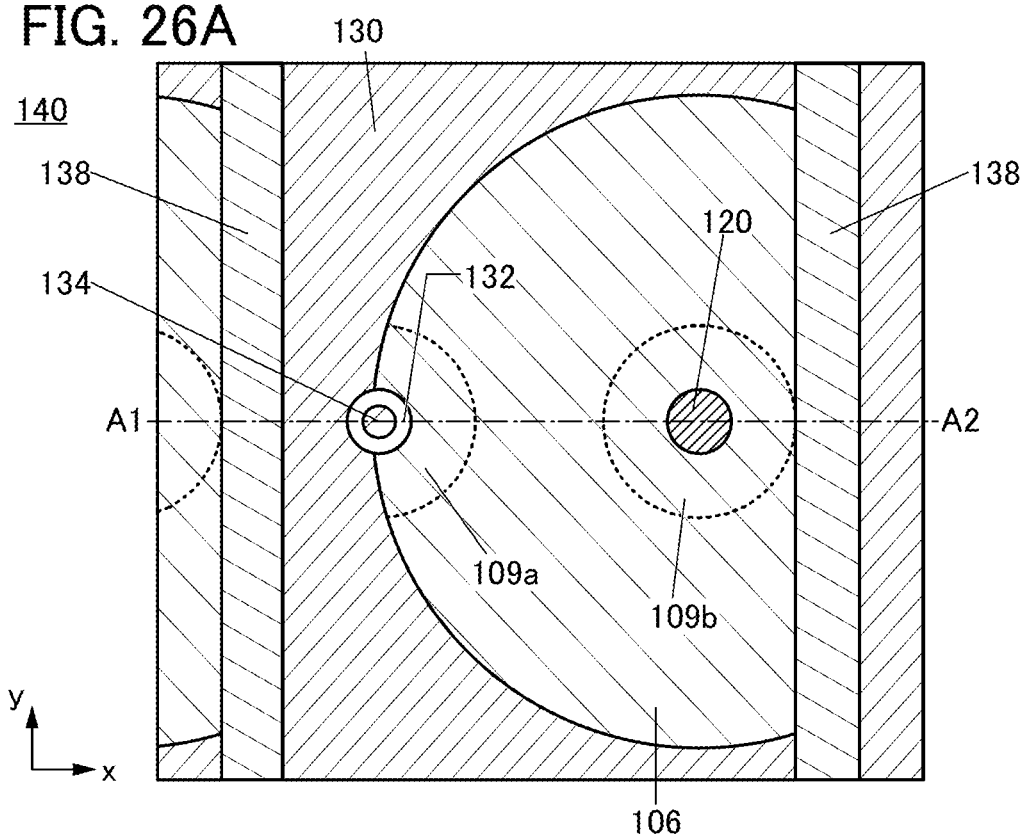
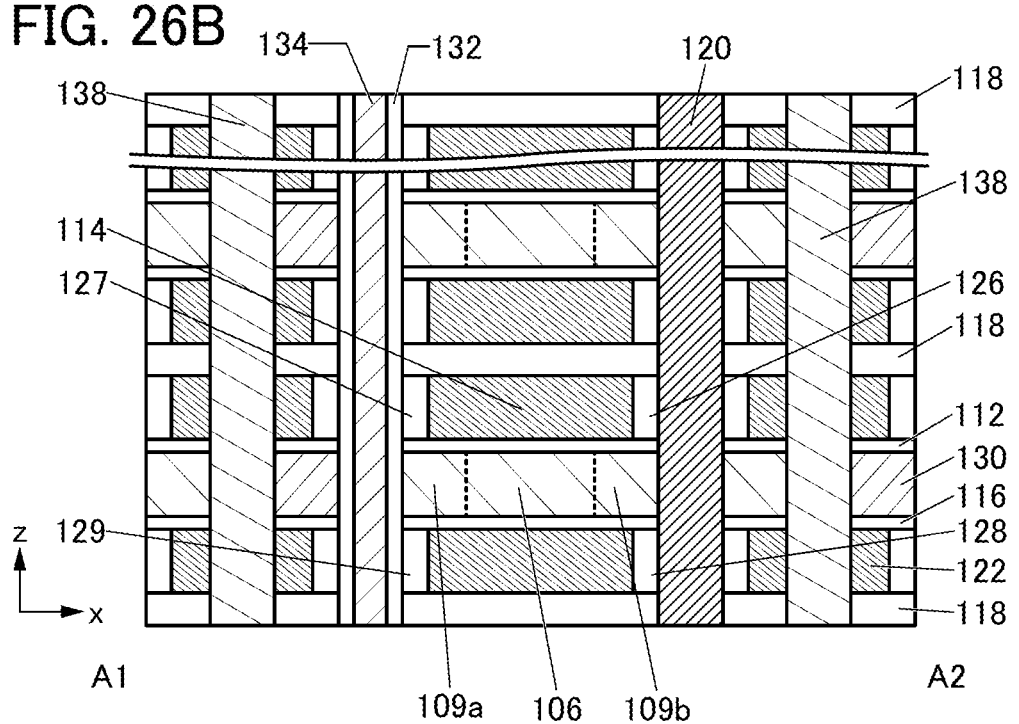

SEMICONDUCTOR DEVICE AND METHOD FOR DRIVING SEMICONDUCTOR DEVICE

This application is a continuation of copending U.S. application Ser. No. 17/503,651, filed on Oct. 18, 2021 which is a continuation of U.S. application Ser. No. 16/619,190, filed on Dec. 4, 2019 (now U.S. Pat. No. 11,152,366 issued Oct. 19, 2021) which is a 371 of international application PCT/IB2018/053786 filed on May 29, 2018, which are all incorporated herein by reference.

TECHNICAL FIELD

The present invention relates to, for example, a transistor and a semiconductor device. Alternatively, the present invention relates to, for example, methods for manufacturing a transistor and a semiconductor device. Alternatively, the present invention relates to, for example, a display device, a light-emitting device, a lighting device, a power storage device, a memory device, a processor, and an electronic device. Alternatively, the present invention relates to methods for manufacturing a display device, a liquid crystal display device, a light-emitting device, a memory device, and an electronic device. Alternatively, the present invention relates to methods for driving a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. Another one embodiment of the present invention relates to a process, a machine, manufacture, or a composition of matter.

Note that in this specification and the like, a semiconductor device refers to a device that can function by utilizing semiconductor characteristics in general. A display device, a light-emitting device, a lighting device, an electro-optical device, a memory device, a semiconductor circuit, and an electronic device include a semiconductor device in some cases.

BACKGROUND ART

Much attention has been focused on a semiconductor device that is capable of reading and writing data by using a combination of a transistor in which silicon (Si) is used for a semiconductor layer and a transistor in which an oxide semiconductor (OS) is used for a semiconductor layer (hereinafter referred to as an OS transistor) (see Patent Document 1).

In recent years, with the increase in the amount of data dealt with, semiconductor devices having a larger storage capacity have been required. To increase the storage capacity per unit area, stacking memory cells is effective (see Patent Documents 2 and 3). Stacking memory cells can increase the storage capacity per unit area in accordance with the number of stacked memory cells.

REFERENCES

Patent Documents

[Patent Document 1] Japanese Published Patent Application No. 2011-119674
[Patent Document 2] Japanese Published Patent Application No. 2011-66417
[Patent Document 3] Japanese Published Patent Application No. 2016-225613

SUMMARY OF THE INVENTION

Problems to be Solved by the Invention

An object is to provide a semiconductor device with a large storage capacity per unit area. Another object is to provide a semiconductor device with a novel structure in which memory cells are stacked. Another object is to provide a method for driving a semiconductor device with a novel structure. Another object is to provide a semiconductor device with high productivity.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Note that the description of these objects does not preclude the existence of other objects. One embodiment of the present invention does not need to achieve all these objects. Other objects will be apparent from and can be derived from the description of the specification, the drawings, the claims, and the like.

Means for Solving the Problems

One embodiment of the present invention is a semiconductor device including a memory cell. The memory cell includes a first conductor; a first insulator over the first conductor; a first oxide over the first insulator and including a first region, a second region, and a third region positioned between the first region and the second region; a second insulator over the first oxide; a second conductor over the second insulator; a third insulator positioned in contact with a side surface of the first region; and a second oxide positioned on the side surface of the first region, with the third insulator therebetween. The first region includes a region overlapping the first conductor. The third region includes a region overlapped by the second conductor. The first region and the second region have a lower resistance than the third region.

One embodiment of the present invention is a semiconductor device including a memory cell. The memory cell includes a first conductor; a first insulator over the first conductor; a first oxide over the first insulator and including a first region, a second region, and a third region positioned between the first region and the second region; a second insulator over the first oxide; a second conductor over the second insulator; a third insulator positioned in contact with a side surface of the first region; and a second oxide positioned on the side surface of the first region, with the third insulator therebetween. The first region includes a region overlapping the first conductor. The third region includes a region overlapped by the second conductor. The first region and the second region have a lower resistance than the third region. The first conductor, the first insulator, and the first region serves as a capacitor. The first oxide, the second insulator, and the second conductor serve as a first transistor. The second oxide, the third insulator, and the first region serve as a second transistor.

In the above structure, the first conductor, the second conductor, the first insulator, and the second insulator have an opening, and the second oxide is positioned in the opening through the third insulator.

In the above structure, the first oxide and the second oxide contain In, an element M (M is Al, Ga, Y, or Sn), and Zn.

In the above structure, the semiconductor device includes a base and a plurality of memory cells over the base.

In the above structure, the semiconductor device includes a fourth insulator. The semiconductor device includes $m_h$ memory cells ($m_h$ is an integer of 2 or more) in a direction parallel to one surface of the base. The fourth insulator is positioned between the first insulator and the second insulator and is in contact with the side surface of the first oxide. The $m_h$ memory cells are isolated by the fourth insulator.

In the above structure, the semiconductor device includes my memory cells (my is an integer of 2 or more) in a direction perpendicular to one surface of the base.

In the above structure, the second oxide is provided to be shared by the my memory cells.

Effect of the Invention

A semiconductor device with a large storage capacity per unit area can be provided. Alternatively, a semiconductor device with a novel structure in which memory cells are stacked can be provided. Alternatively, a method for driving a semiconductor device with a novel structure can be provided. Alternatively, a semiconductor device with high productivity can be provided.

Alternatively, a module including any of the above semiconductor devices can be provided. Alternatively, an electronic device including any of the above semiconductor devices or the module can be provided. Alternatively, a novel semiconductor device can be provided. Alternatively, a novel module can be provided. Alternatively, a novel electronic device can be provided.

Note that the description of these effects does not preclude the existence of other effects. One embodiment of the present invention does not necessarily achieve all these effects. Other effects will be apparent from and can be derived from the description of the specification, the drawings, the claims, and the like.

BRIEF DESCRIPTION OF DRAWINGS

FIGS. 26A and 26B are a plan view and a cross-sectional view illustrating a method for manufacturing a semiconductor device of one embodiment of the present invention.

MODE FOR CARRYING OUT THE INVENTION

Figure 1A:
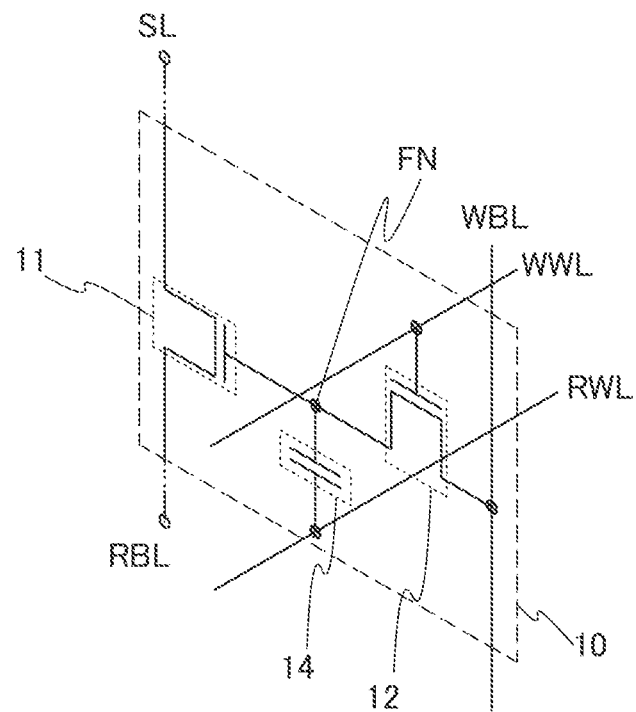
FIGS. 1A and 1B are a circuit diagram and a cross-sectional view illustrating a semiconductor device of one embodiment of the present invention.

Embodiments of the present invention will be described in detail with reference to the drawings. Note that the present invention is not limited to the description below, and it is easily understood by those skilled in the art that modes and details of the present invention can be modified in various ways. In addition, the present invention should not be construed as being limited to the description in the embodiments given below. In describing structures of the invention with reference to the drawings, common reference numerals are used for the same portions in different drawings. Note that the same hatched pattern is used for similar parts, and the similar parts are not especially denoted by reference numerals in some cases.

One embodiment of the present invention can be constituted by appropriately applying, combining, or replacing a structure described in the following embodiments with another structure described in the embodiments.

Note that the size, the thickness of films (layers), or regions in drawings is sometimes exaggerated for simplicity.

In this specification and the like, the term "film" and the term "layer" can be interchanged with each other.

A voltage usually refers to a potential difference between a given potential and a reference potential (e.g., a ground potential (GND) or a source potential). Thus, a voltage can be replaced with a potential. In general, a potential (voltage) is relative and depends on a relative level with respect to a reference potential. Therefore, a potential that is represented as a "ground potential" or the like is not always 0 V. For example, a "ground potential" may be the lowest potential in a circuit. Alternatively, a "ground potential" may be a substantially intermediate potential in a circuit. In those cases, a positive potential and a negative potential are defined using the potential as a reference. Note that ordinal numbers such as first and second are used for convenience and do not denote the order of steps or the stacking order of layers. Therefore, for example, description can be made even when "first" is replaced with "second", "third", or the like as appropriate. In addition, ordinal numbers put in this specification and the like do not always correspond with ordinal numbers used to specify one embodiment of the present invention.

In this specification, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

In this specification, a source of a transistor means a source region that is part of a semiconductor film functioning as an active layer or a source electrode connected to the semiconductor film. Similarly, a drain of a transistor means a drain region that is part of the above semiconductor film or a drain electrode connected to the semiconductor film. Moreover, a gate means a gate electrode.

The names of a source and a drain of a transistor interchange with each other depending on the conductivity type of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other depending on the above relation of the potentials.

Unless otherwise specified, an off-state current in this specification refers to a drain current of a transistor in an off state. Unless otherwise specified, an off state refers to a state where a potential difference ($V_{GS}$) between a gate and a source is lower than the threshold voltage ($V_{th}$) in an n-channel transistor, and a state where $V_{GS}$ is higher than $V_{th}$ in a p-channel transistor. For example, the off-state current of an n-channel transistor sometimes refers to a drain current that flows when $V_{GS}$ is lower than $V_{th}$. The off-state current of a transistor depends on $V_{GS}$ in some cases. Accordingly, "the off-state current of a transistor is lower than $10^{-21}$ A" may mean that there is $V_{GS}$ at which the off-state current of the transistor is lower than $10^{-21}$ A.

Furthermore, the off-state current of a transistor depends on a voltage difference ($V_{DS}$) between a drain and a source in some cases. Unless otherwise specified, the off-state current in this specification may be an off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current is sometimes an off-state current at $V_{DS}$ at which the reliability of a semiconductor device or the like including the transistor is ensured or $V_{DS}$ used in the semiconductor device or the like including the transistor.

Note that a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" described in this specification can be called an "insulator" in some cases. Similarly, an "insulator" described in this specification can be called a "semiconductor" in some cases.

A "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" described in this specification can be called a "conductor" in some cases. Similarly, a "conductor" described in this specification can be called a "semiconductor" in some cases.

In addition, in this specification and the like, the term "insulator" can be replaced with an insulating film or an insulating layer. Moreover, the term "conductor" can be replaced with a conductive film or a conductive layer. The term "semiconductor" can be replaced with a semiconductor film or a semiconductor layer.

Note that an impurity in a semiconductor refers to, for example, elements other than the main components of the semiconductor. For example, an element with a concentration of lower than 0.1 atomic % is an impurity. When an impurity is contained, DOS (Density of States) may be formed in a semiconductor, the carrier mobility may be decreased, or the crystallinity may be decreased, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the semiconductor; specific examples include hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor is silicon, examples of an impurity that changes the characteristics of the semiconductor include oxygen, Group 1 elements except hydrogen, Group 2 elements, Group 13 elements, and Group 15 elements.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is in an on state) and a gate electrode overlap each other, or a region where a channel is formed. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed on a side surface of a semiconductor is sometimes increased. In that case, an effective channel width of a channel that is actually formed is greater than an apparent channel width shown in the top view.

In a transistor having a three-dimensional structure, an effective channel width is difficult to estimate by actual measurement in some cases. For example, estimation of an effective channel width from a design value requires an assumption that the shape of a semiconductor is known. Accordingly, when the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap each other is referred to as a surrounded channel width (SCW) in some cases. Furthermore, in this specification, the simple term "channel width" may refer to a surrounded channel width or an apparent channel width. Alternatively, in this specification, the simple term "channel width" may refer to an effective channel width. Note that the values of a channel length, a channel width, an effective channel width, an apparent channel width, a surrounded channel width, and the like can be determined by obtaining and analyzing a cross-sectional TEM image and the like.

Note that when the field-effect mobility, a current value per channel width, and the like of a transistor are obtained by calculation, the calculation may be performed using a surrounded channel width. In that case, a value different from one calculated using an effective channel width is sometimes obtained.

In this specification, the term "parallel" indicates a state where two straight lines are placed at an angle of greater than or equal to −10° and less than or equal to 10°. Thus, the case where the angle is greater than or equal to −5° and less than or equal to 5° is also included. The term "substantially parallel" indicates a state where two straight lines are placed at an angle of greater than or equal to −30° and less than or equal to 30°. The term "perpendicular" indicates a state where two straight lines are placed at an angle of greater than or equal to 80° and less than or equal to 100°. Thus, the case where the angle is greater than or equal to 85° and less than or equal to 95° is also included. The term "substantially perpendicular" indicates a state where two straight lines are placed at an angle of greater than or equal to 60° and less than or equal to 120°.

In this specification, in the case where a crystal is a trigonal crystal or a rhombohedral crystal, the crystal is regarded as a hexagonal crystal system.

Note that in this specification and the like, a silicon oxynitride film is a film in which the oxygen content is higher than the nitrogen content in its composition. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, a silicon nitride oxide film is a film in which the nitrogen content is higher than the oxygen content in its composition. A silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS transistor can also be called a transistor including a metal oxide or an oxide semiconductor.

In this specification and the like, In:Ga:Zn=4:2:3 or a neighborhood thereof refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). Moreover, In:Ga:Zn=5:1:6 or a neighborhood thereof refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). Additionally, In:Ga:Zn=1:1:1 or a neighborhood thereof refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

Embodiment 1

In this embodiment, a circuit configuration and operation of a semiconductor device of one embodiment of the disclosed invention will be described with reference to FIG. 1 to FIG. 6.

<Memory Cell>

First, a circuit configuration of a memory cell of a semiconductor device that is described later will be described with reference to FIG. 1(A) and FIG. 1(B). Here, FIG. 1(A) is an example of a circuit diagram that illustrates a circuit configuration of a memory cell 10 in a three-dimensional manner to correspond to a three-dimensional structure of the semiconductor device, and FIG. 1(B) is a schematic cross-sectional view illustrating a structure example of the memory cell 10.

The memory cell 10 includes a transistor 11, a transistor 12, and a capacitor 14. The memory cell 10 is electrically connected to a wiring WBL, a wiring RWL, a wiring WWL, a wiring SL, and a wiring RBL. Note that in the following description, the transistor 11 and the transistor 12 are n-channel transistors.

Figure 1B:
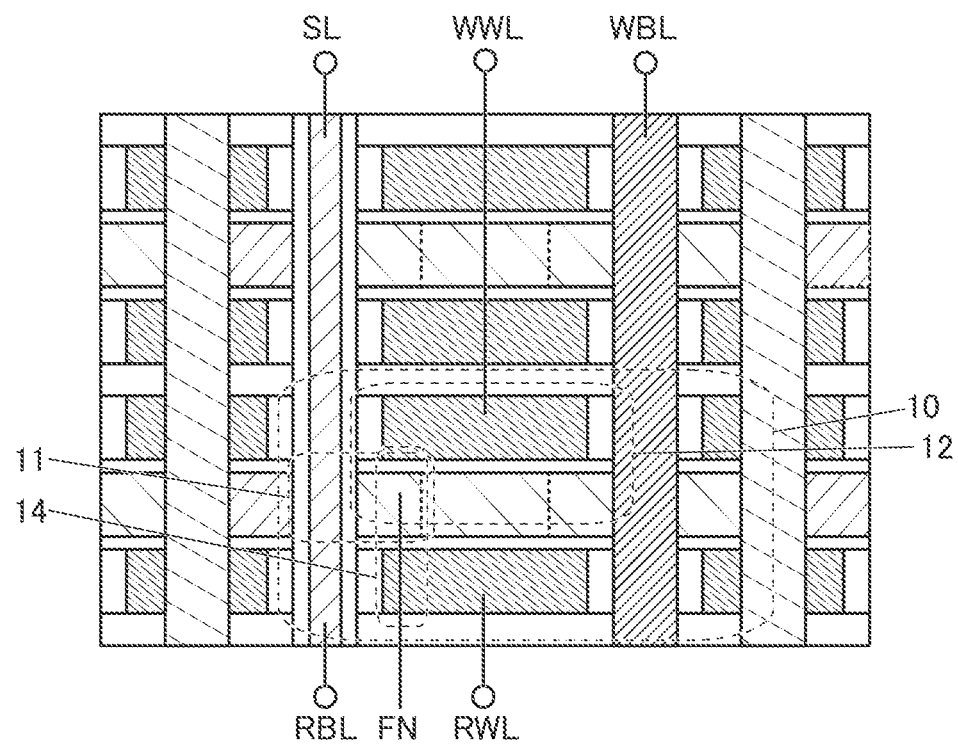

In the memory cell 10 illustrated in FIGS. 1(A) and 1(B), the wiring SL and a source electrode (or a drain electrode) of the transistor 11 are electrically connected to each other, and the wiring RBL and the drain electrode (or the source electrode) of the transistor 11 are electrically connected to each other. The wiring WBL and a source electrode (or a drain electrode) of the transistor 12 are electrically connected to each other, and the wiring WWL and a gate electrode of the transistor 12 are electrically connected to each other. A gate electrode of the transistor 11 and the drain electrode (or the source electrode) of the transistor 12 are electrically connected to one electrode of the capacitor 14, and the wiring RWL and the other electrode of the capacitor 14 are electrically connected to each other.

Here, an OS transistor is preferably used as the transistor 12. As will be described in detail later, an OS transistor has a feature of an extremely low off-state current. For that reason, the potential of the gate electrode of the transistor 11 can be held for an extremely long time with the transistor 12 turned off. Providing the capacitor 14 facilitates holding of charge given to the gate electrode of the transistor 11 and facilitates reading of stored data.

An OS transistor is preferably used also as the transistor 11. When the transistor 11 is an OS transistor, a shoot-through current that flows between the wiring SL and the wiring RBL can be reduced.

The memory cell 10 illustrated in FIGS. 1(A) and 1(B) can perform data writing, holding, and reading as follows by utilizing a feature that the potential of the gate electrode of the transistor 11 can be held.

First of all, data writing and holding will be described. First, the potential of the wiring WWL is set to a potential at which the transistor 12 is turned on, so that the transistor 12 is turned on. Thus, the potential of the wiring WBL is supplied to a node (also referred to as a node FN) where the drain electrode (or the source electrode) of the transistor 12, the gate electrode of the transistor 11, and the one electrode of the capacitor 14 are electrically connected to each other. That is, a predetermined charge is supplied to the gate electrode of the transistor 11 (writing). Here, one of charges for supplying two different potentials (hereinafter, a charge for supplying a low potential is referred to as a charge $Q_L$ and a charge for supplying a high potential is referred to as a charge $Q_H$) is given. Note that charges for supplying three or more different potentials may be used to increase the storage capacity. After that, the potential of the wiring WWL is set to a potential at which the transistor 12 is turned off, so that the transistor 12 is turned off; thus, the charge supplied to the gate electrode of the transistor 11 is held (holding).

Since the off-state current of the transistor 12 is extremely low, the charge of the gate electrode of the transistor 11 is held for a long time.

Next, data reading will be described. An appropriate potential (a reading potential) is supplied to the wiring RWL while a predetermined potential (a constant potential) is supplied to the wiring SL, whereby the potential of the wiring RBL varies depending on the amount of charge held in the gate electrode of the transistor 11. This is because an apparent threshold voltage $V_{th\_H}$ in the case where $Q_H$ is supplied to the gate electrode of the transistor 11 is lower than an apparent threshold voltage $V_{th\_L}$ in the case where $Q_L$ is supplied to the gate electrode of the transistor 11. Here, an apparent threshold voltage refers to a potential of the wiring RWL that is needed to switch the transistor 11 from an off state to an on state or from an on state to an off state. Thus, the charge supplied to the gate electrode of the transistor 11 can be determined by setting the potential of the wiring RWL to a potential $V_0$ that is between $V_{th\_H}$ and $V_{th\_L}$. For example, in the case where $Q_H$ is given in writing, the transistor 11 is turned on when the potential of the wiring RWL becomes $V_0$ ($>V_{th\_H}$). In the case where $Q_L$ is given, the transistor 11 remains off even when the potential of the wiring RWL becomes $V_0$ ($<V_{th\_L}$). Accordingly, the held data can be read out by detecting the potential of the wiring RBL.

Note that in the case where memory cells are arranged in a matrix, it is necessary that only data of a desired memory cell can be read out. To read data of a given memory cell and not read data of the other memory cells, in the case where the transistors 11 of the memory cells are connected to each other in series, a potential at which the transistor 11 is turned on regardless of a state of the gate electrode, that is, a potential higher than $V_{th\_L}$ is supplied to the wirings RWL of the memory cells that are not subjected to reading. In this case, when a potential higher than $V_{th\_L}$ is supplied to the wiring RWL, a potential at which the transistor 11 is turned on is supplied to the gate electrode of the transistor 11 via the capacitor 14; hence, the transistor 11 can be turned on independently of data stored in the node FN.

Next, data rewriting is described. Data rewriting is performed in a manner similar to that of the data writing and holding described above. In other words, the potential of the wiring WWL is set to a potential at which the transistor 12 is turned on, so that the transistor 12 is turned on. Consequently, the potential of the wiring WBL (a potential related to new data) is supplied to the gate electrode of the transistor 11 and the capacitor 14. After that, the potential of the wiring WWL is set to a potential at which the transistor 12 is turned off, so that the transistor 12 is turned off; hence, the gate electrode of the transistor 11 is brought into a state of being supplied with the charge related to new data.

Thus, in the semiconductor device of the disclosed invention, data can be directly rewritten by overwriting of new data. Therefore, extraction of charge from a floating gate with the use of high voltage, which is necessary for erasing operation in a flash memory, for example, is unnecessary, and a decrease in operating speed can be inhibited. In other words, high-speed operation of the semiconductor device is achieved.

Note that the node FN where the drain electrode (or the source electrode) of the transistor 12, the gate electrode of the transistor 11, and the one electrode of the capacitor 14 are electrically connected to each other has a function similar to that of a floating gate of a floating-gate transistor that is used as a nonvolatile memory element. When the transistor 12 is off, the node FN can be regarded as being embedded in an insulator and charge is held in the node FN. The off-state current of the transistor 12 using an oxide semiconductor is lower than or equal to 1/100000 of the off-state current of a transistor formed with a silicon semiconductor; thus, the charge accumulated in the node FN can be stored for a long period. That is, with the transistor 12 using an oxide semiconductor, a memory device that can hold data for a long period without being supplied with power can be achieved.

For example, when the off-state current of the transistor 12 at room temperature (25° C.) is 10 zA (1 zA (zeptoampere) is 1×10-21 A) or less and the capacitance of the capacitor 14 is approximately 10 fF, data can be held for at least 104 seconds or longer. It is needless to say that the retention time depends on transistor characteristics and the capacitance.

Furthermore, the memory cell 10 described in this embodiment does not have a problem of deterioration of a gate insulating film (a tunnel insulating film), which has been pointed out in a conventional floating-gate transistor. That is, the deterioration of a gate insulating film at the time of injection of electrons into a floating gate, which has been regarded as a problem, can be eliminated. This means that there is no limitation on the number of write cycles in principle. In addition, high voltage that is needed for writing and erasing in a conventional floating-gate transistor is not necessary.

In the memory cell 10, the node FN has a function similar to that of a floating gate of a floating-gate transistor of a flash memory or the like; however, the node FN of this embodiment has a feature that is essentially different from that of the floating gate of a flash memory or the like. In a flash memory, a potential supplied to a control gate is high, so that it is necessary to keep a proper distance between cells in order to prevent the potential from affecting a floating gate of an adjacent cell. This is one of factors inhibiting high integration of a semiconductor device. This factor is attributed to the basic principle of a flash memory, in which a tunneling current is generated by applying a high electrical field.

In contrast, the semiconductor device of this embodiment operates by switching of a transistor using an oxide semiconductor and does not use the above-described principle of charge injection by a tunneling current. That is, unlike a flash memory, the semiconductor device of this embodiment does not need a high electrical field for charge injection. Accordingly, it is not necessary to consider an influence of a high electrical field from a control gate on an adjacent cell, which facilitates high integration.

Note that in order to increase the storage capacity of a semiconductor device, a multilevel technique can be employed instead of increasing the integration degree. For example, employing a structure where data with three or more levels is written to one memory cell can increase the storage capacity, compared to the case where two-level (one-bit) data is written. For example, the multilevel technique can be achieved when a charge Q for supplying a different potential is supplied to the gate electrode of the transistor 11 in addition to the charge $Q_L$ for supplying a low potential and the charge $Q_H$ for supplying a high potential, which are described above. As multilevel data, data such as 4-level (2-bit), 8-level (3-bit), or 16-level (4-bit) data, for example, is to be held.

As illustrated in FIG. 1(B), the memory cell 10 includes the transistor 11, the transistor 12, and the capacitor 14. A region functioning as one of the source and the drain of the transistor 11 is electrically connected to the wiring RBL. A region functioning as the other of the source and the drain of the transistor 11 is electrically connected to the wiring SL. A conductive layer functioning as the gate of the transistor 12 is provided to extend in the depth direction of the diagram and also functions as the wiring WWL. A conductive layer functioning as the one electrode of the capacitor 14 is provided to extend in the depth direction of the diagram and also functions as the wiring RWL. A region functioning as one of the source and the drain of the transistor 12 is electrically connected to the wiring WBL. A region functioning as the other of the source and the drain of the transistor 12 functions as the node FN.

A more specific structure of the memory cell 10 illustrated in FIG. 1(B) will be described in Embodiment 2.

In the memory cell 10 in a memory cell array that is described later, the channel length direction of the transistor 11, the channel length direction of the transistor 12, the wiring SL, the wiring RBL, the wiring WBL, the wiring RWL, and the wiring WWL are preferably positioned to cross three-dimensionally as illustrated in FIGS. 1(A) and 1(B) and the like.

The channel length direction of the transistor 11 and the channel length direction of the transistor 12 are preferably substantially perpendicular to each other. The channel length direction of the transistor 11 is preferably substantially perpendicular to the top surface of a substrate where the memory cell 10 is provided, and the channel length direction of the transistor 12 is preferably substantially parallel to the top surface of the substrate.

Furthermore, the wiring WWL and the wiring RWL are preferably substantially perpendicular to the wiring RBL, the wiring SL, and the wiring WBL. The wiring RBL, the wiring SL, and the wiring WBL are preferably substantially perpendicular to the top surface of the substrate where the memory cell 10 is provided, and the wiring WWL and the wiring RWL are preferably substantially parallel to the top surface of the substrate.

With such a structure of the memory cell 10, a plurality of memory cells 10 can be stacked such that the transistors 11 are connected in series with each other as described later. This can provide a semiconductor device whose storage capacity per unit area can be increased in accordance with the number of stacked memory cells 10.

With a circuit configuration where the transistor 11 is provided such that its channel length direction is perpendicular to the top surface of the substrate as described above, a vertical transistor (SGT: Surrounding Gate Transistor) in which a gate electrode surrounds a semiconductor and a source and a drain are provided in an upper and lower parts of the transistor can be easily used. The area occupied by an SGT is extremely small, compared to a standard planar transistor. Thus, the storage capacity per unit area can be further increased.

<Memory Cell Array>

Next, a more specific circuit configuration in which the circuit illustrated in FIG. 1 is used and the operation will be described with reference to FIG. 2 to FIG. 6.

Figure 2:
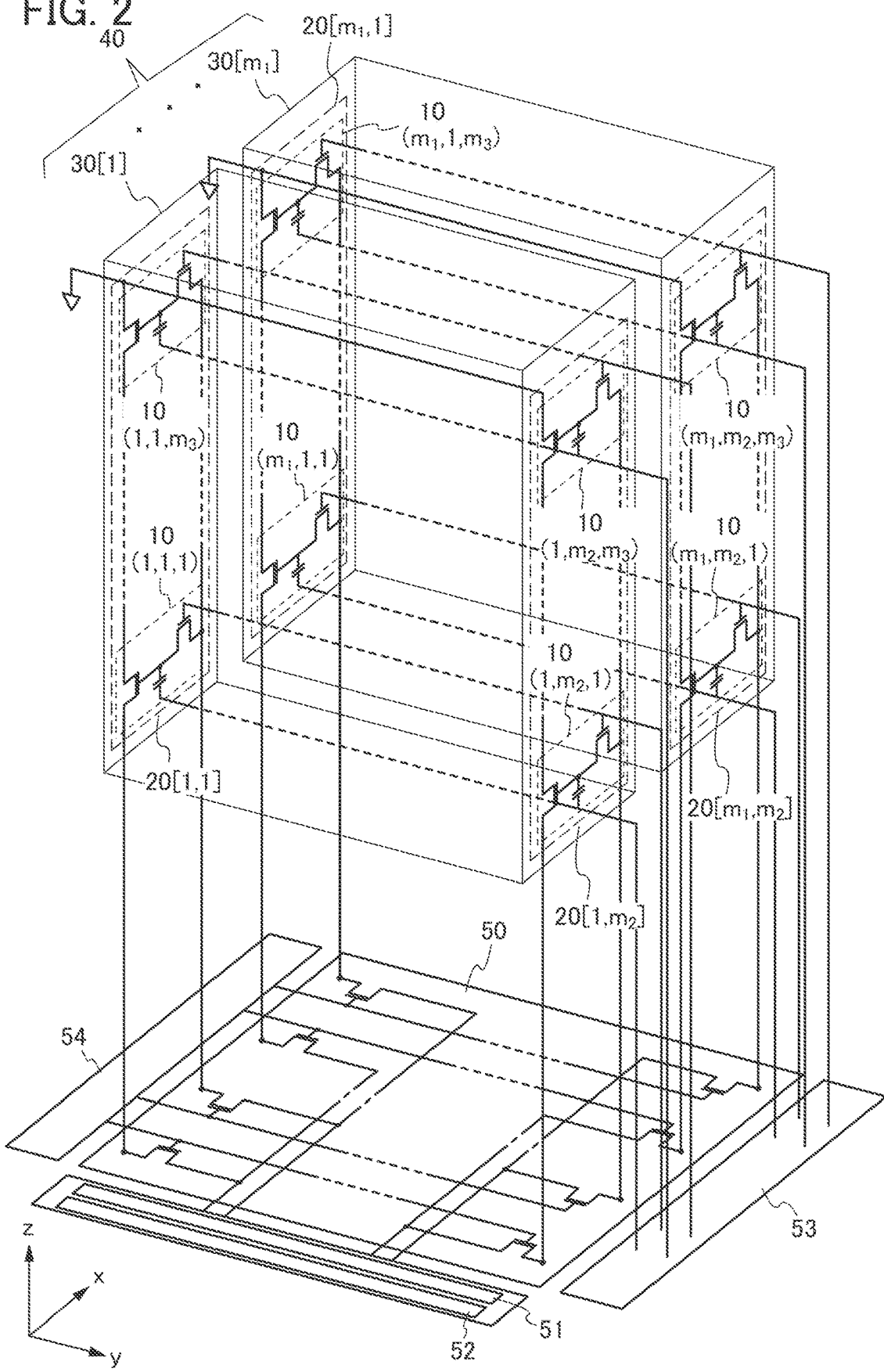
FIG. 2 is a circuit diagram illustrating a semiconductor device of one embodiment of the present invention.

FIG. 2 illustrates an example of a block circuit diagram of a semiconductor device including a three-dimensional memory cell array 40, a selection transistor array a driver circuit 51, a read circuit 52, a driver circuit 53, and a driver circuit 54. Note that in the following description, a rectangular coordinate system using the x-axis, y-axis, and z-axis is set as illustrated in FIG. 2 for the sake of convenience.

Figure 3:
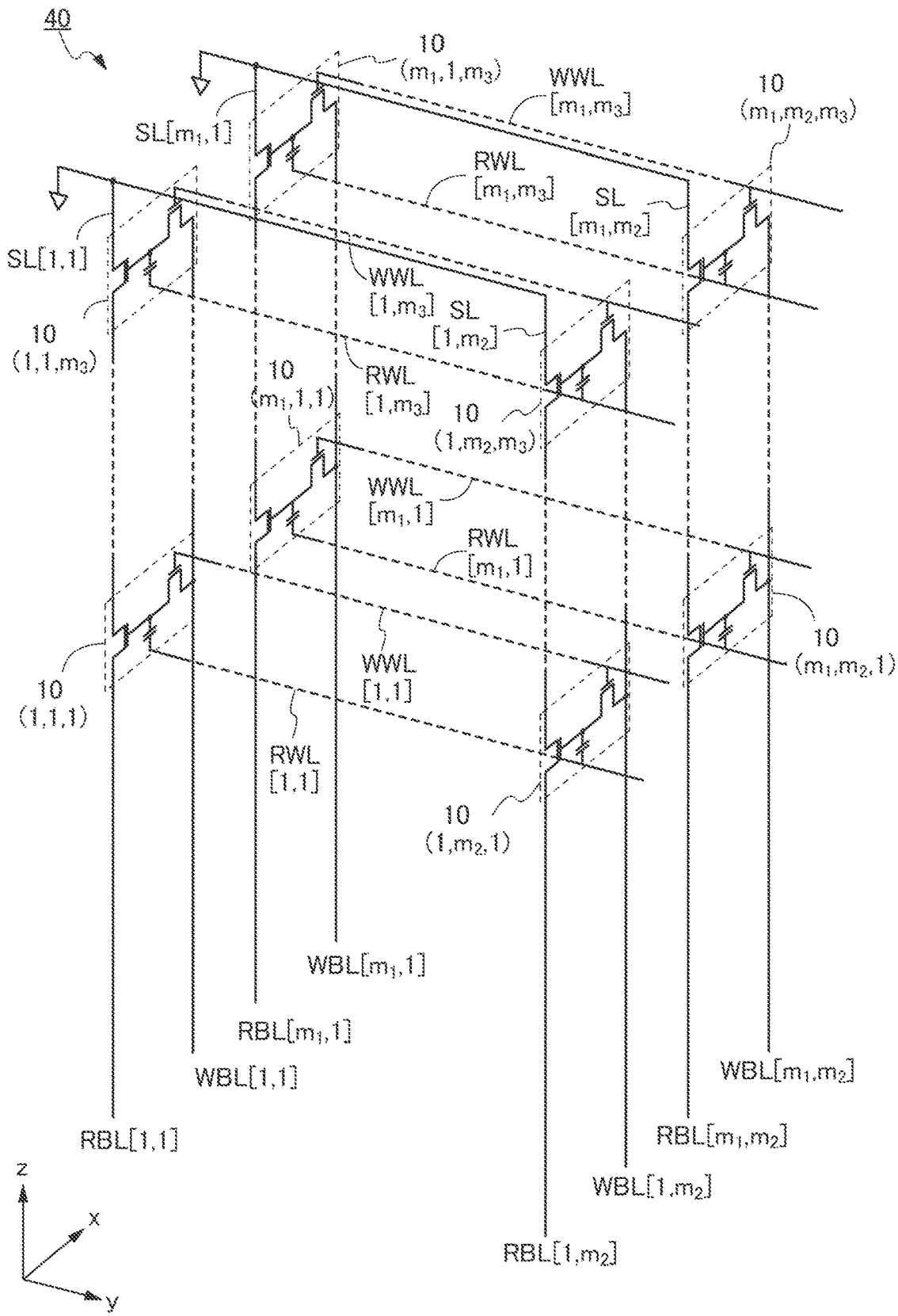
FIG. 3 is a circuit diagram illustrating a semiconductor device of one embodiment of the present invention.
Figure 4:
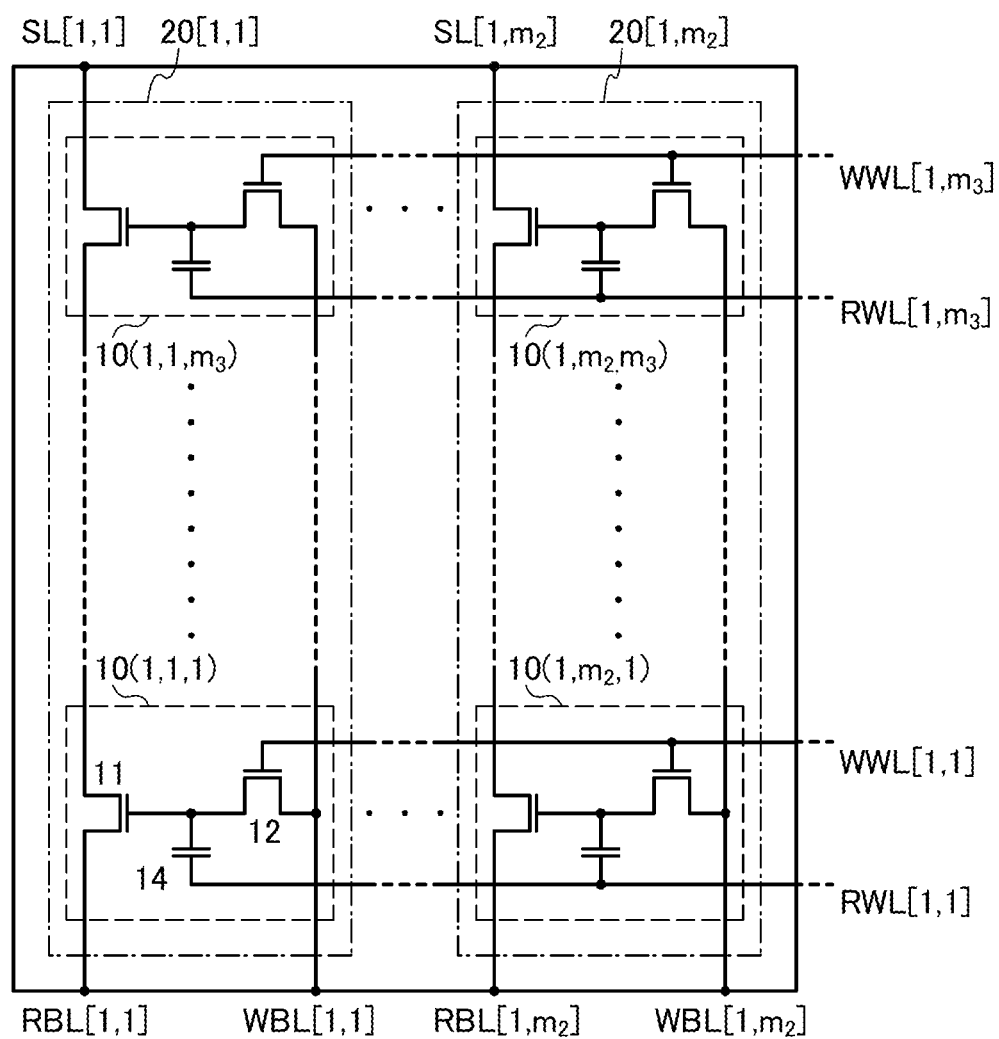
FIG. 4 is a circuit diagram illustrating a semiconductor device of one embodiment of the present invention.
Figure 5:
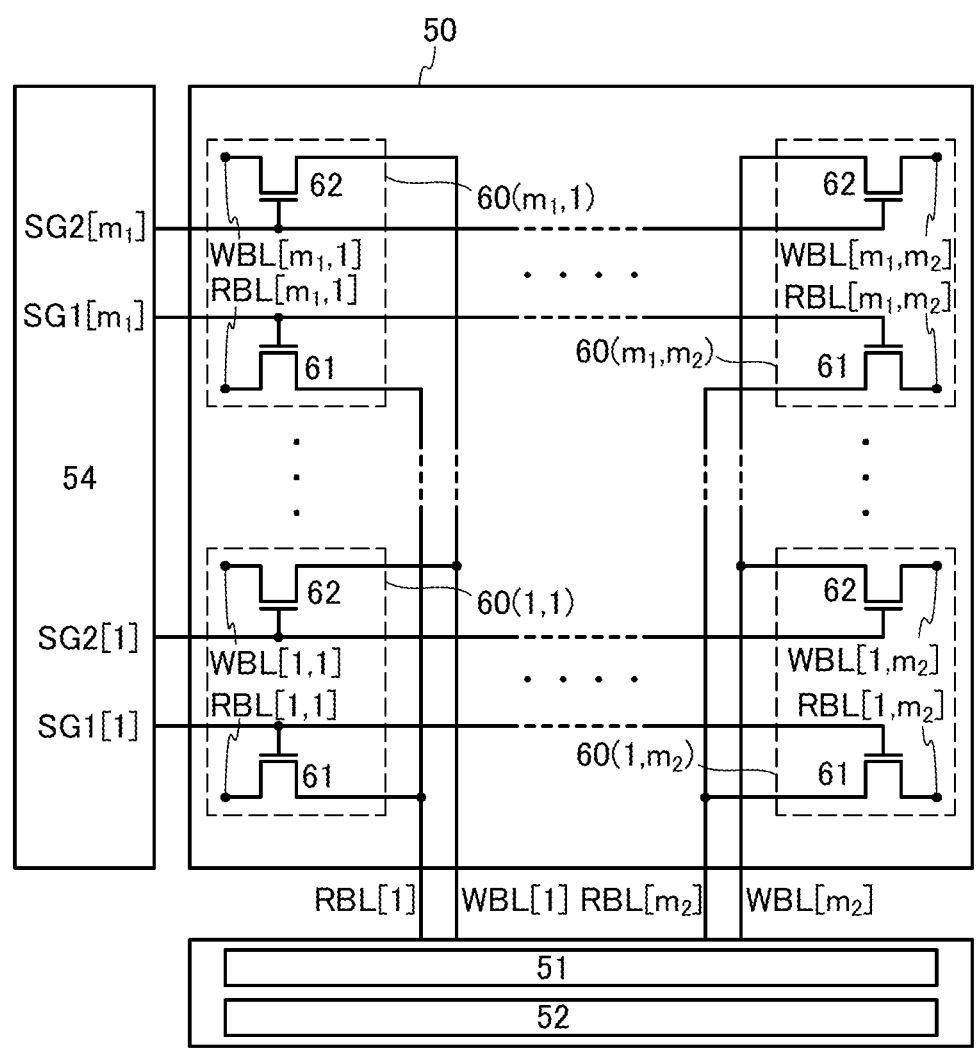
FIG. 5 is a circuit diagram illustrating a semiconductor device of one embodiment of the present invention.

FIG. 3 illustrates an example of a circuit diagram of the three-dimensional memory cell array 40. FIG. 4 illustrates an example of a block circuit diagram of a two-dimensional memory cell array 30[1] included in the three-dimensional memory cell array 40. Note that FIG. 4 planarly shows an example of the block circuit diagram of the two-dimensional memory cell array 30[1], and some of the components in the x-axis direction are simulatively shown on the yz plane. FIG. 5 illustrates an example of a block circuit diagram of the selection transistor array 50, the driver circuit 51, the read circuit 52, and the driver circuit 54.

The selection transistor array 50, the driver circuit 51, the read circuit 52, the driver circuit 53, and the driver circuit 54 are formed over a substrate surface substantially parallel to the xy plane, and the three-dimensional memory cell array 40 is formed over the selection transistor array 50.

As illustrated in FIG. 2 and FIG. 3, the three-dimensional memory cell array 40 includes $m_1 \times m_2 \times m_3$ memory cells 10 ($m_1$, $m_2$, and $m_3$ are natural numbers), and the $m_1$ memory cells 10 in the x-axis direction, the $m_2$ memory cells 10 in the y-axis direction, and the $m_3$ memory cells 10 in the z-axis direction are arranged to make a rectangular solid shape. Hereinafter, the memory cells 10 are assigned coordinates and shown as memory cells 10(1,1,1) to 10($m_1,m_2,m_3$) in some cases.

Furthermore, as illustrated in FIG. 3, the three-dimensional memory cell array 40 includes $m_1 \times m_2$ wirings SL, $m_1 \times m_2$ wirings RBL, and $m_1 \times m_2$ wirings WBL that extend in the z-axis direction, and $m_1 \times m_3$ wirings RWL and $m_1 \times m_3$ wirings WWL that extend in the y-axis direction. Hereinafter, the wirings SL are assigned coordinates in the x-axis direction and y-axis direction and shown as wirings SL[1,1] to SL[$m_1,m_2$] in some cases, as illustrated in FIG. 3. Similarly, representation such as wirings RBL[1,1] to RBL[$m_1,m_2$] and wirings WBL[1,1] to WBL[$m_1,m_2$] is sometimes used. In addition, the wirings RWL are assigned coordinates in the x-axis direction and z-axis direction and shown as wirings RWL[1,1] to RWL[$m_1,m_3$] in some cases, as illustrated in FIG. 3. Similarly, representation such as wirings WWL[1,1] to WWL[$m_1,m_3$] is sometimes used.

As illustrated in FIG. 2, the three-dimensional memory cell array 40 is composed of $m_1$ two-dimensional memory cell arrays 30 arranged in the x-axis direction. Hereinafter, the two-dimensional memory cell arrays 30 are assigned a coordinate in the x-axis direction and shown as two-dimensional memory cell arrays 30[1] to 30[$m_1$] in some cases.

Moreover, as illustrated in FIG. 2, each of the two-dimensional memory cell arrays 30 is composed of $m_2$ memory cell strings 20 arranged in the y-axis direction. Hereinafter, the memory cell strings 20 are assigned coordinates in the x-axis direction and y-axis direction and shown as memory cell strings 20[1,1] to 20[$m_1,m_2$] in some cases. Each of the memory cell strings 20 includes $m_3$ memory cells 10 arranged in the z-axis direction. Here, each of the two-dimensional memory cell arrays 30 is composed of $m_2$ memory cell strings 20; thus, in the two-dimensional memory cell array 30, $m_2$ memory cells 10 in the y-axis direction and $m_3$ memory cells 10 in the z-axis direction are arranged in a matrix.

The memory cell 10 includes the transistor 11, the transistor 12, and the capacitor 14 and is electrically connected to the wiring SL, the wiring RBL, the wiring WBL, the wiring RWL, and the wiring WWL, as illustrated in FIG. 1(A). Note that the transistors 11 of the memory cells 10 included in each of the memory cell strings 20 are connected in series in the z-axis direction as illustrated in FIG. 2 and FIG. 4. Thus, only the memory cell ($i_1,i_2,1$) ($i_1$ is a natural number of 1 or more and $m_1$ or less, and $i_2$ is a natural number of 1 or more and $m_2$ or less) is connected to the wiring RBL[$i_1,i_2$] without through any other memory cell 10. In addition, only the memory cell ($i_1, i_2, m_3$) is connected to the wiring SL[$i_1,i_2$] without through any other memory cell 10. The other memory cells are electrically connected to the wiring RBL and the wiring SL through another or other memory cells 10 in the same memory cell string 20.

Here, the configuration of the two-dimensional memory cell array 30 is described with the two-dimensional memory cell array 30[1] shown in FIG. 4 as an example. The two-dimensional memory cell array 30[1] shown in FIG. 4 includes $m_2$ wirings SL[1,1] to SL[1,$m_2$], $m_2$ wirings RBL[1,1] to RBL[1,$m_2$], $m_2$ wirings WBL[1,1] to WBL[1,$m_2$], $m_3$ wirings RWL[1,1] to RWL[1,$m_3$], $m_3$ wirings WWL[1,1] to WWL[1,$m_3$], and $m_2 \times m_3$ memory cells 10(1,1,1) to 10(1,$m_2,m_3$) arranged in a matrix.

Hereinafter, the wirings and the memory cells 10 arranged in a matrix in the two-dimensional memory cell array 30 are sometimes expressed according to a matrix. For example, a plurality of memory cells 10 with the same z-coordinate in the same two-dimensional memory cell array 30 can be expressed as "the memory cells 10 in the same row". Moreover, a plurality of memory cells 10 with the same y-coordinate (which can also be referred to as "constituting the same memory cell string 20") in the same two-dimensional memory cell array 30 can be expressed as "the memory cells 10 in the same column". The y-axis direction and the z-axis direction can be referred to as the row direction and the column direction, respectively. Note that hereinafter, in the two-dimensional memory cell array 30 illustrated in FIG. 4 and the like, the rows are sequentially referred to as the first row, the second row, . . . , and the $m_2$-th row from the bottom row, and the columns are sequentially referred to as the first column, the second column, . . . , and the $m_2$-th column from the left column.

Each wiring SL[1,$i_2$] is electrically connected to the source electrode of the corresponding transistor 11 in the memory cell 10(1,$i_2,m_3$), and each wiring RBL[1,$i_2$] is electrically connected to the drain electrode of the corresponding transistor 11 in the memory cell 10(1,$i_2$,1).

Each wiring WBL[1,$i_2$] is electrically connected to the source electrode of the corresponding transistor 12 in the memory cells 10(1,$i_2$,1) to 10(1,$i_2,m_3$). In other words, the source electrode of each of the transistors 12 in the memory cells 10 in the same column is electrically connected to the wiring WBL of the same column.

Each wiring RWL[1,$i_3$] ($i_3$ is a natural number of 1 or more and $m_3$ or less) is electrically connected to the other electrode of the corresponding capacitor 14 in the memory cells 10(1,1,$i_3$) to 10(1,$m_2,i_3$). In other words, the other electrode of each of the capacitors 14 in the memory cells 10 in the same row is electrically connected to the wiring RWL of the same row.

Each wiring WWL[1,$i_3$] is electrically connected to the gate electrode of the corresponding transistor 12 in the memory cells 10(1,1,$i_3$) to 10(1,$m_2,i_3$). In other words, the gate electrode of each of the transistors 12 in the memory cells 10 in the same row is electrically connected to the wiring WWL of the same row.

The source electrode of the transistor 11 in the memory cell 10(1,$i_2,i_{3,4}$) ($i_{3,4}$ is a natural number of 1 or more and $m_3-1$ or less) is electrically connected to the drain electrode of the transistor 11 in the memory cell 10(1,$i_2,i_{3,4}+1$). In other words, the source electrode of one transistor 11 and the drain electrode of another transistor 11 are electrically connected to each other in the plurality of memory cells 10 in the same column.

The memory cells $10(1,i_2,1)$ to $10(1,i_2,m_3)$ in which the transistors 11 are thus connected in series between the wiring $SL[1,i_2]$ and the wiring $RBL[1,i_2]$ constitute the memory cell string $20[1,i_2]$.

The memory cell string 20 includes a plurality of memory cells 10 as described above, and the memory cells 10 can be stacked such that the transistors 11 are connected in series. The storage capacity of the memory cell string 20 can be increased in accordance with the number of stacked memory cells 10. Consequently, the storage capacity per unit area of the three-dimensional memory cell array 40 composed of a plurality of memory cell strings 20 can be increased in accordance with the number of stacked memory cells 10.

Here, the configuration of the selection transistor array 50 illustrated in FIG. 5 is described. The selection transistor array 50 includes $m_1 \times m_2$ selection transistor cells 60 arranged in a matrix, $m_2$ wirings RBL and $m_2$ wirings WBL that extend in the x-axis direction, and $m_1$ wirings SG1 and $m_1$ wirings SG2 that extend in the y-axis direction. Hereinafter, the selection transistor cells 60 are assigned xy-plane coordinates and shown as selection transistor cells 60(1,1) to $60(m_1,m_2)$ in some cases. The wirings RBL and the wirings WBL are assigned a coordinate in the y-axis direction and shown as wirings RBL[1] to RBL[$m_2$] and wirings WBL[1] to WBL[$m_2$] in some cases. The wirings SG1 and the wirings SG2 are assigned a coordinate in the x-axis direction and shown as wirings SG1[1] to SG1[$m_1$] and wirings SG2[1] to SG2[$m_1$] in some cases.

Each of the selection transistor cells 60 includes a transistor 61 and a transistor 62. In the selection transistor cell $60(i_1,i_2)$, the wiring RBL[$i_2$] is electrically connected to a drain electrode (or a source electrode) of the transistor 61, the wiring RBL[$i_1,i_2$] is electrically connected to the source electrode (or the drain electrode) of the transistor 61, and the wiring SG1[$i_1$] is electrically connected to a gate electrode of the transistor 61. Moreover, in the selection transistor cell $60(i_1,i_2)$, the wiring WBL[$i_2$] is electrically connected to a drain electrode (or a source electrode) of the transistor 62, the wiring WBL[$i_1,i_2$] is electrically connected to the source electrode (or the drain electrode) of the transistor 62, and the wiring SG2[$i_1$] is electrically connected to a gate electrode of the transistor 62.

The selection transistor cells 60 are provided to correspond to the memory cell strings 20 in the above manner; hence, electrical continuity between the wiring RBL[$i_2$] and each of the wirings RBL[$1,i_2$] to RBL[$m_1,i_2$] can be selected by the transistor 61 of the corresponding selection transistor cell 60, and electrical continuity between the wiring WBL [$i_2$] and each of the wirings WBL[$1,i_2$] to WBL[$m_1,i_2$] can be selected by the transistor 62 of the corresponding selection transistor cell 60.

Furthermore, as illustrated in FIG. 2 and FIG. 5, the driver circuit 51, the read circuit 52, the driver circuit 53, and the driver circuit 54 are provided around the selection transistor array 50. The wirings RBL[1] to RBL[$m_2$] and the wirings WBL[1] to WBL[$m_2$] are connected to the driver circuit 51. The wirings RBL[1] to RBL[$m_2$] are also connected to the read circuit 52. As illustrated in FIG. 2, the wirings RWL [1,1] to RBL[$m_1,m_3$] and the wirings WWL[1,1] to WWL [$m_1,m_3$] are connected to the driver circuit 53. The wirings SG1[1] to SG1[$m_1$] and the wirings SG2[1] to SG2[$m_1$] are connected to the driver circuit 54.

Although the driver circuit 51, the read circuit 52, the driver circuit 53, and the driver circuit 54 are independently provided according to functions in FIG. 2 and FIG. 5, the semiconductor device described in this embodiment is not limited thereto and a plurality of circuits may be provided collectively as one circuit. The arrangement of the driver circuit 51, the read circuit 52, the driver circuit 53, the driver circuit 54, and the wirings connected to the circuits is not limited to the configuration illustrated in FIG. 2 or FIG. 5 and can be set as appropriate for a semiconductor device.

Although the wirings SL[1,1] to SL[$m_1,m_2$] are provided to be connected to the corresponding two-dimensional memory cell arrays 30 in FIG. 3, the configuration is not limited thereto and, for example, a plurality of wirings SL may be isolated or all the wirings SL may be electrically connected. The wirings SL[1,1] to SL[$m_1,m_2$] are connected, for example, to a low power supply potential line for supplying a ground potential GND, 0 V, or the like.

Although the three-dimensional memory cell array 40 is provided over the selection transistor array 50 in the semiconductor device illustrated in FIG. 2, the semiconductor device described in this embodiment is not limited thereto. For example, the selection transistor array 50 may be provided over the three-dimensional memory cell array 40. In that case, the transistor 61 and the transistor 62 in the selection transistor cell 60 are formed using an oxide semiconductor in a manner similar to that of the transistor 12, for example.

Furthermore, some of the peripheral circuits such as the driver circuit 51, the read circuit 52, the driver circuit 53, and the driver circuit 54 may be provided under the three-dimensional memory cell array 40. For example, read circuits may be provided in a matrix to correspond to the memory cell strings 20, in which case the read circuits provided in a matrix and the selection transistor cells 60 can be stacked.

Data writing, holding, and reading are basically the same as in the case of FIG. 1. Note that in the three-dimensional memory cell array 40, one of the two-dimensional memory cell arrays 30[1] to 30[$m_1$] is selected first, and then, data writing or reading is performed. Moreover, data writing and reading in the two-dimensional memory cell arrays 30[1] to 30[$m_1$] are performed at least row by row. That is, a specific writing operation is as follows. Note that the case where either a potential V2 (a potential lower than a power supply potential VDD) or a reference potential GND (also expressed as 0 V) is supplied to the node FN is described here as an example; however, the relation between potentials supplied to the node FN is not limited to this. Data that is held when the potential V2 is supplied to the node FN is referred to as data "1", and data that is held when the reference potential GND is supplied to the node FN is referred to as data "0". The wiring SL is supplied with the reference potential GND.

In data writing, one of the plurality of two-dimensional memory cell arrays 30 is selected first. In selecting the two-dimensional memory cell array 30, the potential of the corresponding wiring SG2 is set to V1 (e.g., VDD) to turn on the transistor 62 electrically connected to the wiring, thereby establishing electrical continuity between the wirings WBL[1] to WBL[$m_2$] and the wirings WBL included in the selected two-dimensional memory cell array 30. At this time, the potentials of the unselected wirings SG2 are set to GND (0 V), thereby not establishing electrical continuity between the wirings WBL[1] to WBL[$m_2$] and the wirings WBL included in the unselected two-dimensional memory cell arrays 30.

Next, in the selected two-dimensional memory cell array 30, the potential of the wiring WWL connected to the memory cells 10 in a row targeted for writing is set to V3 (a potential higher than V2, e.g., VDD) so that the transistors 12 in these memory cells are turned on. To write data "0" to the memory cells 10, GND is supplied as a writing potential to the wiring WBL, and to write data "1" to the memory cells 10, the potential V2 is supplied as a writing potential to the wiring WBL. Since the potential of the wiring WWL is V3 here, the potential V2 can be supplied to the node FN.

Data is held in such a manner that the potential of the wiring WWL connected to the memory cell 10 targeted for holding is set to GND so that the transistor 12 in that memory cell 10 is turned off. When the potential of the wiring WWL is fixed to GND, the potential of the node FN is fixed to the potential at the time of writing. In other words, when the potential V2 that is data "1" is supplied to the node FN, the potential of the node FN becomes V2, and when GND that is data "0" is supplied to the node FN, the potential of the node FN becomes GND.

Since GND is supplied to the wiring WWL, the transistor 12 is turned off regardless of whether data "1" or data "0" is written. Since the off-state current of the transistor 12 is extremely low, the charge of the gate electrode of the transistor 11 is held for a long time. In such a manner, data corresponding to a writing potential can be held in the node FN of the memory cell 10 targeted for holding.

In data reading, one of the plurality of two-dimensional memory cell arrays 30 is selected first. In selecting the two-dimensional memory cell array 30, the potential of the corresponding wiring SG1 is set to V1 (e.g., VDD) to turn on the transistor 61 electrically connected to the wiring, thereby establishing electrical continuity between the wirings RBL[1] to RBL[$m_2$] and the wirings RBL included in the selected two-dimensional memory cell array 30. At this time, the potentials of the unselected wirings SG1 are set to GND (0 V), thereby not establishing electrical continuity between the wirings RBL[1] to RBL[$m_2$] and the wirings RBL included in the unselected two-dimensional memory cell arrays 30.

Next, in the selected two-dimensional memory cell array 30, the potential of the wiring RWL connected to the memory cells 10 in a row targeted for reading is set to GND, and the potential of the other electrode of each of the capacitors 14 connected to this wiring RWL is set to GND. In addition, the potentials of the wirings RWL connected to the memory cells 10 in rows that are not targeted for reading are set to V4 (e.g., VDD), and the potential of the other electrode of each of the capacitors 14 connected to these wirings RWL is set to V4.

When the potential of the wiring RWL connected to the memory cells 10 in a row targeted for reading is set to GND, the transistors 11 are turned on if the potential V2 that is data "1" is supplied to the nodes FN of the memory cells 10 targeted for reading. On the other hand, the transistors 11 are turned off if GND that is data "0" is supplied to the nodes FN.

When the potentials of the wirings RWL connected to the memory cells 10 in rows that are not targeted for reading are set to V4, the transistors 11 are turned on regardless of whether data "1" or data "0" is written to the memory cells 10 that are not targeted for reading.

After being supplied with a reading potential (e.g., VDD), the wiring RBL is brought into an electrically floating state. When the transistor 11 in the memory cell 10 targeted for reading is on, electrical continuity between the wiring RBL and the wiring SL is established, and the potential of the wiring RBL is lowered. In contrast, when the transistor 11 in the memory cell 10 targeted for reading is off, electrical continuity between the wiring RBL and the wiring SL is not established, and the reading potential of the wiring RBL is maintained. In such a manner, data in the memory cell targeted for reading can be read from a change in the reading potential of the wiring RBL.

The driving method preferably includes an operation of collective data erasing per block. For example, the two-dimensional memory cell array 30 is regarded as one block. In that case, the two-dimensional memory cell array 30 from which data is collectively erased is selected by a method similar to that for data writing. By supplying a potential for turning on the transistor 12 to the wiring WWL connected to that two-dimensional memory cell array 30, data in one block can be collectively erased.

Figure 6:
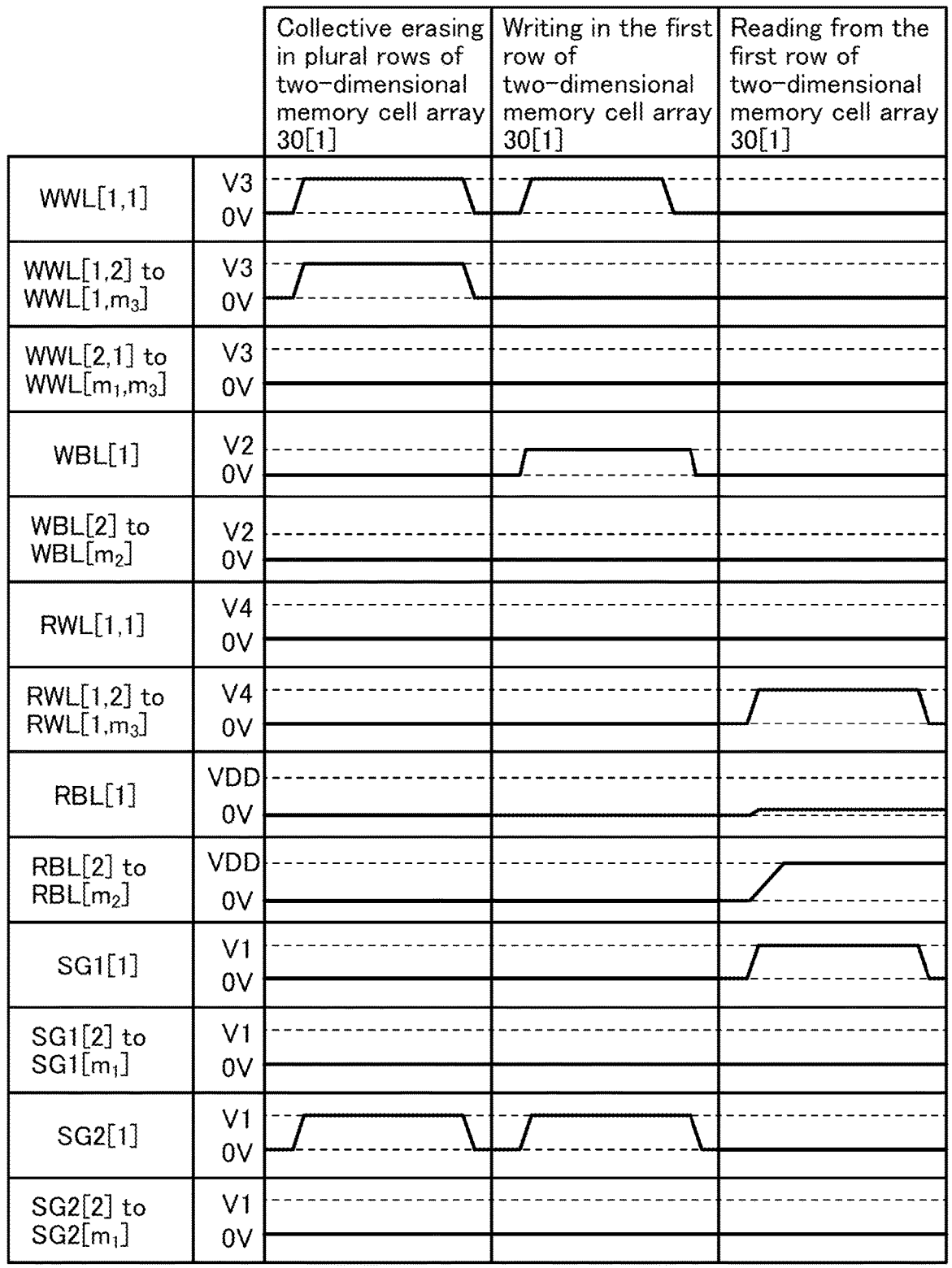
FIG. 6 is a timing chart for describing a method for driving a semiconductor device of one embodiment of the present invention.

FIG. 6 shows an example of a timing chart for more detailed operations of the semiconductor device in FIG. 2. The timing chart in FIG. 6 shows the relation between the potentials of the wirings in collective erasing in a plurality of rows of the two-dimensional memory cell array 30[1], writing in the first row of the two-dimensional memory cell array 30[1], and reading from the first row of the two-dimensional memory cell array 30[1]. Writing in the first row of the two-dimensional memory cell array 30[1] is an operation of writing data "1" to the memory cell in the first row and the first column of the two-dimensional memory cell array 30[1] and writing data "0" to the memory cells in the first row and the other columns (the second column to the $m_2$-th column). Reading from the first row of the two-dimensional memory cell array 30[1] is an operation of reading data written to the first row of the two-dimensional memory cell array 30[1]. Note that in the reading, data "1" is assumed to have been stored in the memory cell in the first row and the first column and data "0" is assumed to have been stored in the memory cells in the first row and the other columns (the second column to the $m_2$-th column).

[Collective Erasing]

In collective erasing in the two-dimensional memory cell array 30[1], the potential V1 is supplied to the wiring SG2[1] first so that the transistors 62 in the selection transistor cells 60(1,1) to 60(1,$m_2$) are turned on and electrical continuity between the wirings WBL[1] to WBL[$m_2$] and the corresponding wirings WBL[1,1] to WBL[1,$m_2$] is established. In addition, the wirings SG2[2] to SG2[$m_1$] are set to GND so that the transistors 62 in the selection transistor cells 60(2,1) to 60($m_1$,$m_2$) are turned off and electrical continuity between the wirings WBL[1] to WL[$m_2$] and the corresponding wirings WBL[2,1] to WBL[$m_1$,$m_2$] is not established. In such a manner, the two-dimensional memory cell array 30[1] is selected as a target for the collective erasing operation.

In the two-dimensional memory cell array 30[1], the potential V3 is supplied to the wiring WWL[1,1] to the wiring WWL[1,$m_3$] so that the transistors 12 in the first row to the $m_3$-th row are turned on, and the wirings WBL[1] to WBL[$m_2$] are set to GND so that the potentials of the nodes FN in the first row to the $m_3$-th row are set to GND.

Note that the wirings WWL[2,1] to WWL[$m_1$,$m_3$] electrically connected to the two-dimensional memory cell arrays 30[2] to 30[$m_1$] are set to GND so that the potentials of the nodes FN in the memory cells 10(2,1,1) to 10($m_1$, $m_2$,$m_3$) are held.

[Writing]

In writing in the first row of the two-dimensional memory cell array 30[1], the two-dimensional memory cell array 30[1] is selected first as a target for the writing operation, by an operation similar to collective erasing in the two-dimensional memory cell array 30[1].

In the two-dimensional memory cell array 30[1], the potential V3 is supplied to the wiring WWL[1,1] so that the transistors 12 in the first row are turned on, and the wirings WWL[1,2] to WWL[1,$m_3$] are set to GND so that the transistors 12 in the second row to the $m_3$-th row are turned off. At this time, the potential V2 is supplied to the wiring WBL[1], and the wirings WBL[2] to WBL[$m_2$] are set to GND. In addition, the wirings RWL[1,1] to RWL[1,$m_3$] are set to GND.

As a result, the potential V2 is supplied to the node FN in the memory cell 10 in the first row and the first column of the two-dimensional memory cell array 30[1]; that is, data "1" is written. In addition, 0 V is supplied to the nodes FN in the first row and the second column to the $m_2$-th column of the two-dimensional memory cell array 30[1]; that is, data "0" is written.

Note that as in collective erasing in the two-dimensional memory cell array 30[1], the wirings WWL[2,1] to WWL[$m_1$,$m_3$] electrically connected to the two-dimensional memory cell arrays 30[2] to 30[$m_1$] are set to GND so that the potentials of the nodes FN of the memory cells 10(2,1,1) to 10($m_1$,$m_2$,$m_3$) are held.

[Reading]

In reading in the first row of the two-dimensional memory cell array 30[1], the potential V1 is supplied to the wiring SG1[1] first so that the transistors 61 in the selection transistor cells 60(1,1) to 60(1,$m_2$) are turned on and electrical continuity between the wirings RBL[1] to RBL[$m_2$] and the corresponding wirings RBL[1,1] to RBL[1,$m_2$] is established. In addition, the wirings SG1[2] to SG1[$m_1$] are set to GND so that the transistors 61 in the selection transistor cells 60(2,1) to 60($m_1$,$m_2$) are turned off and electrical continuity between the wirings RBL[1] to RBL[$m_2$] and the corresponding wirings RBL[2,1] to RBL[$m_1$,$m_2$] is not established. In such a manner, the two-dimensional memory cell array 30[1] is selected as a target for the reading operation.

In the two-dimensional memory cell array 30[1], the wiring RWL[1,1] connected to the memory cells 10 in the first row targeted for reading is set to GND. In addition, the potential V4 is supplied to the wirings RWL[1,2] to RWL[1,$m_3$] connected to the memory cells 10 that are not targeted for reading, to turn on the transistors 11 in these memory cells 10.

Here, the reading circuit 52 supplies VDD to the wirings RBL to bring the wirings RBL into an electrically floating state.

Consequently, electrical continuity between the wiring RBL[1] connected to the memory cell 10(1,1,1) to which data "1" is written to the memory cell 10 and the wiring SL[1,1] is established, and the potential of the wiring RBL[1] is lowered. Electrical continuity between the wirings RBL[2] to RBL[$m_2$] connected to the memory cells 10(1,2,1) to 10(1,$m_2$,1) to which data "0" is written to the memory cells 10 and the wirings SL[1,2] to SL[1,$m_2$] is not established; thus, the potentials of the wirings RBL[2] to RBL[$m_2$] become the potential VDD.

Note that the wirings WWL[1,1] to WWL[$m_1$,$m_3$] are set to GND so that the potentials of the nodes FN of the memory cells 10(1,1,1) to 10($m_1$,$m_2$,$m_3$) are held.

Although the case where 2-level (1-bit) data is written to the memory cell in the method for driving the semiconductor device is described, a multilevel technique in which data with three or more levels is written to one memory cell may be employed. For example, data such as 4-level (2-bit), 8-level (3-bit), or 16-level (4-bit) data may be held in the memory cell.

Since the off-state current of the transistors using an oxide semiconductor is extremely low, the semiconductor device described in this embodiment can hold stored data for an extremely long time with the use of the transistors. In other words, refresh operation becomes unnecessary or the frequency of refresh operation can be extremely low; thus, power consumption can be sufficiently reduced. Furthermore, stored data can be retained for a long time even when power is not supplied (note that a potential is preferably fixed).

In the semiconductor device described in this embodiment, high voltage is not needed for data writing and there is no problem of element deterioration. For example, unlike in a conventional nonvolatile memory, it is not necessary to inject electrons into a floating gate or extract electrons from a floating gate; hence, a problem of deterioration of a gate insulating layer due to extraction of electrons does not occur. In other words, the semiconductor device of the disclosed invention does not have a rewrite cycle limit, which is a problem in a conventional nonvolatile memory, and the reliability thereof is drastically improved. Furthermore, data is written in response to the on state and off state of the transistor; thus, high-speed operation can be easily achieved.

In the semiconductor device described in this embodiment, stacking the memory cells allows the storage capacity per unit area to be increased in accordance with the number of stacked layers. Consequently, the memory cells can obtain favorable characteristics such as above, and a semiconductor device whose storage capacity per unit area is equivalent to or larger than that of a conventional memory can be provided.

The structure, method, and the like described above in this embodiment can be used in combination as appropriate with the structures, methods, and the like described in the other embodiments.

Embodiment 2

In this embodiment, a structure of a semiconductor device of one embodiment of the present invention will be described with reference to FIG. 7 to FIG. 26.

<Structures of Memory Cell and Memory Cell Array>

Figure 7:
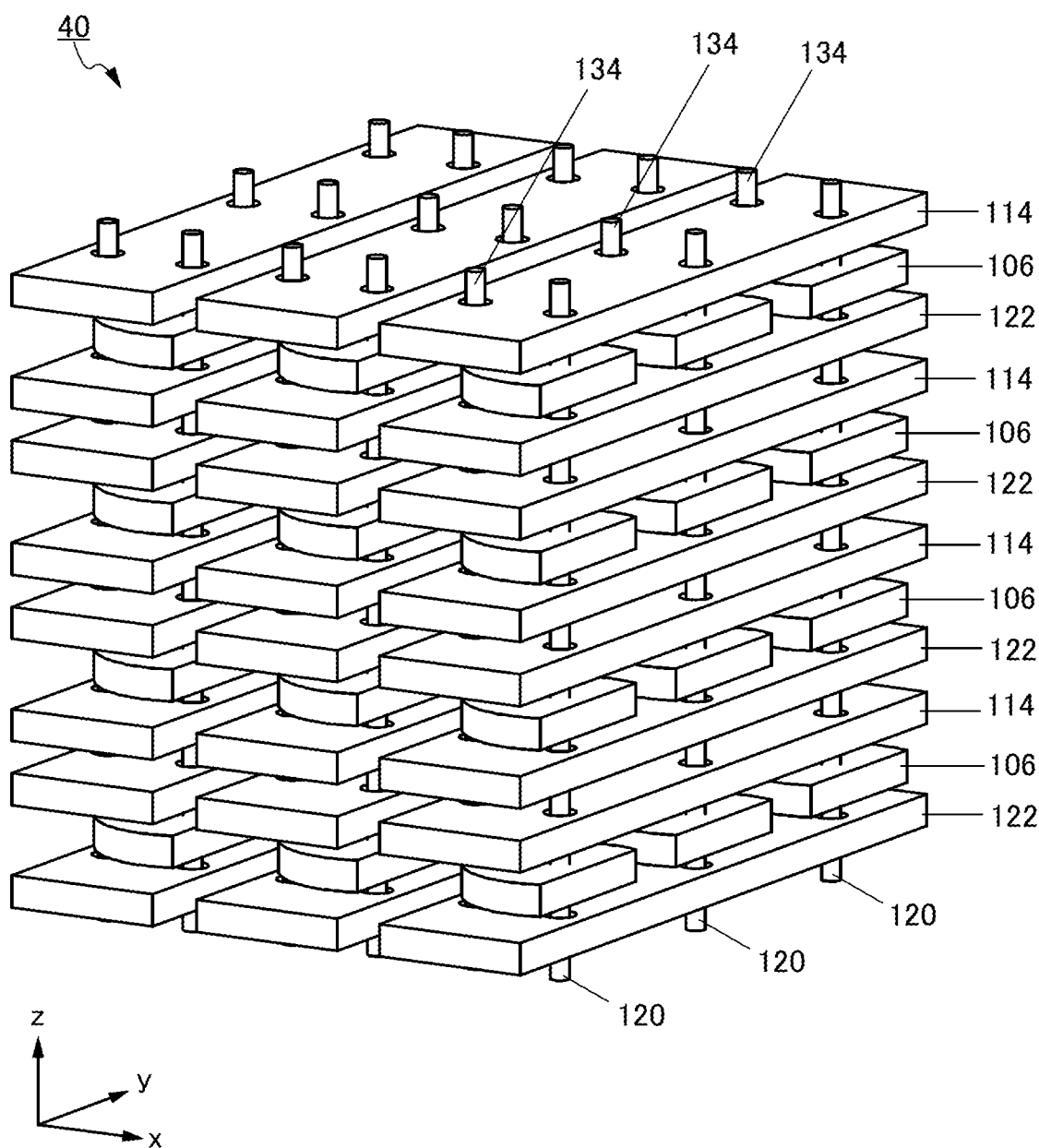
FIG. 7 is a schematic view illustrating a semiconductor device of one embodiment of the present invention.
Figure 8A:
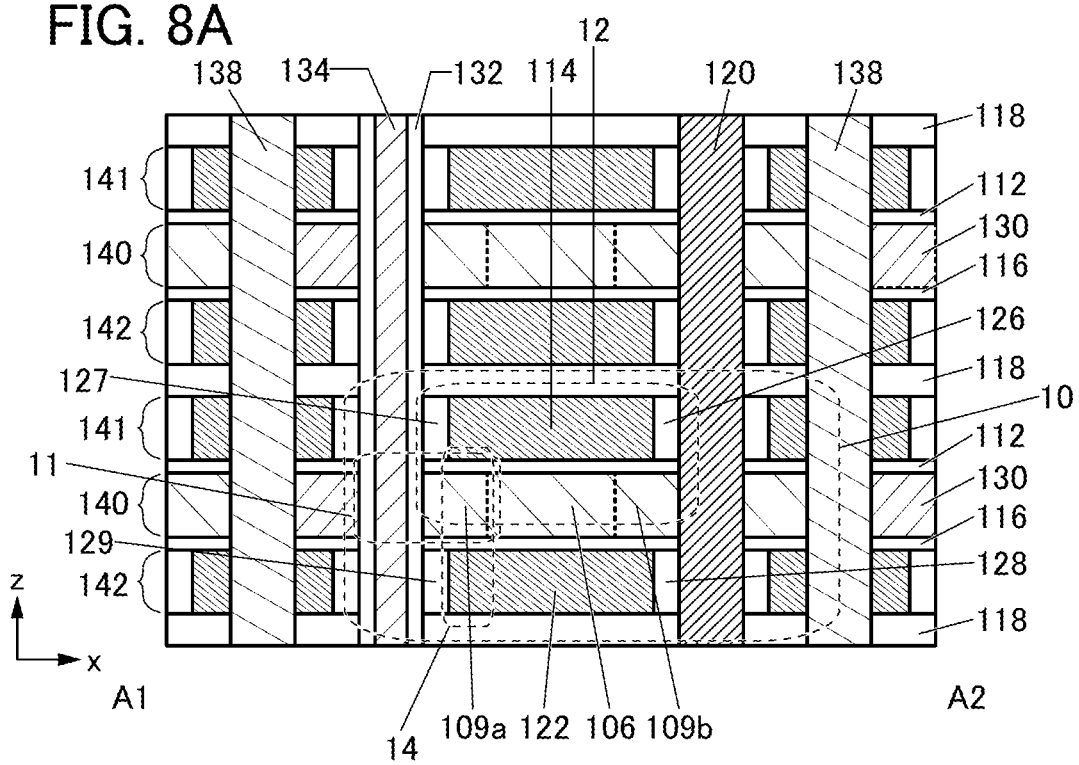
FIGS. 8A and 8B are a cross-sectional view and a plan view illustrating a semiconductor device of one embodiment of the present invention.
Figure 8B:
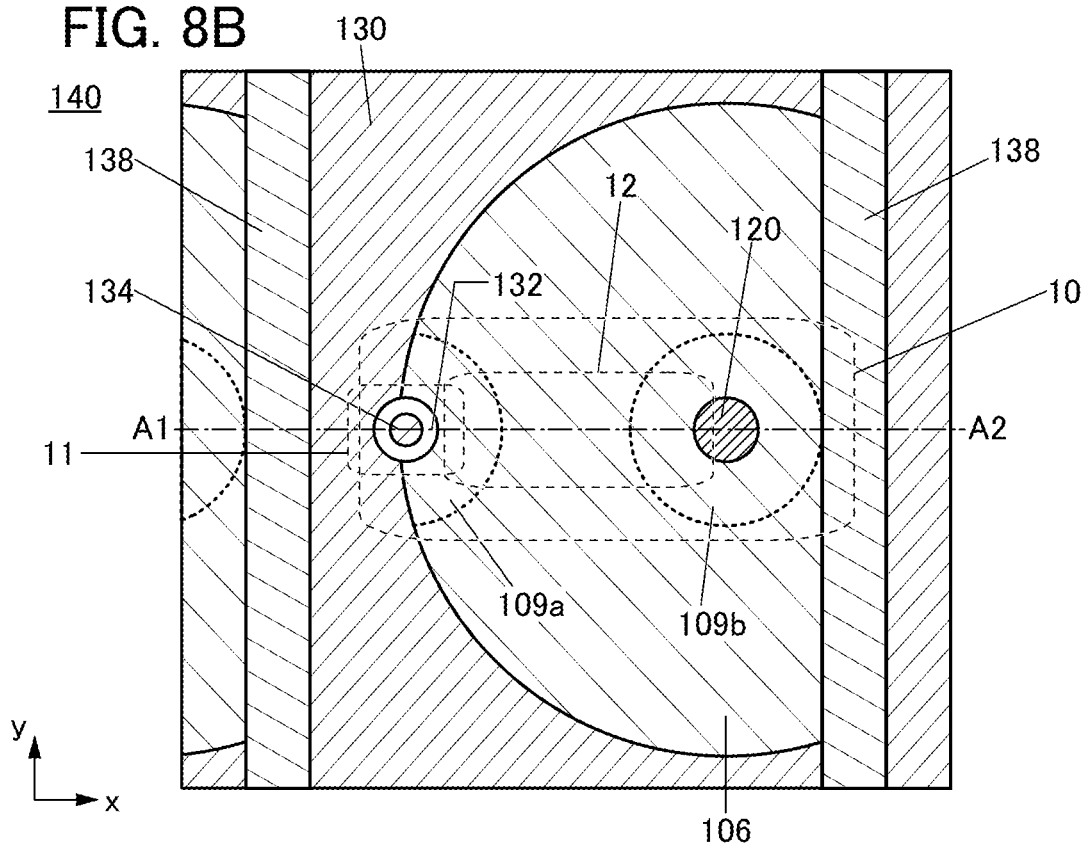
Figure 9A:
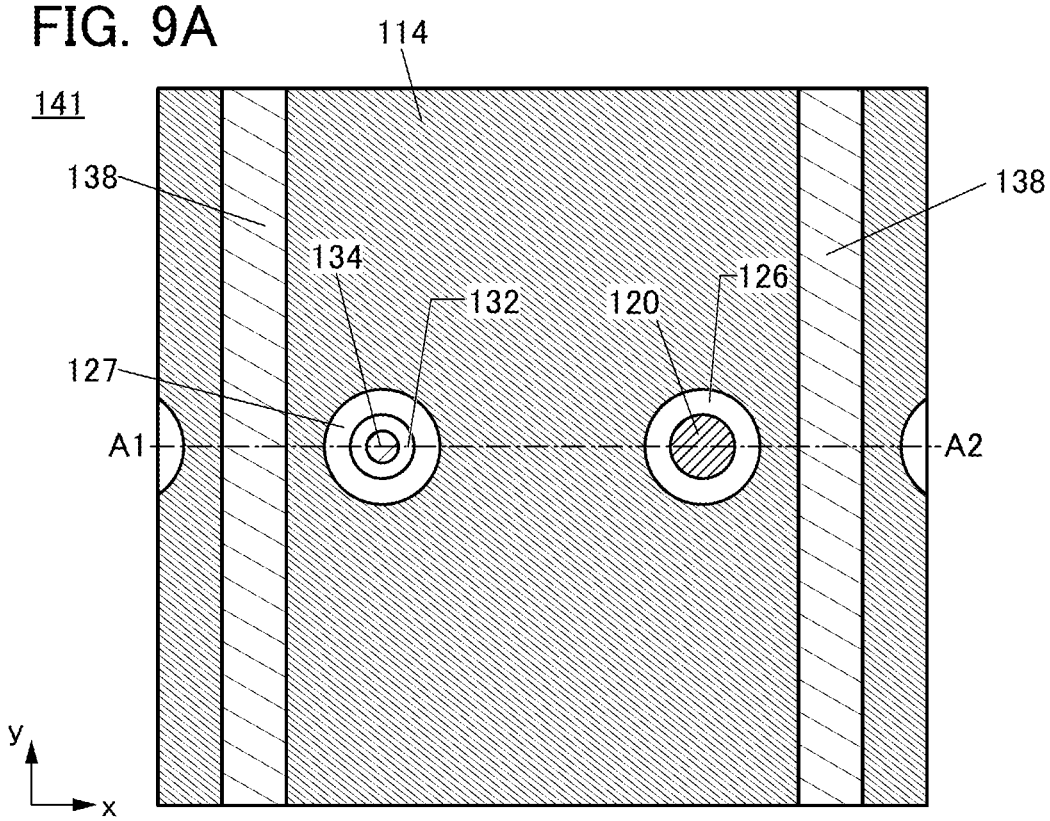
FIGS. 9A and 9B are plan views illustrating a semiconductor device of one embodiment of the present invention.
Figure 9B:
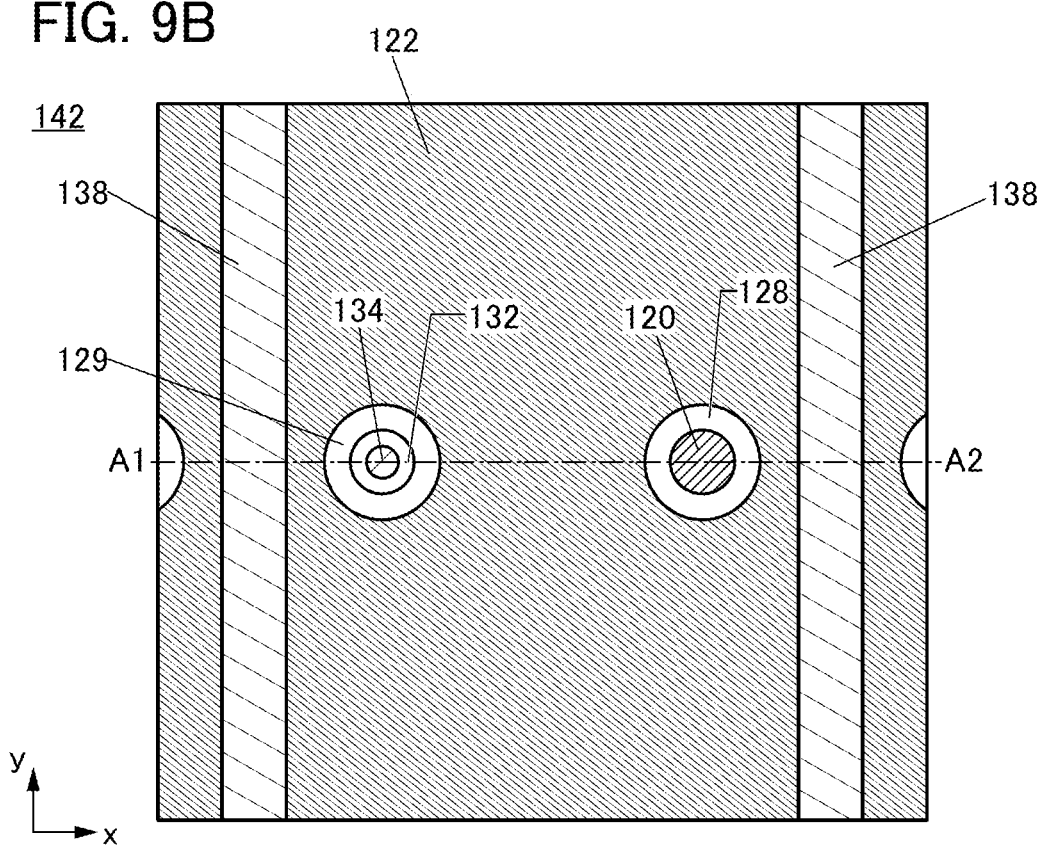

The structures of the memory cell 10 and the three-dimensional memory cell array 40 in which a plurality of the memory cells 10 are arranged will be described with reference to FIG. 7 to FIG. 9. FIG. 7 is a three-dimensional schematic view of the three-dimensional memory cell array 40. FIG. 8(A) is a cross-sectional view of part of the three-dimensional memory cell array 40 including the memory cell 10 and corresponds to the dashed-dotted line A1-A2 shown in FIG. 8(B), FIG. 9(A), and FIG. 9(B). FIG. 8(B) is a plan view of a layer 140 illustrated in FIG. 8(A). FIG. 9(A) is a plan view of a layer 141 illustrated in FIG. 8(A). FIG. 9(B) is a plan view of a layer 142 illustrated in FIG. 8(A). Note that in FIG. 7 to FIG. 9, a rectangular coordinate system using the x-axis, y-axis, and z-axis is set for the sake of convenience, as in FIG. 2. Here, the top surface of a substrate where the three-dimensional memory cell array 40 is provided is substantially parallel to the xy plane, and the z-axis is substantially perpendicular to the top surface of the substrate. Note that some components of the memory cell 10 (e.g., an insulator 116 and an insulator 112) are omitted in FIG. 7.

The memory cell array illustrated in FIGS. 8(A) and 8(B) and FIGS. 9(A) and 9(B) includes a stack in which an insulator 118 is placed over a substrate (not illustrated), the layer 142 is placed over the insulator 118, the insulator 116 is placed over the layer 142, the layer 140 is placed over the insulator 116, the insulator 112 is placed over the layer 140, and the layer 141 is placed over the insulator 112. In the stack, at least the layer 142, the insulator 116, the layer 140, the insulator 112, and the layer 141 constitute the memory cell 10. Here, the insulators 118 are provided so as to sandwich the memory cell 10 and function as interlayer insulating films. The layer 142 includes a conductor 122, an insulator 128, and an insulator 129. The layer 140 includes an oxide 106 and an insulator 130. The layer 141 includes a conductor 114, an insulator 126, and an insulator 127.

A first opening is provided to penetrate the stack, an insulator 132 is placed inside the first opening, and an oxide 134 is placed inside the insulator 132. A second opening is provided to penetrate the stack, and a conductor 120 is placed inside the second opening. A third opening is provided to penetrate the stack, and an insulator 138 is placed inside the third opening. Here, the first opening and the second opening are vertical-hole-shaped openings that extend in the z-axis direction. The third opening is a groove-shaped opening that extends in the z-axis direction and the y-axis direction.

Thus, the insulator 132 and the oxide 134 are provided to extend in the z-axis direction like the first opening. Note that it can also be said that the insulator 132 and the oxide 134 are formed in a columnar shape. The insulator 132 and the oxide 134 corresponds to part of a plurality of transistors 11 that are included in the memory cell string 20 shown in FIG. 2 and the like and are electrically connected in series.

Here, the top surface of the first opening where the transistor 11 is provided is circular in FIG. 8(B) and the like but is not limited to this; the top surface may have, for example, an elliptical shape or a polygonal shape such as a triangle or a quadrangle. In the case where a polygonal shape is employed, its corners may be rounded. The shape of the top surfaces of the insulator 132 and the oxide 134 may change according to the shape of the top surface of the first opening. The first opening may have a shape in which the lower (substrate-side) cross-sectional area of the opening perpendicular to the z-axis is smaller than the upper cross-sectional area of the opening perpendicular to the z-axis.

The conductor 120 is provided to extend in the z-axis direction like the second opening, and is shared by the memory cells 10 arranged in the z-axis direction. Note that it can also be said that the conductor 120 is formed in a columnar shape. The conductor 120 functions as the wiring WBL illustrated in FIG. 3 and the like. Although the insulator 132, the oxide 134, and the conductor 120 are arranged in the x-axis direction in FIG. 8 and FIG. 9, the arrangement is not limited to this and the insulator 132, the oxide 134, and the conductor 120 may be arranged at an angle with respect to the x-axis direction, for example.

Here, the top surface of the second opening where the conductor 120 is provided is circular in FIG. 8(B) and the like but is not limited to this; the top surface may have, for example, an elliptical shape or a polygonal shape such as a triangle or a quadrangle. In the case where a polygonal shape is employed, its corners may be rounded. The shape of the top surface of the conductor 120 may change according to the shape of the top surface of the second opening. The second opening may have a shape in which the lower (substrate-side) cross-sectional area of the opening is smaller than the upper cross-sectional area of the opening.

The insulator 138 is provided to extend in the z-axis direction and the y-axis direction like the third opening. Note that it can also be said that the insulator 138 is formed in a wall shape. The insulator 138 preferably has a comparatively low relative permittivity.

Here, as illustrated in FIG. 9(A), in the layer 141, the conductor 114 is divided by the insulators 138 and is provided to extend in the y-axis direction. The conductor 114 is shared by the memory cells 10 arranged in the y-axis direction and functions as the wiring WWL illustrated in FIG. 3 and the like. Moreover, the conductor 114 is penetrated by the conductor 120, and the insulator 126 is formed between the conductor 114 and the conductor 120 so as to surround the conductor 120. For example, the insulator 126 is formed by oxidizing a side surface of the conductor 114. When the insulator 126 is formed in this manner, the conductor 114 functioning as the wiring WWL and the conductor 120 functioning as the wiring WBL can be prevented from being short-circuited. The conductor 114 is penetrated by the insulator 132 and the oxide 134, and the insulator 127 is formed between the conductor 114 and the insulator 132 so as to surround the insulator 132. For example, the insulator 127 is formed by oxidizing a side surface of the conductor 114.

As illustrated in FIG. 9(B), in the layer 142, the conductor 122 is divided by the insulators 138 and is provided to extend in the y-axis direction. The conductor 122 is shared by the memory cells 10 arranged in the y-axis direction and functions as the wiring RWL illustrated in FIG. 3 and the like. Moreover, the conductor 122 is penetrated by the conductor 120, and the insulator 128 is formed between the conductor 122 and the conductor 120 so as to surround the conductor 120. For example, the insulator 128 is formed by oxidizing a side surface of the conductor 122. When the insulator 128 is formed in this manner, the conductor 122 functioning as the wiring RWL and the conductor 120 functioning as the wiring WBL can be prevented from being short-circuited. The conductor 122 is penetrated by the insulator 132 and the oxide 134, and the insulator 129 is formed between the conductor 122 and the insulator 132 so as to surround the insulator 132. For example, the insulator 129 is formed by oxidizing a side surface of the conductor 122.

As to the conductors 114 and the conductors 122, although not illustrated, a lower conductor is preferably provided to extend further in the y-axis direction than an upper conductor so that they form a step-like shape. By providing the conductors 114 and the conductor 122 in this manner, a region of part of the top surface of the lower conductor is not overlapped by the upper conductor; thus, such a region of each conductor can be connected to a plug-shaped conductor.

As illustrated in FIG. 8(B), in the layer 140, the insulator 130 is divided by the insulators 138 and is provided to extend in the y-axis direction. Furthermore, the oxide 106 is provided so as to be surrounded by the insulator 130 and the insulator 138, and the boundary between the oxide 106 and the insulator 130 is a circular shape with the conductor 120 as the center. The insulator 132, the oxide 134, and the conductor 120 are provided so that at least part thereof penetrates the island-shaped oxide 106. That is, the oxide 106, the insulator 132 and the oxide 134, and the conductor 120 are provided in a region surrounded by the insulator 130 and the insulator 138. Thus, although not illustrated, the oxide 106, the insulator 132, the oxide 134, and the conductor 120 are arranged in the y-axis direction while being divided by the insulators 130. Note that in the oxide 106, a region 109a is formed in the vicinity of the insulator 132 and a region 109b is formed in the vicinity of the conductor 120. The region 109a and the region 109b have a lower resistance than the other regions of the oxide 106.

The above-described stack is stacked repeatedly in the z-axis direction, whereby the memory cells 10 are arranged in the z-axis direction. The memory cells 10 are arranged in the z-axis direction and constitute the memory cell string 20 shown in the above embodiment. Furthermore, the oxide 106, the insulator 132, the oxide 134, the conductor 120, and the like, which are surrounded by the insulator 130 and the insulator 138 and illustrated in FIG. 8(B) and FIGS. 9(A) and 9(B), are arranged repeatedly in the y-axis direction, whereby the memory cells 10 are arranged in the y-axis direction. Similarly, the memory cell strings 20 are also arranged in the y-axis direction, and the memory cell strings 20 constitute the two-dimensional memory cell array 30 shown in the above embodiment. In addition, the block between the insulators 138, which is illustrated in FIG. 8(A) and the like, is arranged repeatedly in the x-axis direction, whereby the memory cells 10 are arranged in the x-axis direction. Similarly, the two-dimensional memory cell arrays 30 are also arranged in the x-axis direction, and the two-dimensional memory cell arrays 30 constitute the three-dimensional memory cell array 40 shown in the above embodiment.

The memory cell 10 illustrated in FIGS. 8(A) and 8(B) and FIGS. 9(A) and 9(B) includes the transistor 11, the transistor 12, and the capacitor 14.

The transistor 12 includes the oxide 106 placed over the insulator 116, the insulator 112 placed over the oxide 106, and the conductor 114 that is placed over the insulator 112 and overlaps at least part of a region between the region 109*a* and the region 109*b* of the oxide 106. The insulator 118 functioning as an interlayer insulating film is provided over the transistor 12. The insulator 118 preferably has a comparatively low relative permittivity.

Here, the region 109*a* functions as one of the source and the drain of the transistor 12, the region 109*b* functions as the other of the source and the drain of the transistor 12, and the region positioned between the region 109*a* and the region 109*b* of the oxide 106 functions as a channel formation region of the transistor 12. The insulator 112 functions as a gate insulating film of the transistor 12, and the conductor 114 functions as the gate of the transistor 12.

The oxide 106 in the transistor 12 is surrounded by the insulator 130 and the insulator 138 and is isolated from the oxides 106 of other transistors 12. Thus, the oxides 106 of the transistors 12 connected to the same conductor 114 can be prevented from being in contact with each other.

A metal oxide functioning as an oxide semiconductor (hereinafter also referred to as an oxide semiconductor) is preferably used as the oxide 106. An oxide semiconductor is preferable because favorable on-state characteristics and high mobility of a transistor can be obtained as compared to a semiconductor made of silicon or the like.

For example, as the oxide 106, an oxide semiconductor such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) can be used. Furthermore, as the oxide 106, an In—Ga oxide or an In—Zn oxide may be used.

By addition of a metal element such as aluminum, ruthenium, titanium, tantalum, chromium, or tungsten other than the constituent elements of an oxide semiconductor, the oxide semiconductor forms a metal compound and has a reduced resistance. Note that aluminum, titanium, tantalum, tungsten, or the like is preferably used.

To add the metal element to the oxide semiconductor, for example, a metal film containing the metal element, a nitride film containing the metal element, or an oxide film containing the metal element is provided over the oxide semiconductor. By providing the film, some oxygen at the interface between the film and the oxide semiconductor or in the oxide semiconductor in the vicinity of the interface may be absorbed into the film or the like and an oxygen vacancy may be formed, so that the resistance in the vicinity of the interface may be lowered.

After the metal film, the nitride film containing the metal element, or the oxide film containing the metal element is provided over the oxide semiconductor, heat treatment is preferably performed in an atmosphere containing nitrogen. By the heat treatment in an atmosphere containing nitrogen, the metal element that is the component of the metal film, the nitride film containing the metal element, or the oxide film containing the metal element diffuses from the film into the oxide semiconductor, or the metal element that is the component of the oxide semiconductor diffuses into the film; hence, the oxide semiconductor and the film can form a metal compound and have a lower resistance. The metal element added to the oxide semiconductor becomes relatively stable when it forms a metal compound with the metal element in the oxide semiconductor; thus, a highly reliable semiconductor device can be provided.

At the interface between the oxide semiconductor and the metal film, the nitride film containing the metal element, or the oxide film containing the metal element, a compound layer may be formed. Note that the compound layer is a layer including a metal compound containing a component of the metal film, the nitride film containing the metal element, or the oxide film containing the metal element and a component of the oxide semiconductor. For example, as the compound layer, a layer where the metal element of the oxide semiconductor and the metal element added are alloyed may be formed. The alloyed layer is relatively stable, and thus a highly reliable semiconductor device can be provided.

In the case where hydrogen in the oxide semiconductor diffuses into a low-resistance region of the oxide semiconductor and enters an oxygen vacancy in the low-resistance region, the hydrogen becomes relatively stable. It is known that hydrogen in the oxygen vacancy in the oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region of the oxide semiconductor or a region where the metal compound is formed tends to be further lowered, and the oxide semiconductor whose resistance is not lowered tends to be highly purified (reduction of impurities such as water or hydrogen) and the resistance tends to be further increased.

The oxide semiconductor has an increased carrier density when it contains an impurity element such as hydrogen or nitrogen. Hydrogen in the oxide semiconductor reacts with oxygen bonded to a metal atom to be water, and thus forms an oxygen vacancy in some cases. Entry of hydrogen into the oxygen vacancy increases the carrier density. Furthermore, in some cases, part of hydrogen is bonded to oxygen bonded to a metal atom, whereby an electron serving as a carrier is generated. That is, the resistance of an oxide semiconductor containing nitrogen or hydrogen is lowered.

Thus, selective addition of a metal element and an impurity element such as hydrogen and nitrogen to the oxide semiconductor allows a high-resistance region and a low-resistance region to be provided in the oxide semiconductor. In other words, when the resistance of the oxide 106 is selectively lowered, a region that has a low carrier density and functions as a semiconductor and low-resistance regions (the region 109a and the region 109b) that function as a source region and a drain region can be provided in the island-shaped oxide 106.

For example, for an oxide film containing a metal element for lowering the resistance of the region 109a or a nitride film containing the metal element, an insulating material that can be used for an interlayer insulating film or a gate insulating film may be used. Specifically, when a nitride film containing the metal element or an oxide film containing the metal element is used for the insulator 132, the resistance of a region of the oxide 106 in contact with the insulator 132 is lowered, so that the region 109a can be provided. Thus, the reduction in the resistance of the region 109a and the formation of the insulator 132 can be performed at the same time, whereby the process can be shortened.

Alternatively, as the metal film for lowering the resistance of the region 109a, a metal film with a thickness of greater than or equal to 0.5 nm and less than or equal to 5 nm, preferably greater than or equal to 1 nm and less than or equal to 2 nm may be used. Oxygen in the region 109a is absorbed by the metal film, whereby the metal film is oxidized and an oxygen vacancy is generated in the region 109a in some cases. That is, the resistance of the metal film is increased by oxidation of the metal film, and the resistance of the region 109a is lowered by generation of an oxygen vacancy.

It is preferable to perform heat treatment to oxidize the above metal film completely. Note that the heat treatment is preferably performed in an oxidation atmosphere. Alternatively, heat treatment in an atmosphere containing nitrogen followed by heat treatment in an atmosphere containing oxygen may be performed. When a structure body including oxygen exists in the vicinity of the metal film, the metal film may react with oxygen contained in the structure body and be oxidized by performing heat treatment. By oxidizing the metal film completely, the metal film becomes an insulator and its resistance is increased. Note that the oxidized metal film can be used as the insulator 132. Thus, the reduction in the resistance of the region 109a and the formation of the insulator 132 can be performed at the same time, whereby the process can be shortened.

For another example, for a metal film, a nitride film containing a metal element, or an oxide film containing a metal element for lowering the resistance of the region 109b, a conductive material that can be used for a wiring or a plug may be used. Specifically, when a metal film, a nitride film containing a metal element, or an oxide film containing a metal element is used for the conductor 120, the resistance of a region of the oxide 106 in contact with the conductor 120 is lowered, so that the region 109b can be provided. Thus, the reduction in the resistance of the region 109b and the formation of the conductor 120 can be performed at the same time, whereby the process can be shortened. At this time, when the diameter of the second opening where the conductor 120 is provided is made sufficiently large, for example, approximately greater than or equal to 10 nm and less than or equal to 200 nm, the conductivity of the conductor 120 can be maintained sufficiently even if the region 109b is formed by performing heat treatment.

The region between the region 109a and the region 109b functions as the channel formation region, and the region is a high-resistance region having a higher oxygen concentration and a lower carrier density than the region 109a and the region 109b functioning as the source region and the drain region. The region between the region 109a and the region 109b preferably has a lower concentration of at least one of a metal element and an impurity element such as hydrogen and nitrogen than the region 109a and the region 109b. The region of the oxide 106 that can function as the channel is made of a highly purified intrinsic or substantially highly purified intrinsic oxide semiconductor with a low impurity concentration and a high oxygen concentration as described above, whereby the off-state current of the transistor 12 can be reduced.

Alternatively, the oxide 106 may be formed by stacking oxides with different energy gaps. For example, the oxide 106 may have a stacked-layer structure in which a narrow-gap oxide is sandwiched between two layers of a wide-gap oxide. Note that a wide-gap oxide refers to an oxide with a wide energy gap, and a narrow-gap oxide refers to an oxide with a narrow energy gap. Hence, the wide-gap oxide is an oxide with a relatively wide energy gap compared to the narrow-gap oxide. Here, the energy of the conduction band minimum of the wide-gap oxide is preferably higher than the energy of the conduction band minimum of the narrow-gap oxide. In other words, the electron affinity of the wide-gap oxide is preferably lower than the electron affinity of the narrow-gap oxide.

It is preferable to use a combination of a wide-gap oxide and a narrow-gap oxide having different atomic ratios of metal atoms. Specifically, the atomic ratio of the element M to the constituent elements in the metal oxide used as the wide-gap oxide is preferably greater than the atomic ratio of the element M to the constituent elements in the metal oxide used as the narrow-gap oxide. The atomic ratio of the element M to In in the metal oxide used as the wide-gap oxide is preferably greater than the atomic ratio of the element M to In in the metal oxide used as the narrow-gap oxide. The atomic ratio of In to the element M in the metal oxide used as the narrow-gap oxide is preferably greater than the atomic ratio of In to the element M in the metal oxide used as the wide-gap oxide.

As the wide-gap oxide, for example, a metal oxide having a composition of In:Ga:Zn=1:3:4, In:Ga:Zn=1:3:2, or In:Ga:Zn=1:1:1 or a composition in the neighborhood thereof can be used. As the narrow-gap oxide, for example, a metal oxide having a composition of In:Ga:Zn=4:2:3 to 4:2:4.1, In:Ga:Zn=1:1:1, or In:Ga:Zn=5:1:6 or a composition in the neighborhood thereof can be used. Such a wide-gap oxide and a narrow-gap oxide are preferably combined to satisfy the above relation of the atomic ratios. Note that the above composition represents the atomic ratio of an oxide formed over a substrate or the atomic ratio of a sputtering target.

It is preferred that a CAAC-OS described later be used as the wide-gap oxide and a CAC-OS be used as the narrow-gap oxide.

When a stacked-layer film in which a narrow-gap oxide is sandwiched between two layers of a wide-gap oxide is used as the oxide 106, carriers flow mainly in the narrow-gap portion. Thus, high current driving capability in the on state of the transistor 12, that is, high on-state current and high field-effect mobility can be obtained.

Here, the conduction band minimum is gradually varied in a junction portion of the wide-gap oxide and the narrow-gap oxide. In other words, the conduction band minimum in the junction portion of the wide-gap oxide and the narrow-gap oxide is continuously varied or continuously connected. To obtain such a structure, the density of defect states in a mixed layer formed at the interface between the wide-gap oxide and the narrow-gap oxide is preferably made low.

Specifically, when the wide-gap oxide and the narrow-gap oxide contain a common element (as a main component) in addition to oxygen, a mixed layer with a low density of defect states can be formed. For example, in the case where the narrow-gap oxide is an In—Ga—Zn oxide, an In—Ga—Zn oxide, a Ga—Zn oxide, gallium oxide, or the like is preferably used for the wide-gap oxide. Accordingly, the density of defect states at the interface between the wide-gap oxide and the narrow-gap oxide can be reduced. Thus, the influence of interface scattering on carrier conduction becomes small, and the transistor 12 can have a high on-state current.

Note that more details of the metal oxide that can be used as the oxide 106 will be described later.

Note that the side surface of the conductor 114 on the oxide 134 side is preferably positioned closer to the conductor 120 than the side surface of the conductor 122 on the oxide 134 side. For example, the insulator 127 formed on the side surface of the conductor 114 is made thicker than the insulator 129 formed on the side surface of the conductor 122. Moreover, the side surface of the conductor 122 on the oxide 134 side may be etched. In that case, the conductor 122 and the conductor 114 are oxidized or etched at the same time; hence, the conductor 114 is preferably a conductive material different from the conductor 122 so that their oxidation rates or etching rates are different from each other. In this manner, interference with the capacitor 14 by the conductor 114 can be reduced.

The transistor 11 includes the region 109a of the oxide 106, the insulator 132, and the oxide 134. The insulator 132 and the oxide 134 are formed in a cylinder opening provided in the stack. The insulator 132 is formed in a cylindrical shape to be in contact with the inner side of the opening, and the oxide 134 is formed in a cylindrical shape on the inner side of the insulator 132. Note that an insulator may be further provided on the inner side of the oxide 134.

In the case where an insulator is provided on the inner side of the oxide 134, the insulator is preferably formed using a material that can supply oxygen to the oxide 134 or a material that can supply impurities such as hydrogen and nitrogen. When an oxide that contains hydrogen and nitrogen as little as possible is used for the insulator, oxygen can be supplied to the oxide 134 in some cases. When oxygen is supplied to the oxide 134, impurities such as hydrogen and water contained in the oxide 134 can be removed and the oxide 134 is highly purified. When an oxide that contains impurities as little as possible is used as the oxide 134, the transistor 11 and the semiconductor device including the transistor can have high reliability. When an oxide containing hydrogen and nitrogen is used for the insulator, hydrogen and nitrogen can be supplied to the oxide 134 in some cases. When hydrogen and nitrogen are supplied to the oxide 134, the resistance of the oxide 134 may decrease. When the resistance of the oxide 134 is reduced to a degree that does not impair the circuit operation, the transistor 11 can operate with lower driving voltage. Moreover, high current driving capability in the on state of the transistor 11, that is, high on-state current and high field-effect mobility can be obtained.

Additionally, a conductor may be provided on the inner side of the above insulator. The conductor functions as a back gate of the transistor 11. By changing a potential applied to the back gate independently of a potential applied to the conductor 114 (the top gate), the threshold voltage of the transistor 11 can be controlled. In particular, by applying a negative potential to the back gate, the threshold voltage of the transistor 11 can be higher than 0 V and the off-state current can be reduced.

Here, the region 109a of the oxide 106 functions as the gate of the transistor 11; the insulator 132 functions as a gate insulating film of the transistor 11; and the oxide 134 functions as a channel formation region, the source, and the drain of the transistor 11. In the oxide 134, a region that overlaps with the region 109a of the oxide 106 in the x-axis direction functions as the channel formation region of the transistor 11, and a region that does not overlap with the region 109a of the oxide 106 in the x-axis direction (which may also be referred to as a region that overlaps with the insulator 116 or the insulator 112 in the x-axis direction) functions as the source or the drain of the transistor 11.

For the oxide 134, an oxide semiconductor similar to that for the oxide 106 is preferably used. An oxide semiconductor is preferable because favorable on-state characteristics and high mobility of a transistor can be obtained as compared to a semiconductor made of silicon or the like.

For another example, like the oxide 106, the oxide 134 may have a stacked-layer structure in which a narrow-gap oxide is sandwiched between two layers of a wide-gap oxide. When a stacked-layer film in which a narrow-gap oxide is sandwiched between two layers of a wide-gap oxide is used as the oxide 134, carriers flow mainly in the narrow-gap portion. Thus, high current driving capability in the on state of the transistor 11, that is, high on-state current and high field-effect mobility can be obtained.

Since the insulator 127 is provided between the region of the oxide 134 functioning as the source or drain and the conductor 114, parasitic capacitance between the source and drain of the transistor 11 and the conductor 114 functioning as the wiring WWL can be reduced. Since the insulator 129 is provided between the region of the oxide 134 functioning as the source or drain and the conductor 122, parasitic capacitance between the source and drain of the transistor 11 and the conductor 122 functioning as the wiring RWL can be reduced As described above, in the transistor 11, the region 109a of the oxide 106, which functions as the gate electrode, is formed to surround at least part of the periphery of the oxide 134 with the insulator 132 therebetween. In the oxide 134 of the transistor 11, the channel length is substantially equal to the thickness of the oxide 106. The channel length direction of the transistor 11 is the z-axis direction. As illustrated in FIG. 8(A), the channel length direction of the transistor 11 is a direction parallel to the z-axis and perpendicularly crosses the channel length direction of the transistor 12. The channel width of the transistor 11 is substantially equal to the length of a portion in the circumference portion of the columnar oxide 134 that is covered with the region 109a.

As illustrated in FIG. 8(A), the insulator 132 and the oxide 134 are formed to extend in the z-axis direction and are shared by the memory cells 10 arranged in the z-axis direction. Thus, the region in the oxide 134, which functions as the source or the drain of the transistor 11, is shared with the transistor 11 adjacent in the z-axis direction. That is, in the memory cells 10 adjacent to each other in the z-axis direction, the transistors 11 are electrically connected in series.

In this manner, the plurality of transistors 11 included in one memory cell string 20 are collectively formed using the insulator 132 and the oxide 134. For example, if the transistor 11 is formed as a standard planar transistor, plugs and wirings would need to be formed in each layer. However, by employing such a structure, a structure in which the sources and the drains of the plurality of transistors 11 are electrically connected in series can be formed in a self-aligned manner.

In general, in a memory string, where a plurality of memory transistors are electrically connected in series, the on-resistance of each memory transistor get higher as the number of memory transistors increases, and the on-state current of the entire memory string is reduced. However, in the semiconductor device described in this embodiment, the transistors 11 using an oxide semiconductor, which have a large on-state current and high field-effect mobility, are electrically connected in series; thus, a reduction in on-state current of the transistor 11 portion in the memory cell string 20 can be decreased.

Note that regarding the oxide 134 in the highest-stage memory cell 10, a conductor that functions as the wiring SL and is electrically connected to a low power supply potential line is formed so as to be in contact with the top surface of this oxide 134. The connection of the oxide 134 in the lowest-stage memory cell 10 to the transistor 61 will be described later.

Figure 10A:
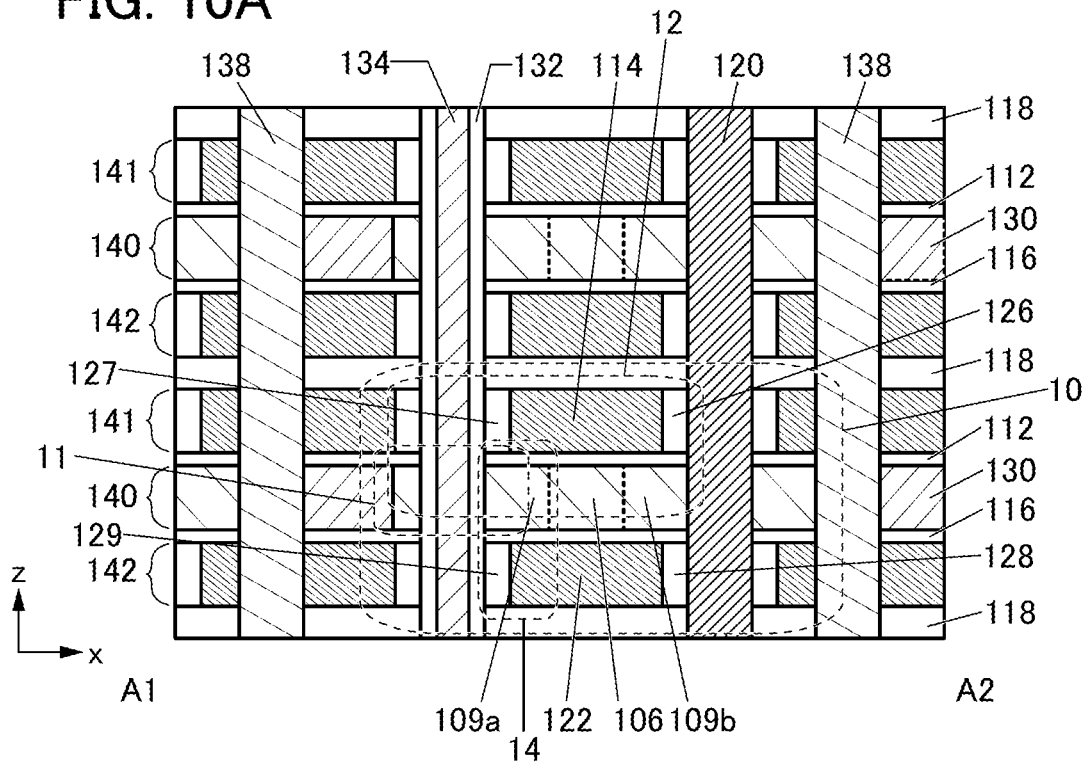
FIGS. 10A and 10B are a cross-sectional view and a plan view illustrating a semiconductor device of one embodiment of the present invention.
Figure 10B:
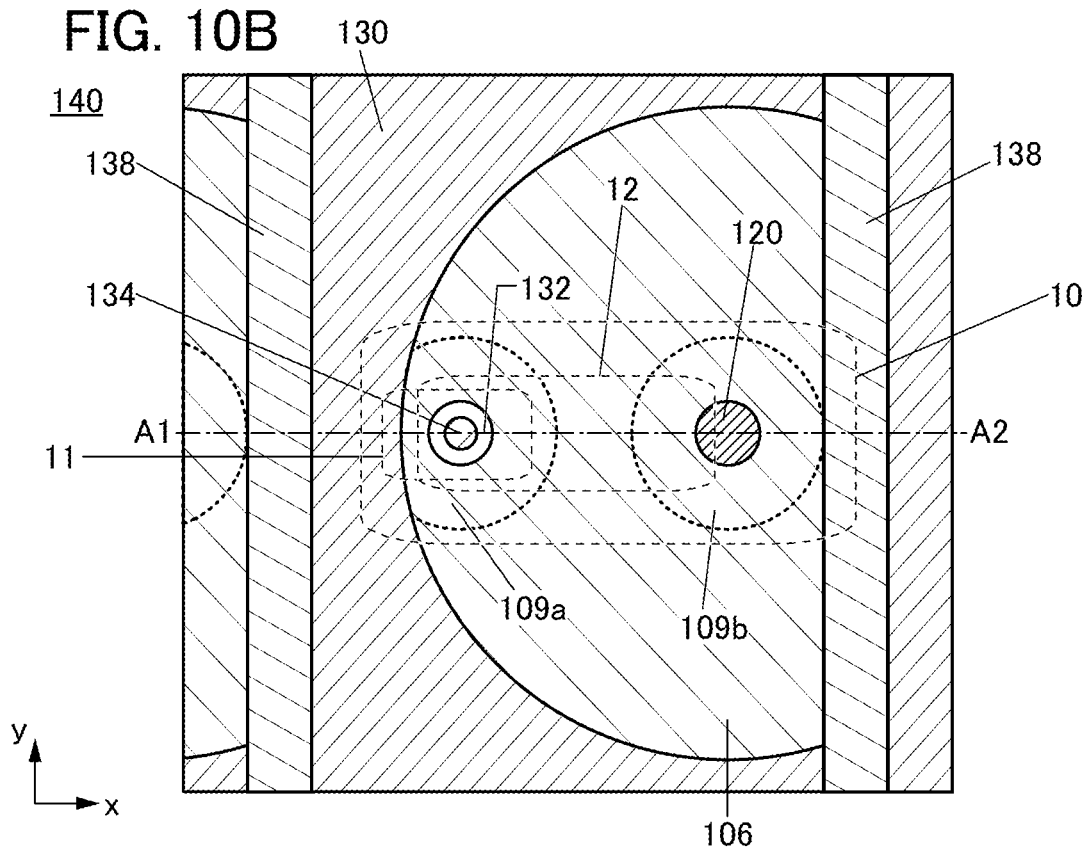

Although part of the first opening is provided to penetrate the oxide 106 in FIGS. 8(A) and 8(B) and the like, the semiconductor device described in this embodiment is not limited thereto. For example, as illustrated in FIGS. 10(A) and 10(B), the entire first opening may be provided so as to penetrate the oxide 106. In this case, the region 109a of the oxide 106, which functions as the gate electrode, is formed so as to surround the entire periphery of the oxide 134 with the insulator 132 therebetween. In this case, the transistor 11 becomes an SGT, and the channel width of the transistor 11 becomes substantially equal to the length of the circumference of the cylindrical oxide 134. Consequently, the transistor 11 can have a high on-state current and high mobility.

In a standard planar transistor, a gate electrode, a source electrode, and a drain electrode are formed when seen from above. In the transistor 11, on the inner side of the gate electrode, at least part of other components is formed when seen from above, resulting in an extremely small occupied area. In this manner, the transistor 11 can have an extremely small occupied area. This can reduce the area occupied by the memory cells 10 and increase the storage capacity per unit area of the semiconductor device.

Note that there is a case where a source electrode and a drain electrode are not included explicitly as in the transistor 11 in FIG. 8 or the like; for convenience, such a state is also referred to as a transistor in some cases.

The region 109b of the oxide 106 is in contact with the conductor 120, meaning that the other of the source and the drain of the transistor 12 is connected to the wiring WBL. Note that the conductor 120 in the highest-stage memory cell 10 is preferably covered with an insulator or the like so that the top surface of the conductor 120 is not in contact with, for example, the conductor functioning as the wiring SL. The connection of the conductor 120 in the lowest-stage memory cell 10 to the transistor 62 will be described later.

The capacitor 14 includes the conductor 122 placed over the insulator 118, the insulator 116 placed over the conductor 122, and the oxide 106 which is placed over the insulator 116 and in which at least part of the region 109a overlaps the conductor 122. The region 109a has a function of one electrode of the capacitor 14, and the conductor 122 has a function of the other electrode of the capacitor 14. The insulator 116 functions as a dielectric of the capacitor 14 and is preferably formed using an insulator with a comparatively high relative permittivity.

As described above, the region 109a of the oxide 106 functions as the gate in the transistor 11, functions as the one of the source and the drain in the transistor 12, and functions as the one electrode in the capacitor 14. That is, the region 109a of the oxide 106 functions as the node FN illustrated in FIG. 1(A). Since the off-state current of the transistor 12 is extremely low as described above, charge related to data retained in the node FN can be held for a long time.

As described above, data is held by turning off the transistor 12; hence, a problem of deterioration of a gate insulating film (a tunnel insulating film), which has been pointed out in a conventional floating-gate transistor, does not exist. That is, the deterioration of a gate insulating film at the time of injection of electrons into a floating gate, which has been regarded as a problem, can be eliminated. This means that there is no limitation on the number of write cycles in principle.

Note that the side surface of the conductor 122 on the conductor 120 side is preferably positioned closer to the oxide 134 than the side surface of the conductor 114 on the conductor 120 side. For example, the insulator 128 formed on the side surface of the conductor 122 is made thicker than the insulator 126 formed on the side surface of the conductor 114. Moreover, the side surface of the conductor 122 on the conductor 120 side may be etched. In that case, the conductor 122 and the conductor 114 are oxidized or etched at the same time; hence, the conductor 122 is preferably a conductive material different from the conductor 114 so that their oxidation rates or etching rates are different from each other. In this manner, interference with the transistor 12 by the conductor 122 can be reduced.

As illustrated in FIG. 8(B) and the like, the example in which the memory cells 10 are arranged in the y-axis direction and the memory cells 10 are not arranged in the x-axis direction between a pair of insulators 138 is shown above; however, the semiconductor device described in this embodiment is not limited thereto. For example, as illustrated in FIG. 11, the memory cells 10 may be arranged in a grid pattern in the x-axis direction and the y-axis direction between a pair of insulators 138.

Figure 11:
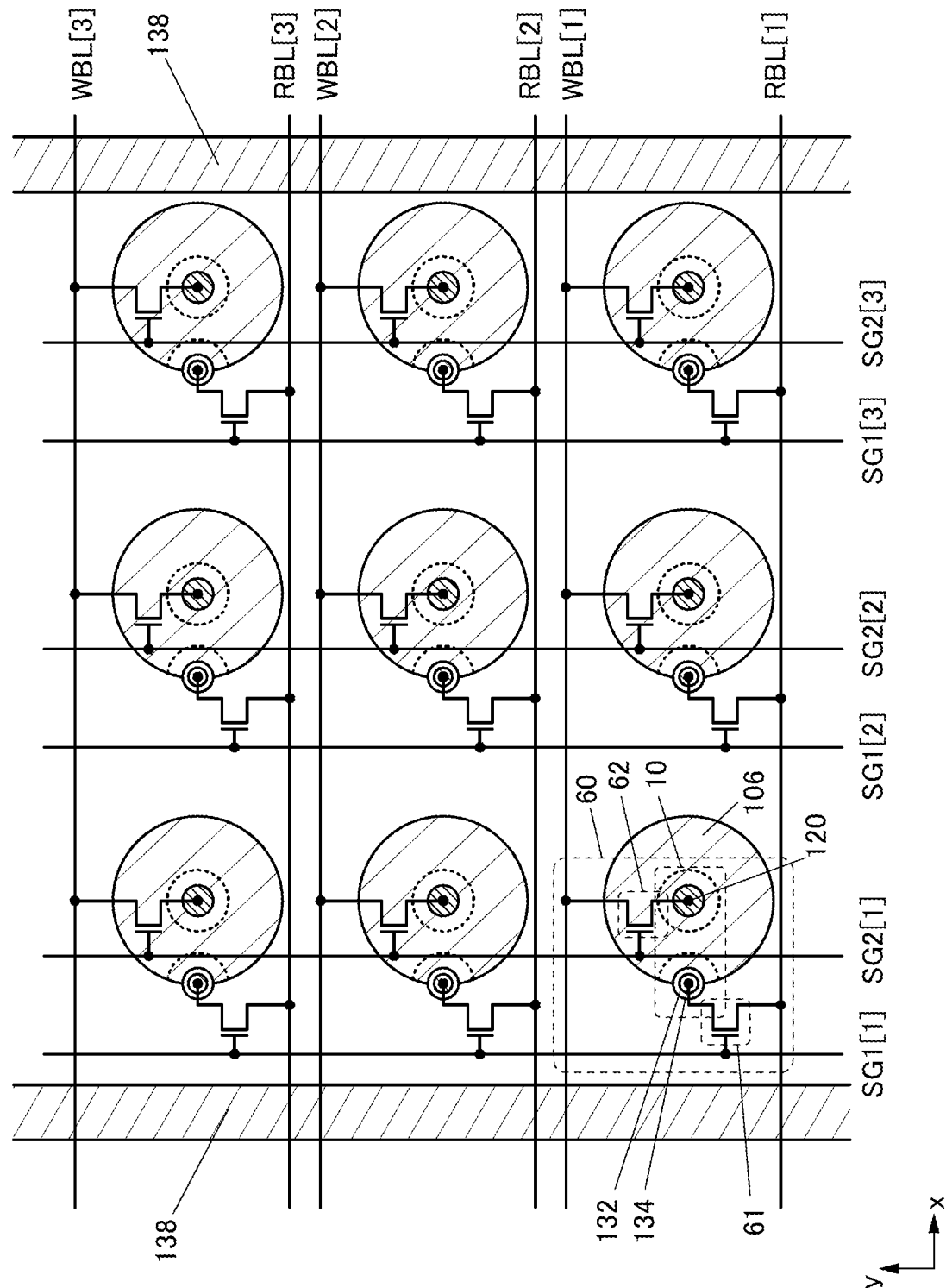
FIG. 11 is a plan view illustrating a semiconductor device of one embodiment of the present invention.

FIG. 11 is a plan view of the layer 140 and shows an example in which 3×3 memory cells 10 are provided between a pair of insulators 138. Moreover, the circuit of the selection transistor array illustrated in FIG. 5 is superimposed, and FIG. 11 shows connection between each memory cell 10 and the wirings RBL[1] to RBL[3], the wirings WBL[1] to WBL[3], the wirings SG1[1] to SG1[3], the wirings SG2[1] to SG2[3], and the selection transistor cells 60. Note that although FIG. 11 illustrates the example in which 3×3 memory cells 10 are provided between the pair of insulators 138, the semiconductor device described in this embodiment is not limited thereto, and the number, arrangement, and the like of the memory cells, the wirings, and the like can be set as appropriate in accordance with the circuit configuration and the driving method of the memory cell array.

As illustrated in FIG. 11, each of the memory cells 10 is connected to the corresponding selection transistor cell 60. The oxide 134 in the memory cell 10 is electrically connected to the wiring RBL through the transistor 61. Here, the wiring RBL extends in the x-axis direction and is shared by the selection transistor cells 60 and the memory cells 10 arranged in the x-axis direction. The conductor 120 in the memory cell 10 is electrically connected to the wiring WBL through the transistor 62. Here, the wiring WBL extends in the x-axis direction and is shared by the selection transistor cells 60 and the memory cells 10 arranged in the x-axis direction.

The gate of the transistor 61 is electrically connected to the wiring SG1 extending in the y-axis direction. Here, the wiring SG1 extending in the y-axis direction is shared by the selection transistors 60 and the memory cells 10 arranged in the y-axis direction. The gate of the transistor 62 is electrically connected to the wiring SG2 extending in the y-axis direction. Here, the wiring SG2 extending in the y-axis direction is shared by the selection transistors 60 and the memory cells 10 arranged in the y-axis direction.

Although FIG. 11 illustrates the layer 140, the layer 141 and the layer 142 are also provided with a pair of insulators 138 at the same interval. In other words, the 3×3 memory cells 10 illustrated in FIG. 11 overlap with the same conductor 114 and conductor 122. Thus, the 3×3 memory cells 10 illustrated in FIG. 11 are connected to the same wiring WWL and wiring RWL.

Note that by providing the wiring RBL and the wiring WBL perpendicularly to the wiring SG1 and the wiring SG2 as described above, the y-coordinate of a target memory cell 10 can be selected with the wiring RBL and the wiring WBL, and the x-coordinate of the target memory cell 10 can be selected with the wiring SG1 and the wiring SG2. In this manner, even when the memory cells 10 are arranged as in FIG. 11, writing and reading can performed on a given memory cell among the 3×3 memory cells 10.

In FIG. 11, the memory cells 10 are arranged in a grid pattern; however, the semiconductor device described in this embodiment is not limited to this. For example, the memory cells 10 may be arranged in a staggered pattern as illustrated in FIG. 12.

Figure 12:
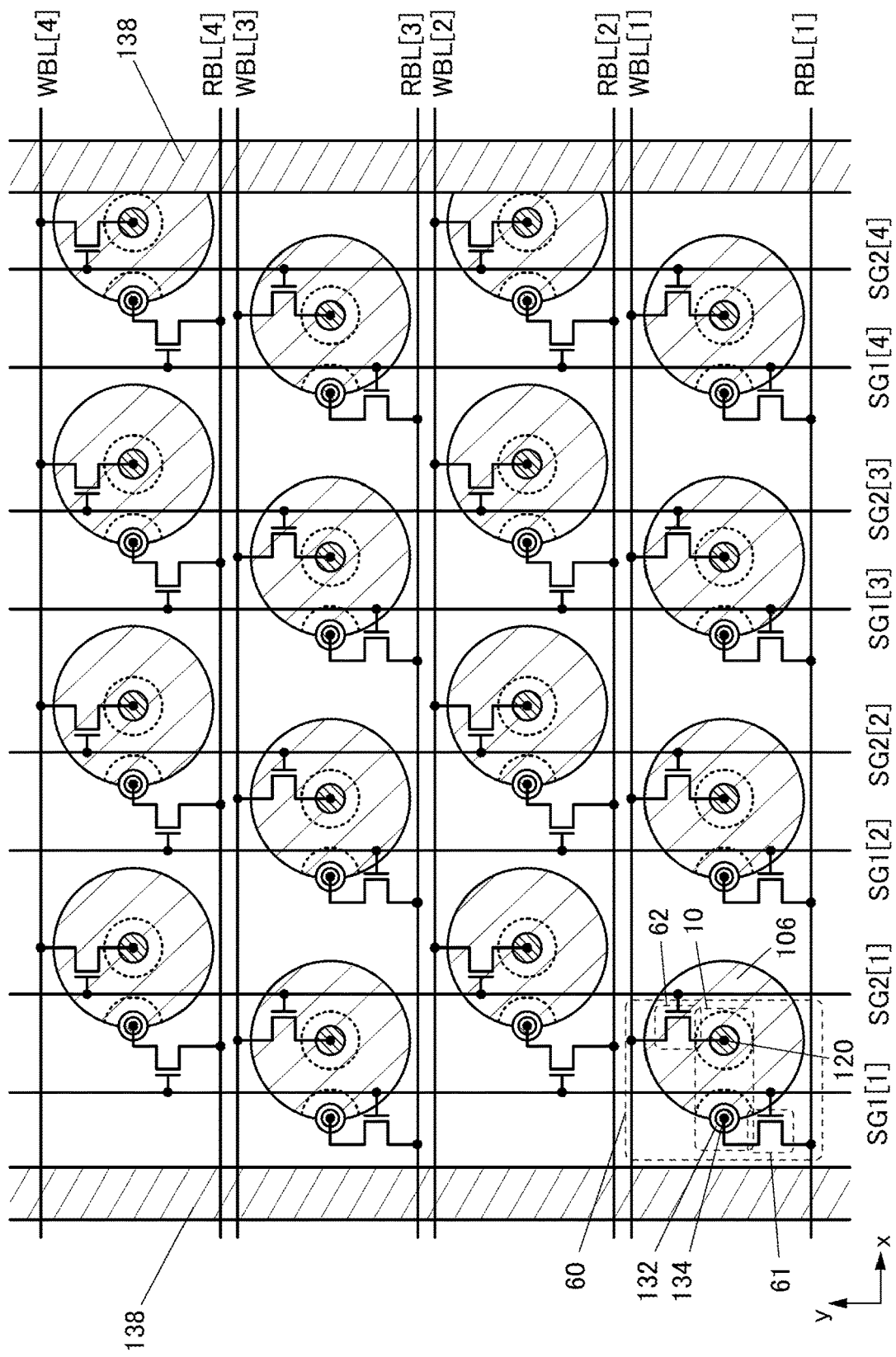
FIG. 12 is a plan view illustrating a semiconductor device of one embodiment of the present invention.

FIG. 12 is a plan view of the layer 140 and shows an example in which 4×4 memory cells 10 are provided between a pair of insulators 138. Moreover, the circuit of the selection transistor array illustrated in FIG. 5 is superimposed, and FIG. 12 shows connection between each memory cell 10 and the wirings RBL[1] to RBL[4], the wirings WBL[1] to WBL[4], the wirings SG1[1] to SG1[4], the wirings SG2[1] to SG2[4], and the selection transistor cells 60. Note that in the memory cell array illustrated in FIG. 12, the connection relation is the same as that in the memory cell array illustrated in FIG. 11 despite different numbers of memory cells 10, selection transistor cells 60, wirings RBL, wirings WBL, wirings SG1, and wirings SG2; therefore, FIG. 11 can be referred to. In addition, although FIG. 12 illustrates the example in which 4×4 memory cells 10 are provided between the pair of insulators 138, the semiconductor device described in this embodiment is not limited thereto, and the number, arrangement, and the like of the memory cells, the wirings, and the like can be set as appropriate in accordance with the circuit configuration and the driving method of the memory cell array.

Accordingly, also in the memory cell array illustrated in FIG. 12, by providing the wiring RBL and the wiring WBL perpendicularly to the wiring SG1 and the wiring SG2, the y-coordinate of a target memory cell 10 can be selected with the wiring RBL and the wiring WBL, and the x-coordinate of the target memory cell 10 can be selected with the wiring SG1 and the wiring SG2. In this manner, even when the memory cells 10 are arranged as in FIG. 12, writing and reading can performed on a given memory cell among the 4×4 memory cells 10.

Note that in the memory cell array illustrated in FIG. 12, the memory cells 10 are arranged to be staggered, that is, to differ in position between columns in the x-axis direction, when seen from the y-axis direction. Consequently, the memory cells 10 can be arranged densely. Thus, the area occupied by the memory cell array can be reduced, and the integration degree of the semiconductor device can be increased.

The memory cell arrays illustrated in FIG. 11 and FIG. 12 include many memory cells 10 in which the distance between the conductor 120 and the insulator 138 is sufficiently large; hence, the shape of the top surface of the oxide 106 included in these memory cells is substantially circular in many cases. Note that as illustrated in FIG. 12, the integration degree of the memory cell array may be increased by reducing the distance between the conductor 120 and the insulator 138 in the memory cells 10 that are close to the insulator 138 (e.g., the memory cells 10 connected to the wiring SG1[4] and the wiring SG2[4] in FIG. 12) among the arranged memory cells so that the oxide 106 is in contact with the insulator 138.

<Constituent Materials for Semiconductor Device>

Constituent materials that can be used for the semiconductor device described in this embodiment will be described below.

<<Insulator>>

Examples of an insulator include an oxide, a nitride, an oxynitride, a nitride oxide, a metal oxide, a metal oxynitride, and a metal nitride oxide that have an insulating property. The insulator described in this embodiment can be selected from the following insulators in accordance with its function and formed as a single layer or a stacked layer.

As miniaturization and high integration of transistors progress, for example, a problem of leakage current or the like may arise because of a thinner gate insulator. When a high-k material is used for an insulator functioning as a gate insulator, the voltage at the time when the transistor operates can be reduced while the physical thickness is maintained. By contrast, when a material having a low relative permittivity is used for an insulator functioning as an interlayer film, parasitic capacitance generated between wirings can be reduced. Thus, a material is preferably selected depending on the function of an insulator.

Examples of an insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. For example, such an insulator may be used as the insulator 116.

Examples of an insulator having low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure that is thermally stable and has a low relative permittivity can be obtained by combining silicon oxide or silicon oxynitride with a resin, for example. Examples of the resin include polyester, polyolefin, polyamide (e.g., nylon and aramid), polyimide, polycarbonate, and acrylic. Moreover, a stacked-layer structure that is thermally stable and has a high relative permittivity can be obtained by combining silicon oxide or silicon oxynitride with an insulator having a high relative permittivity.

When the transistor using an oxide semiconductor is surrounded by an insulator that has a function of suppressing the passage of oxygen and impurities such as hydrogen, the electrical characteristics of the transistor can be stable.

As an insulator that has a function of suppressing the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of suppressing the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more kinds selected from hafnium, aluminum, gallium, yttrium, zirconium, tungsten, titanium, tantalum, nickel, germanium, magnesium, and the like can be used as the insulator 132.

In particular, aluminum oxide has a high barrier property, and even a thin film ranging from 0.5 nm to 3.0 nm can inhibit diffusion of hydrogen and nitrogen. Although hafnium oxide has a lower barrier property than aluminum oxide, the barrier property can be increased by increasing the thickness of hafnium oxide. Therefore, the amount of added hydrogen and nitrogen can be adjusted appropriately by adjusting the thickness of hafnium oxide.

For example, the insulator 112 and the insulator 132 that function as part of the gate insulator are each preferably an insulator including an excess oxygen region. For example, employing a structure in which silicon oxide or silicon oxynitride including an excess oxygen region is in contact with the oxide 106 or the oxide 134 can compensate for oxygen vacancies included in the oxide 106 or the oxide 134.

For the insulator 112, silicon oxide or silicon oxynitride, which is thermally stable, is preferably used, for example. When the gate insulator has a stacked-layer structure of a thermally stable film and a film with a high relative permittivity, the equivalent oxide thickness (EOT) of the gate insulator can be reduced while the physical thickness thereof is kept.

Furthermore, the insulator 112 may have a stacked-layer structure. In the insulator 112 functioning as the gate insulator, an oxide of one or more of aluminum, hafnium, and gallium may be stacked in addition to the above-described insulator. Specifically, it is preferable to use aluminum oxide, hafnium oxide, an oxide containing aluminum and hafnium (hafnium aluminate), or the like as an insulator containing an oxide of one or both of aluminum and hafnium.

With the above stacked-layer structure, the on-state current can be increased without a reduction in the influence of the electric field from the gate electrode. Since the distance between the gate electrode and the region where the channel is formed is kept by the physical thickness of the gate insulator, leakage current between the gate electrode and the channel formation region can be inhibited.

The insulator 118 and the insulator 138 preferably include an insulator with a low relative permittivity. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

The insulator 130 needs to serve as a sacrificial layer at the time of forming the oxide 106; therefore, the insulator 130 is selected so that the etching rates of the insulator 118, the insulator 116, the insulator 112, and the like are much lower than the etching rate of the insulator 130 in a below-mentioned step of etching the insulator 130. For example, the insulator 130 can be silicon nitride when the insulator 118, the insulator 116, the insulator 112, and the like are silicon oxide or silicon oxynitride.

Alternatively, as the insulator 132, an insulator having a function of inhibiting the passage of oxygen and impurities such as hydrogen may be used. As the insulator 132, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

As the insulator 126 and the insulator 127, an insulator obtained by thermal oxidation of the conductor 114 is preferably used. As the insulator 128 and the insulator 129, an insulator obtained by thermal oxidation of the conductor 122 is preferably used.

<<Conductor>>

As a conductor, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon including an impurity element such as phosphorus, or silicide such as nickel silicide may be used.

Moreover, a stack including a plurality of conductive layers formed with the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

When an oxide is used for the channel formation region of the transistor, a stacked-layer structure combining a material containing the above metal element and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which a channel is formed. Furthermore, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which a channel is formed can be captured in some cases. Alternatively, hydrogen entering from an external insulator or the like can be captured in some cases.

As the conductor 120, the conductor 122, and the conductor 114, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon including an impurity element such as phosphorus, or silicide such as nickel silicide may be used.

Note that for the conductor 114 and the conductor 122, different conductive materials are preferably used. When different conductive materials are used for the conductor 114 and the conductor 122, their oxidation rates or etching rates are different from each other, whereby the positions of side surfaces of the conductor 114 and the conductor 122 can be made different from each other.

<<Metal Oxide>>

A metal oxide that can be used for the oxide 106 and the oxide 134 of the present invention will be described below.

The metal oxide preferably contains at least indium or zinc. In particular, indium and zinc are preferably contained. Aluminum, gallium, yttrium, tin, or the like is preferably contained in addition to them. One kind or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is In-M-Zn oxide, which contains indium, an element M, and zinc, is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements can be combined as the element M in some cases.

Note that in this specification and the like, a metal oxide containing nitrogen is also collectively referred to as a metal oxide in some cases. A metal oxide containing nitrogen may also be referred to as a metal oxynitride.

[Composition of Metal Oxide]

The composition of a CAC (Cloud-Aligned Composite)-OS that can be used for the transistor disclosed in one embodiment of the present invention will be described below.

In this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material, and has a function of a semiconductor as the whole material. Note that in the case where the CAC-OS or the CAC-metal oxide is used in an active layer of a transistor, the conducting function is a function that allows electrons serving as carriers (or holes) to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, when the above CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, formation of a grain boundary is inhibited by the distortion of a lattice arrangement. This is because the CAAC-OS can tolerate distortion owing to a low density of arrangement of oxygen atoms in the a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Consequently, a metal oxide including the CAAC-OS is physically stable. Therefore, the metal oxide including the CAAC-OS is resistant to heat and has high reliability.

In the nc-OS, a microscopic region (e.g., a region ranging from 1 nm to 10 nm, in particular, a region ranging from 1 nm to 3 nm) has a periodic atomic arrangement. Furthermore, there is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (a metal oxide) has various structures with different properties. The oxide semiconductor of one embodiment of the present invention may include two or more of an amorphous oxide semiconductor, a polycrystalline oxide semiconductor, an a-like OS, a nc-OS, and a CAAC-OS.

[Transistor Including Metal Oxide]

Next, the case where the above metal oxide is used for a channel formation region of a transistor will be described.

When the metal oxide is used for a channel formation region of a transistor, a transistor with high field-effect mobility can be achieved. In addition, a transistor with high reliability can be achieved.

Here, an example of the hypothesis about electric conduction of a metal oxide is described.

Electric conduction in a solid is impeded by a scattering source which is called a scattering center. For example, lattice scattering and ionized impurity scattering are known as main scattering centers in single crystal silicon. In other words, in a native state with few lattice defects and impurities, there is no impeding factor for electrical conduction in a solid and the carrier mobility is high.

The above is assumed to apply to a metal oxide. For example, it can be considered that a metal oxide containing less oxygen than that in the stoichiometric composition includes many oxygen vacancies $V_O$. The atoms around the oxygen vacancies are arranged more randomly than in the native state. It is possible that the distortion due to the oxygen vacancies might become a scattering center.

Furthermore, for example, a metal compound containing more oxygen than that in the stoichiometric composition includes excess oxygen. Excess oxygen that is liberated in the metal compound becomes $O^-$ or $O2^-$ by receiving an electron. Excess oxygen that has become $O^-$ or $O2^-$ might be a scattering center.

From the above, the carrier mobility is likely to be high in a metal oxide having a native state where it contains oxygen that satisfies the stoichiometric composition.

Crystal growth of an indium-gallium-zinc oxide (hereinafter IGZO), which is one of metal oxides containing indium, gallium, and zinc, tends to be difficult particularly in the air; hence, a structure sometimes becomes more stable with a small crystal (e.g., the above-described nanocrystal) than with a large crystal (here, a crystal of several millimeters or a crystal of several centimeters). This is probably because distortion energy is relaxed more when small crystals are connected to each other than when a large crystal is formed.

In a region where small crystals are connected to each other, defects may be formed to relax the distortion energy of the region. Thus, by relaxing the distortion energy without formation of a defect in the region, the carrier mobility can be increased.

A metal oxide with a low carrier density is preferably used for a transistor. To reduce the carrier density of a metal oxide film, the impurity concentration in the metal oxide film is reduced to decrease the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, further preferably lower than $1 \times 10^{10}/cm^3$ and higher than or equal to $1 \times 10^{-9}/cm^3$.

A highly purified intrinsic or substantially highly purified intrinsic metal oxide film has a low density of defect states and accordingly may have a low density of trap states.

Charge trapped by the trap states in a metal oxide takes a long time to be released and may behave like fixed charge. Thus, a transistor having a metal oxide with a high density of trap states in a channel formation region has unstable electrical characteristics in some cases.

Consequently, a reduction in the impurity concentration in the metal oxide is effective in achieving stable electrical characteristics of the transistor. Moreover, in order to reduce the impurity concentration in the metal oxide, the impurity concentration in an adjacent film is also preferably reduced. As an impurity, hydrogen, nitrogen, an alkali metal, an alkaline earth metal, iron, nickel, and silicon can be given.

[Impurities]

Here, the influence of each impurity in the metal oxide will be described.

When silicon or carbon, which is one of the Group 14 elements, is contained in the metal oxide, defect states are formed in the metal oxide. For that reason, the concentration of silicon or carbon in the metal oxide and the concentration of silicon or carbon near an interface of the metal oxide (the concentrations measured by secondary ion mass spectrometry (SIMS)) are set lower than or equal to $2 \times 10^{18}$ atoms/$cm^3$, preferably lower than or equal to $2 \times 10^{17}$ atoms/$cm^3$.

When the metal oxide contains an alkali metal or an alkaline earth metal, defect states are formed and carriers are generated in some cases. Thus, a transistor in which a metal oxide containing an alkali metal or alkaline earth metal is used in a channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide measured by SIMS is set lower than or equal to $1\times10^{18}$ atoms/cm$^3$, preferably lower than or equal to $2\times10^{16}$ atoms/cm$^3$.

When the metal oxide contains nitrogen, the metal oxide easily becomes n-type because of generation of electrons serving as carriers and an increase in carrier density. As a result, a transistor in which a metal oxide containing nitrogen is used in a channel formation region is likely to have normally-on characteristics. Thus, in the metal oxide, nitrogen in the channel formation region is preferably reduced as much as possible. For example, the concentration of nitrogen in the metal oxide measured by SIMS is set lower than $5\times10^{19}$ atoms/cm$^3$, preferably lower than or equal to $5\times10^{18}$ atoms/cm$^3$, further preferably lower than or equal to $1\times10^{18}$ atom/cm$^3$, still further preferably lower than or equal to $5\times10^{17}$ atoms/cm$^3$.

In some cases, hydrogen contained in a metal oxide reacts with oxygen bonded to a metal atom to be water, and thus forms an oxygen vacancy. Entry of hydrogen into the oxygen vacancy generates an electron serving as a carrier in some cases. Furthermore, in some cases, part of hydrogen is bonded to oxygen bonded to a metal atom, whereby an electron serving as a carrier is generated. Thus, a transistor using a metal oxide containing hydrogen is likely to have normally-on characteristics. Therefore, hydrogen in the metal oxide is preferably reduced as much as possible. Specifically, the hydrogen concentration of the metal oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which impurities are sufficiently reduced is used in a channel formation region of a transistor, the off-state current of the transistor can be reduced and stable electrical characteristics can be provided.

<Structure of Selection Transistor Array>

Next, structure examples of transistors included in the selection transistor array shown in the above embodiment will be described with reference to FIG. 13.

Figure 13A:
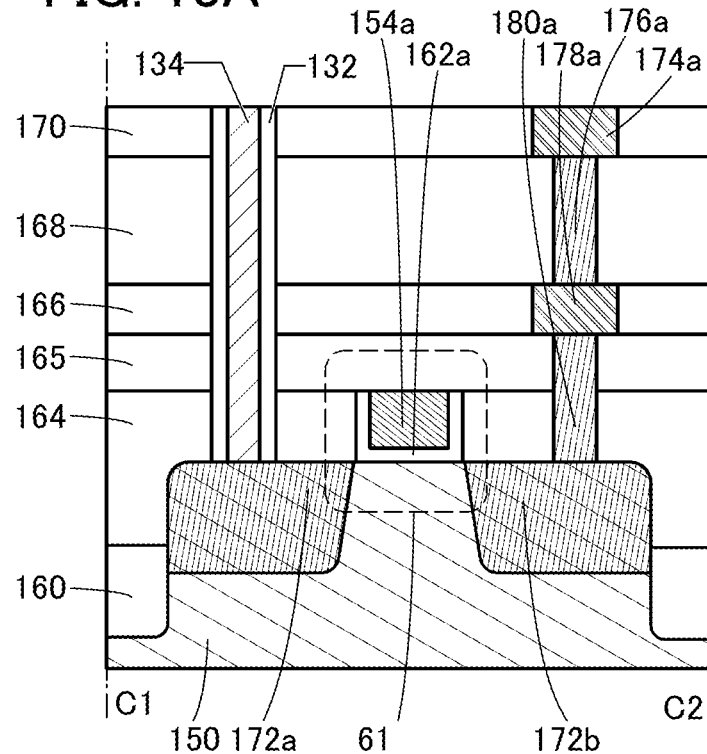
FIGS. 13A-13D are cross-sectional views illustrating a semiconductor device of one embodiment of the present invention.
Figure 13B:
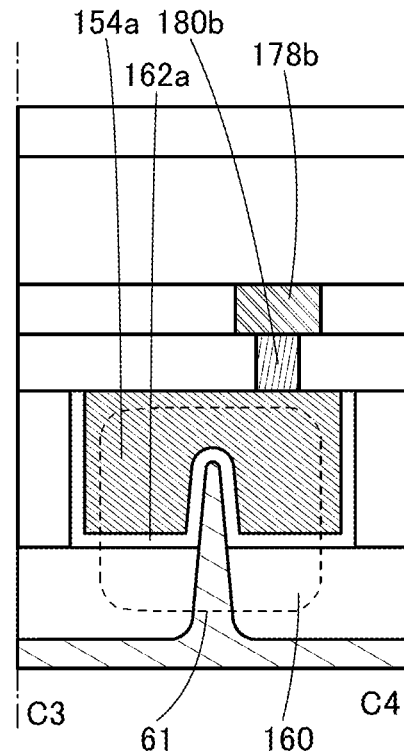

FIGS. 13(A) and 13(B) are cross-sectional views of the transistor 61 provided in the selection transistor array 50 illustrated in FIG. 5. The cross section C1-C2 shown in FIG. 13(A) represents a cross-sectional view of the transistor 61 in the channel length direction, and the cross section C3-C4 shown in FIG. 13(B) represents a cross section of the transistor 61 in the channel width direction.

The transistor 61 illustrated in FIGS. 13(A) and 13(B) is a transistor using a semiconductor substrate 150. The transistor 61 includes a region 172a in the semiconductor substrate 150, a region 172b in the semiconductor substrate 150, an insulator 162a, and a conductor 154a. Although not illustrated, a sidewall insulator may be provided in contact with a side surface of the conductor 154a. When the sidewall insulator is provided in contact with the side surface of the conductor 154a, in the region 172a and the region 172b, a region having a lower impurity concentration than a region that is not overlapped by the sidewall insulator is sometimes formed in a region overlapped by the sidewall insulator.

In the transistor 61, the region 172a and the region 172b have a function of a source region and a drain region. The insulator 162a has a function of a gate insulator. The conductor 154a has a function of a gate electrode. Thus, the resistance of a channel formation region can be controlled by a potential applied to the conductor 154a. In other words, conduction and non-conduction between the region 172a and the region 172b can be controlled by a potential applied to the conductor 154a.

In the semiconductor device illustrated in FIGS. 13(A) and 13(B), the transistor 61 is configured as a Fin-type transistor. By making the transistor 61 a Fin-type, the effective channel width increases. Thus, the on-state characteristics of the transistor 61 can be improved. In addition, contribution of the electric field of the gate electrode can be increased, so that the off-state characteristics of the transistor 61 can be improved.

For the semiconductor substrate 150, a semiconductor substrate of silicon, germanium, or the like or a semiconductor substrate of silicon carbide, silicon germanium, gallium arsenide, indium phosphide, zinc oxide, gallium oxide, or the like can be used, for example. A single crystal silicon substrate is preferably used as the semiconductor substrate 150.

As the semiconductor substrate 150, a semiconductor substrate including impurities imparting p-type conductivity is used. However, a semiconductor substrate including impurities imparting n-type conductivity may be used as the semiconductor substrate 150. In that case, a well including impurities imparting p-type conductivity is provided in a region to be the transistor 61. Alternatively, the semiconductor substrate 150 may be of i-type.

Note that the substrate used in the semiconductor device described in this embodiment is not limited to a semiconductor substrate. For example, in the case where an active layer of the transistor 61 or the like is formed by deposition or the like, an insulator substrate, a conductor substrate, or the like can alternatively be used. Examples of the insulator substrate include a glass substrate, a quartz substrate, a sapphire substrate, a stabilized zirconia substrate (e.g., an yttria-stabilized zirconia substrate), and a resin substrate. In addition, a semiconductor substrate in which an insulator region is included in the above semiconductor substrate, for example, an SOI (Silicon On Insulator) substrate may be used. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided over the substrate include a capacitor, a resistor, a switching element, a light-emitting element, and a memory element. Note that the substrate may also be referred to as a base.

Alternatively, a flexible substrate resistant to heat treatment performed in manufacture of the transistor may be used as the substrate. Note that as a method for providing a transistor over a flexible substrate, there is also a method in which the transistor is manufactured over a non-flexible substrate and then the transistor is separated and transferred to a flexible substrate. In that case, a separation layer is preferably provided between the non-flexible substrate and the transistor. Note that as the substrate, a sheet in which a fiber is woven, a film, a foil, or the like may be used. The substrate may have elasticity. The substrate may have a property of returning to its original shape when bending or pulling is stopped. Alternatively, the substrate may have a property of not returning to its original shape. The thickness of the substrate is, for example, greater than or equal to 5 μm and less than or equal to 700 μm, preferably greater than or equal to 10 μm and less than or equal to 500 μm, further preferably greater than or equal to 15 μm and less than or equal to 300 μm. By thinning the substrate, the weight of a semiconductor device can be reduced. Moreover, by thinning the substrate, even in the case of using glass or the like, the substrate may have elasticity or a property of returning to its original shape when bending or pulling is stopped. Thus, an impact applied to a semiconductor device over the substrate due to dropping or the like can be reduced. That is, a durable semiconductor device can be provided.

The region 172a and the region 172b include impurities imparting n-type conductivity. Accordingly, the transistor 61 is configured as an n-channel transistor.

Note that the transistor 61 is separated from an adjacent transistor by a region 160 and the like. The region 160 is an insulating region.

The semiconductor device illustrated in FIGS. 13(A) and 13(B) includes the insulator 132, the oxide 134, an insulator 164, an insulator 165, an insulator 166, an insulator 168, an insulator 170, a conductor 180a, a conductor 180b, a conductor 178a, a conductor 178b, a conductor 176a, and a conductor 174a. Here, the insulator 132 and the oxide 134 are the ones formed in the three-dimensional memory cell array 40 described above.

The insulator 164 is formed so that the transistor 61 is embedded therein. The insulator 165 is formed over the insulator 164. The insulator 166 is formed over the insulator 165. The insulator 168 is formed over the insulator 166. The insulator 170 is formed over the insulator 168.

The insulator 164, the insulator 165, the insulator 166, the insulator 168, and the insulator 170 have a cylindrical opening reaching the region 172a, and the insulator 132 and the oxide 134 are included in the opening. The insulator 132 is formed in a cylindrical shape to be in contact with the inner wall of the opening, and the oxide 134 is formed in a cylindrical shape on the inner side of the insulator 132. The insulator 132 and the oxide 134 are formed to extend substantially perpendicularly to the top surface of the semiconductor substrate 150.

An opening is formed in at least part of the bottom surface of the insulator 132, and the oxide 134 is in contact with the region 172a through the opening. Here, the oxide 134 illustrated in FIGS. 13(A) and 13(B) corresponds to any one of the wirings RBL[1,1] to RBL[$m_1, m_2$] illustrated in FIG. 3 and the like, and the region 172a has a function of the source region or the drain region of the transistor 61. With the above structure, the wiring RBL in the bottom portion of the memory cell string can be electrically connected to the source region or the drain region of the transistor 61 in the selection transistor cell 60.

Furthermore, the insulator 164 and the insulator 165 have an opening reaching the region 172b and an opening reaching the conductor 154a. The conductor 180a and the conductor 180b are embedded in the respective openings. The insulator 166 has an opening reaching the conductor 180a and an opening reaching the conductor 180b. The conductor 178a and the conductor 178b are embedded in the respective openings. The insulator 168 has an opening reaching the conductor 178a. The conductor 176a is embedded in the opening. The insulator 170 has an opening reaching the conductor 176a. The conductor 174a is embedded in the opening.

Here, the conductor 174a is electrically connected to the region 172b functioning as the source region or the drain region of the transistor 61, and functions as any of the wirings RBL[1] to RBL[$m_2$] illustrated in FIG. 5 and the like. The conductor 178b is electrically connected to the conductor 154a functioning as the gate of the transistor 61, and functions as the wiring SG1 illustrated in FIG. 5 and the like. In data reading, any of the two-dimensional memory cell arrays 30[1] to 30[$m_1$] can be selected through the wiring SG1 and the transistor 61 formed in the above manner.

At least one of the insulator 164, the insulator 165, the insulator 166, the insulator 168, and the insulator 170 preferably includes an insulator having a function of blocking oxygen and impurities such as hydrogen. When an insulator having a function of blocking oxygen and impurities such as hydrogen is provided below the transistor 12 included in the three-dimensional memory cell array 40, the electric characteristics of the transistor 12 can be stable.

As an insulator having a function of blocking oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used.

As the conductor 180a, the conductor 180b, the conductor 178a, the conductor 178b, the conductor 176a, and the conductor 174a, a single layer or a stacked layer of a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten is used. Alternatively, an alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 13C:
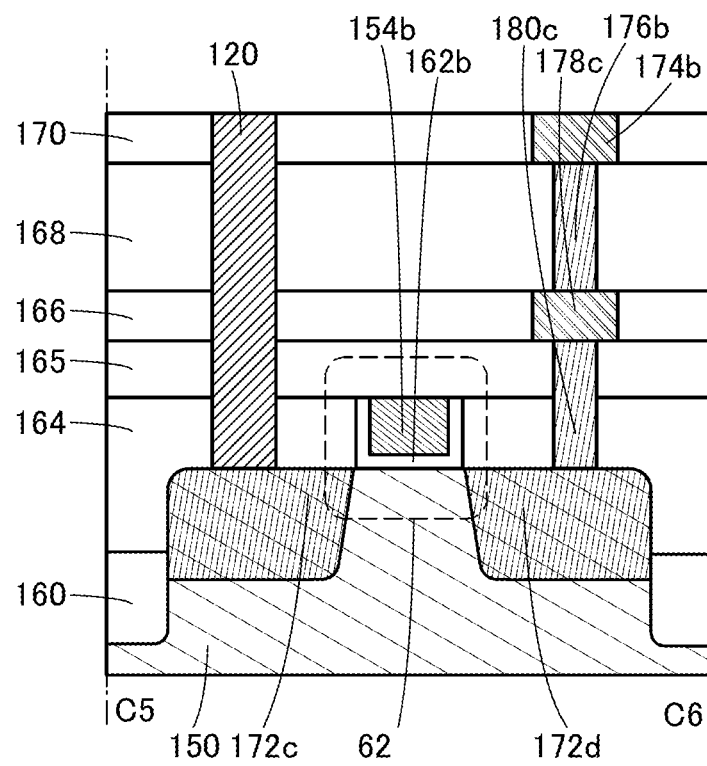
Figure 13D:
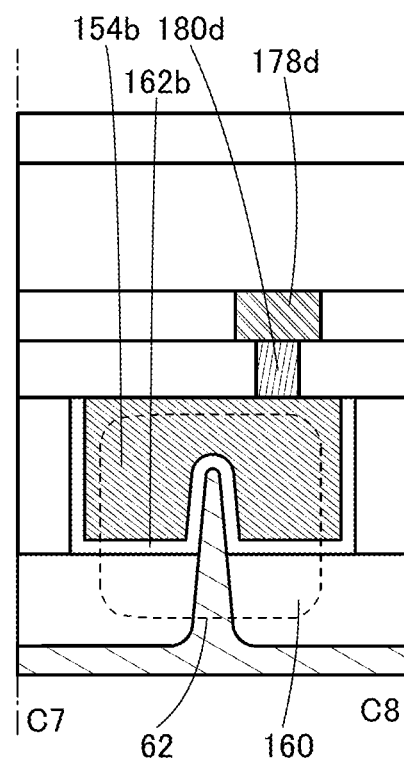

FIGS. 13(C) and 13(D) are cross-sectional views of the transistor 62 provided in the selection transistor array 50 illustrated in FIG. 5. The cross section C5-C6 shown in FIG. 13(C) represents a cross-sectional view of the transistor 62 in the channel length direction, and the cross section C7-C8 shown in FIG. 13(D) represents a cross section of the transistor 62 in the channel width direction.

The structure of the semiconductor device illustrated in FIGS. 13(C) and 13(D) is the same as the structure of the semiconductor device illustrated in FIGS. 13(A) and 13(B) except that the conductor 120 is formed instead of the insulator 132 and the oxide 134. The transistor 62 includes a region 172c in the semiconductor substrate 150, a region 172d in the semiconductor substrate 150, an insulator 162b, and a conductor 154b. The structures of the region 172a and the region 172b can be referred to for the region 172c and the region 172d, the structure of the insulator 162a can be referred to for the insulator 162b, and the structure of the conductor 154a can be referred to for the conductor 154b.

In addition, the structures of the conductor 180a, the conductor 180b, the conductor 178a, the conductor 178b, the conductor 176a, and the conductor 174a can be referred to for a conductor 180c, a conductor 180d, a conductor 178c, a conductor 178d, a conductor 176b, and a conductor 174b.

The insulator 164, the insulator 165, the insulator 166, the insulator 168, and the insulator 170 have a cylindrical opening reaching the region 172c, and the conductor 120 is included in the opening. The conductor 120 is formed in a cylindrical shape to be in contact with the inner wall of the opening. The conductor 120 is formed to extend substantially perpendicularly to the top surface of the semiconductor substrate 150. Here, the conductor 120 illustrated in FIGS. 13(C) and 13(D) corresponds to any one of the wirings WBL[1,1] to WBL[$m_1$,$m_2$] illustrated in FIG. 3 and the like, and the region 172c has a function of a source region or a drain region of the transistor 62. With the above structure, the wiring WBL electrically connected to the transistor 12 in the memory cell 10 can be electrically connected to the source region or the drain region of the transistor 62 in the selection transistor cell 60.

The conductor 174b is electrically connected to the region 172d functioning as the source region or the drain region of the transistor 62, and functions as any of the wirings WBL[1] to WBL[$m_2$] illustrated in FIG. 5 and the like. The conductor 178d is electrically connected to the conductor 154b functioning as the gate of the transistor 62, and functions as the wiring SG2 illustrated in FIG. 5 and the like. In data writing, any of the two-dimensional memory cell arrays 30[1] to 30[$m_1$] can be selected through the wiring SG2 and the transistor 62 formed in the above manner.

<Method for Manufacturing Memory Cell Array>

Next, a method for manufacturing the above-described semiconductor device will be described with reference to FIG. 14 to FIG. 26. FIG. 14 to FIG. 26 are diagrams illustrating a process of manufacturing the memory cell 10, which is part of the three-dimensional memory cell array 40 in the above semiconductor device. FIG. 14(A) to FIG. 26(A) are plan views of the layer 140 in the memory cell 10. FIG. 14(B) to FIG. 26(B) are cross-sectional views of the memory cell 10 and correspond to the dashed-dotted line A1-A2 illustrated in FIG. 14(A) to FIG. 26(A). FIG. 14(A) to FIG. 26(A) correspond to the plan view shown in FIG. 8(B), and FIG. 14(B) to FIG. 26(B) correspond to the cross-sectional view shown in FIG. 8(A).

In the manufacturing method described below, a deposition step can be performed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Furthermore, CVD methods can be classified into a metal CVD (MCVD) method and a metal organic CVD (MOCVD) method according to the source gas to be used.

By a plasma CVD method, a high-quality film can be obtained at a relatively low temperature. A thermal CVD method is a deposition method that does not use plasma and thus enables less plasma damage to an object. For example, a wiring, an electrode, an element (e.g., a transistor or a capacitor), or the like included in a semiconductor device might be charged up by receiving charge from plasma. In that case, accumulated charge might break the wiring, the electrode, the element, or the like included in the semiconductor device. By contrast, such plasma damage is not caused in the case of using a thermal CVD method, which does not use plasma; thus, the yield of a semiconductor device can be increased. In addition, a thermal CVD method does not cause plasma damage during deposition, so that a film with few defects can be obtained.

An ALD method is also a deposition method that enables less plasma damage to an object. Thus, a film with few defects can be obtained. Note that a precursor used in an ALD method sometimes contains impurities such as carbon. Accordingly, a film provided by an ALD method sometimes contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and have favorable step coverage. In particular, an ALD method has excellent step coverage and excellent thickness uniformity, and thus is suitable for the case of covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enables control of the composition of a film to be obtained with the flow rate ratio of the source gases. For example, a CVD method and an ALD method enable formation of a film with any composition depending on the flow rate ratio of the source gases. For another example, a CVD method and an ALD method enable formation of a film whose composition is continuously changed, by changing the flow rate ratio of the source gases during the deposition. In the case of depositing a film while the flow rate ratio of the source gases is changed, as compared with the case of depositing a film with the use of a plurality of deposition chambers, the time taken for the deposition can be shortened because the time taken for transfer and pressure adjustment is not required. Thus, the productivity of semiconductor devices can be improved in some cases.

The processing of the deposited conductors, insulators, and semiconductors are performed by a lithography method. The processing can be performed by a dry etching method or a wet etching method. The processing by a dry etching method is suitable for microfabrication.

In the lithography method, first, a resist is exposed to light through a mask. Next, a region exposed to light is removed or left using a developing solution, so that a resist mask is formed. Then, etching treatment through the resist mask is performed, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. Furthermore, an electron beam or an ion beam may be used instead of the above-described light. Note that the above mask for the exposure of the resist to light is unnecessary in the case of using an electron beam or an ion beam, because direct writing is performed on the resist. The resist mask can be removed, for example, by performing dry etching treatment such as ashing, performing wet etching treatment, performing wet etching treatment after dry etching treatment, or performing dry etching treatment after wet etching treatment.

Alternatively, a hard mask formed of an insulator or a conductor may be used instead of the resist mask. When a hard mask is used, a hard mask with a desired shape can be formed in the following manner: an insulating film or a conductive film serving as a hard mask material is formed over a constituent material of an etching target, a resist mask is formed thereover, and the hard mask material is etched. The etching of the constituent material may be performed after the resist mask is removed or while the resist mask is left. In the latter case, the resist mask sometimes disappears during the etching. The hard mask may be removed by etching after the etching of the constituent material. Meanwhile, it is not always necessary to remove the hard mask when the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which a high-frequency power with the same frequency is applied to each of the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Figure 14A:
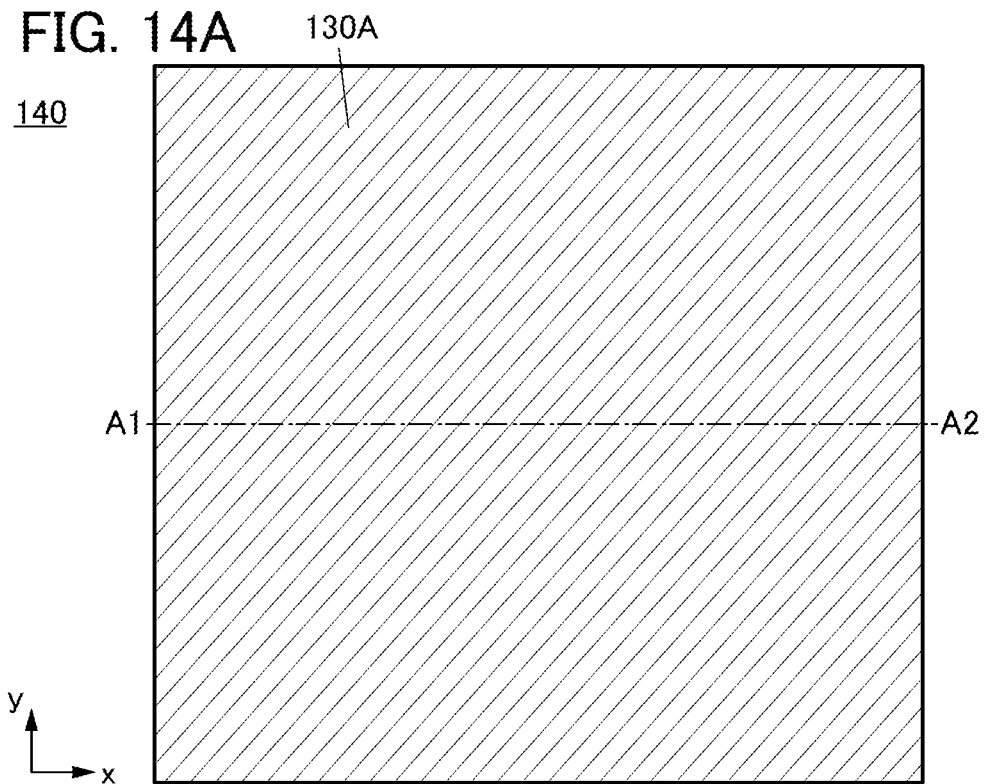
FIGS. 14A and 14B are a plan view and a cross-sectional view illustrating a method for manufacturing a semiconductor device of one embodiment of the present invention.
Figure 14B:
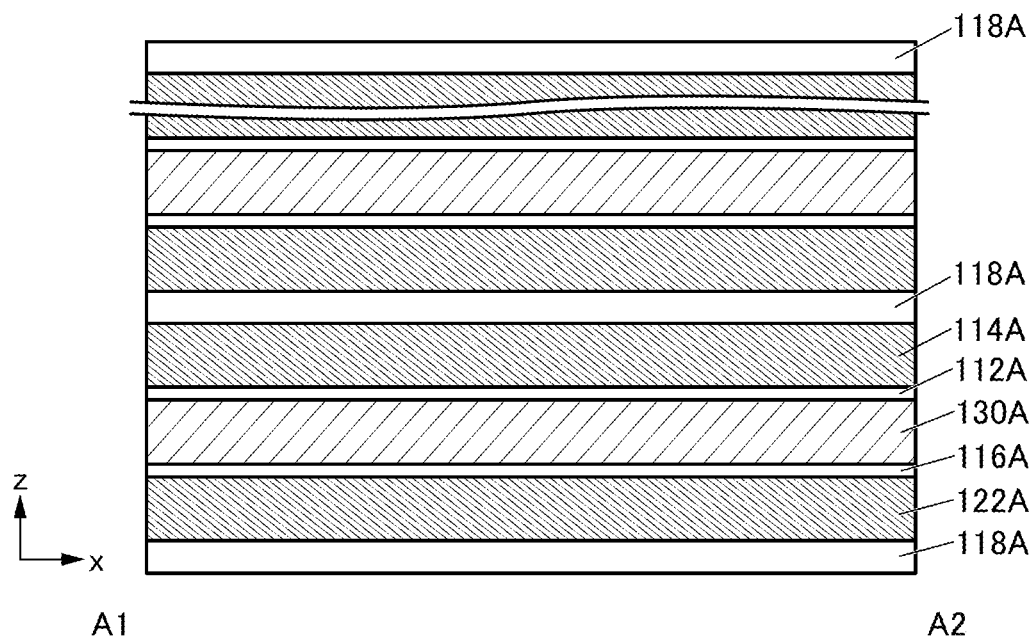
Figure 15A:
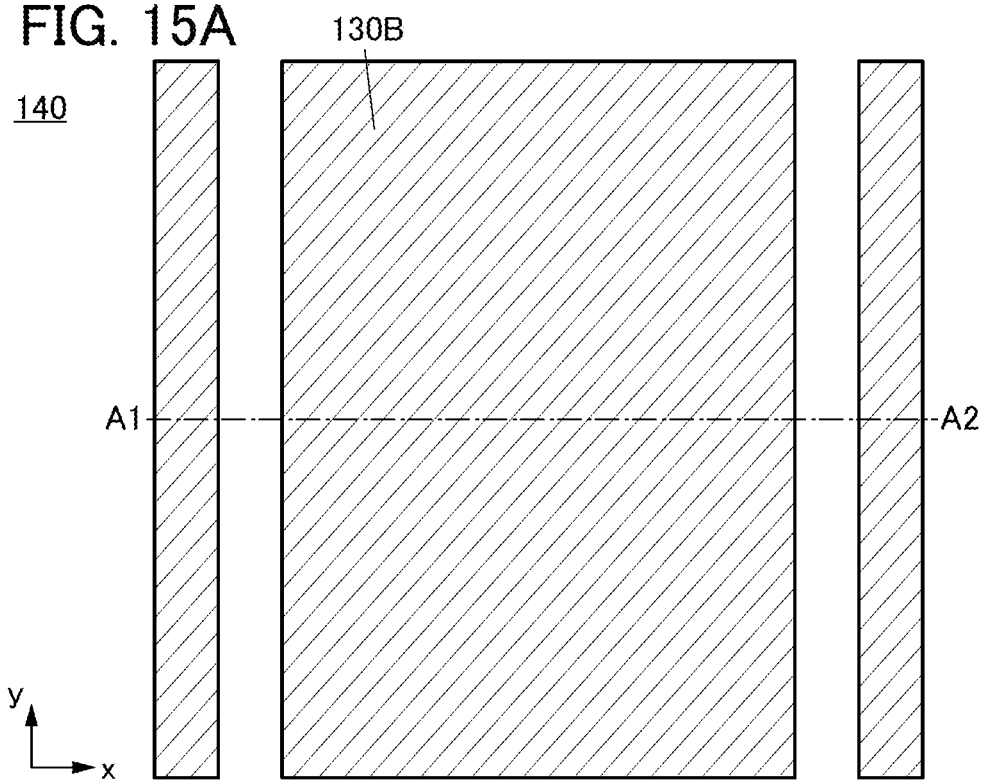
FIGS. 15A and 15B are a plan view and a cross-sectional view illustrating a method for manufacturing a semiconductor device of one embodiment of the present invention.
Figure 15B:
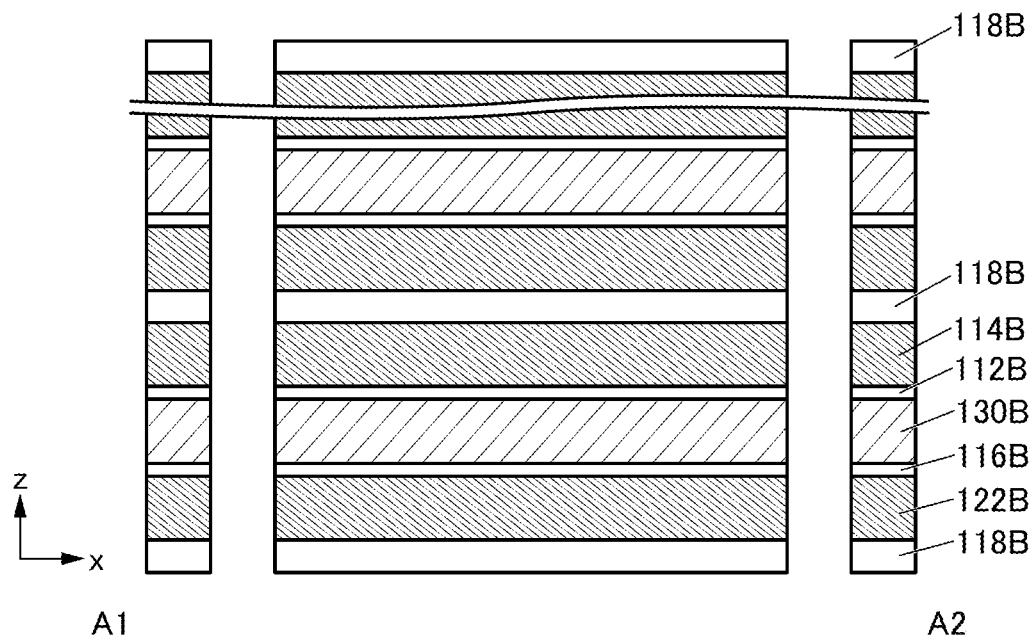

First, over a substrate where a selection transistor such as one illustrated in FIG. 13 is formed, an insulator 118A, a conductor 122A, an insulator 116A, an insulator 130A, an insulator 112A, and a conductor 114A are formed and stacked in this order (see FIGS. 14(A) and 14(B)). Furthermore, this stack is formed repeatedly in accordance with the number of layers of the memory cell array. Here, the insulator 118A is an insulating film to be the insulator 118 in a later step. The conductor 122A is a conductive film to be the conductor 122 in a later step. The insulator 116A is an insulating film to be the insulator 116 in a later step. The insulator 130A is an insulating film to be the insulator 130 in a later step. The insulator 112A is an insulating film to be the insulator 112 in a later step. The conductor 114A is a conductive film to be the conductor 114 in a later step. Therefore, the above description can be referred to for an insulating material and a conductive material used for these insulators and conductors. These insulating films and conductive films can be formed by a sputtering method, a CVD method, an MBE method, a PLD method, an ALD method, or the like.

Although the uppermost layer in FIG. 14(B) is the insulator 118 as the uppermost layer of the three-dimensional memory cell array for convenience, the structure is not limited thereto. As the uppermost layer of the three-dimensional memory cell array, an insulating film, a conductive film, a semiconductor film, or the like may be provided as appropriate depending on the circuit configuration and the like.

The insulator 130A needs to perform selective etching on the insulator 118A, the insulator 116A, and the insulator 112A in a step described later. Therefore, in the etching treatment, it is preferred that the etching rate of the insulator 130A be significantly higher than the etching rates of the insulator 118A, the insulator 116A, and the insulator 112A. Given that the etching rates of the insulator 118A, the insulator 116A, and the insulator 112A are 1, the etching rate of the insulator 130A is preferably 5 or more, further preferably 10 or more. Thus, the insulating materials used for the insulator 130A, the insulator 118A, the insulator 116A, and the insulator 112A are preferably selected as appropriate in accordance with the etching conditions or the like so that the above etching rates can be satisfied.

Here, end portions of the conductor 122A and the conductor 114A extending in the y-axis direction are preferably processed into a step-like shape. The step-like portions of the conductor 122 and the conductor 114 become contact portions with a wiring connected to a driver circuit. Thus, the conductor 122 and the conductor 114 can easily contact a plug connected to the wiring.

Next, with the use of a mask, a stack including the insulator 118A, the conductor 122A, the insulator 116A, the insulator 130A, the insulator 112A, and the conductor 114A is cut and processed to form a stack including an insulator 118B, a conductor 122B, an insulator 116B, an insulator 130B, an insulator 112B, and a conductor 114B (see FIGS. and 15(B)). The stack including the insulator 118B, the conductor 122B, the insulator 116B, the insulator 130B, the insulator 112B, and the conductor 114B is divided by the third openings in which the insulator 138 is embedded in a later step. The third openings are groove-shaped openings extending in the y-axis direction. Accordingly, the insulator 118B, the conductor 122B, the insulator 116B, the insulator 130B, the insulator 112B, and the conductor 114B have a plate-like shape extending in the y-axis direction. The third openings are formed, for example, by etching treatment with high anisotropy, such as dry etching treatment.

Figure 16A:
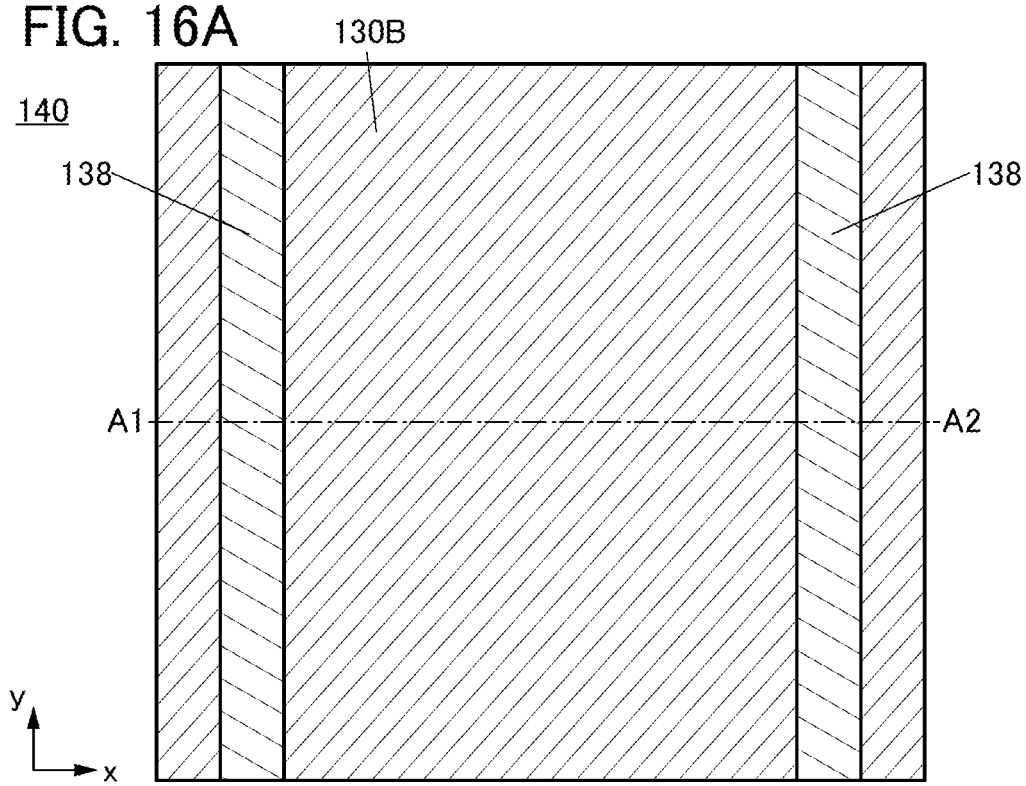
FIGS. 16A and 16B are a plan view and a cross-sectional view illustrating a method for manufacturing a semiconductor device of one embodiment of the present invention.
Figure 16B:
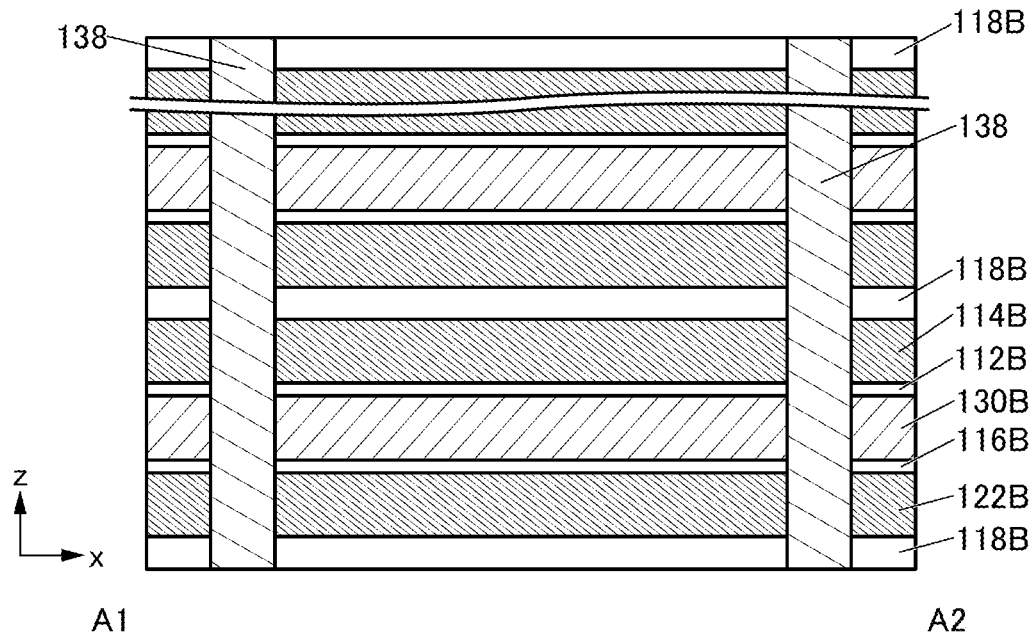

Then, the insulator 138 is formed so as to fill the third openings between the stacks including the insulator 118B, the conductor 122B, the insulator 116B, the insulator 130B, the insulator 112B, and the conductor 114B (see FIGS. 16(A) and 16(B)). The insulator 138 can be formed by a CVD method or an ALD method. It is particularly preferable to employ an ALD method, in which case a film with a uniform thickness can be formed in a groove or an opening having a large aspect ratio. Alternatively, the insulator 138 may be formed by a combination of an ALD method and a CVD method. The insulator 138 is preferably subjected to planarization treatment by a CMP method or a reflow method. When planarization treatment is performed by a CMP method, the insulator 138 may be polished until a surface of the insulator 118B is exposed. Moreover, the insulator 118B and the insulator 138 may be polished together.

Figure 17A:
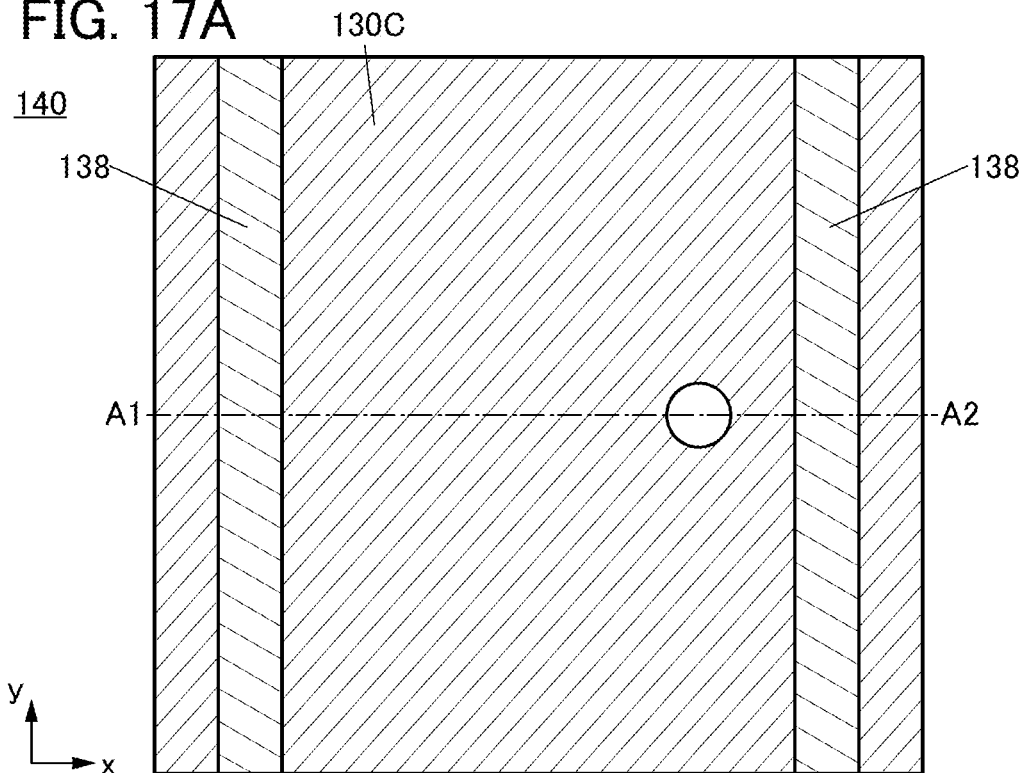
FIGS. 17A and 17B are a plan view and a cross-sectional view illustrating a method for manufacturing a semiconductor device of one embodiment of the present invention.
Figure 17B:
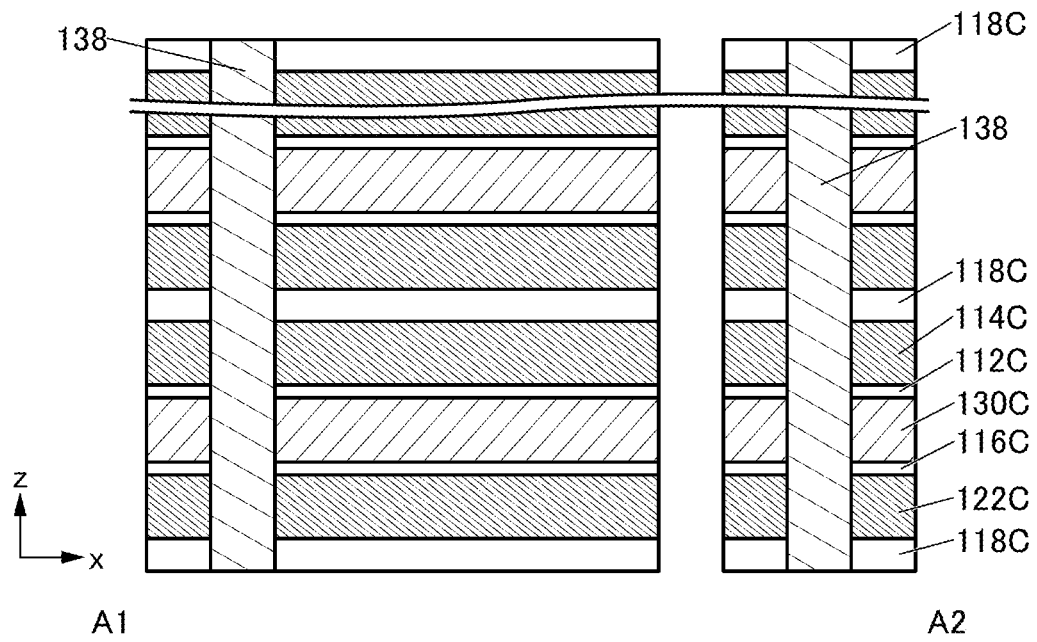

Next, with the use of a mask, a vertical-hole-shaped opening is formed in the stack including the insulator 118B, the conductor 122B, the insulator 116B, the insulator 130B, the insulator 112B, and the conductor 114B, thereby forming a stack including an insulator 118C, a conductor 122C, an insulator 116C, an insulator 130C, an insulator 112C, and a conductor 114C (see FIGS. 17(A) and 17(B)). In the stack including the insulator 118C, the conductor 122C, the insulator 116C, the insulator 130C, the insulator 112C, and the conductor 114C, the second opening in which the conductor 120 is embedded in a later step is formed. The second opening is formed, for example, by anisotropic etching treatment such as dry etching treatment.

Figure 18A:
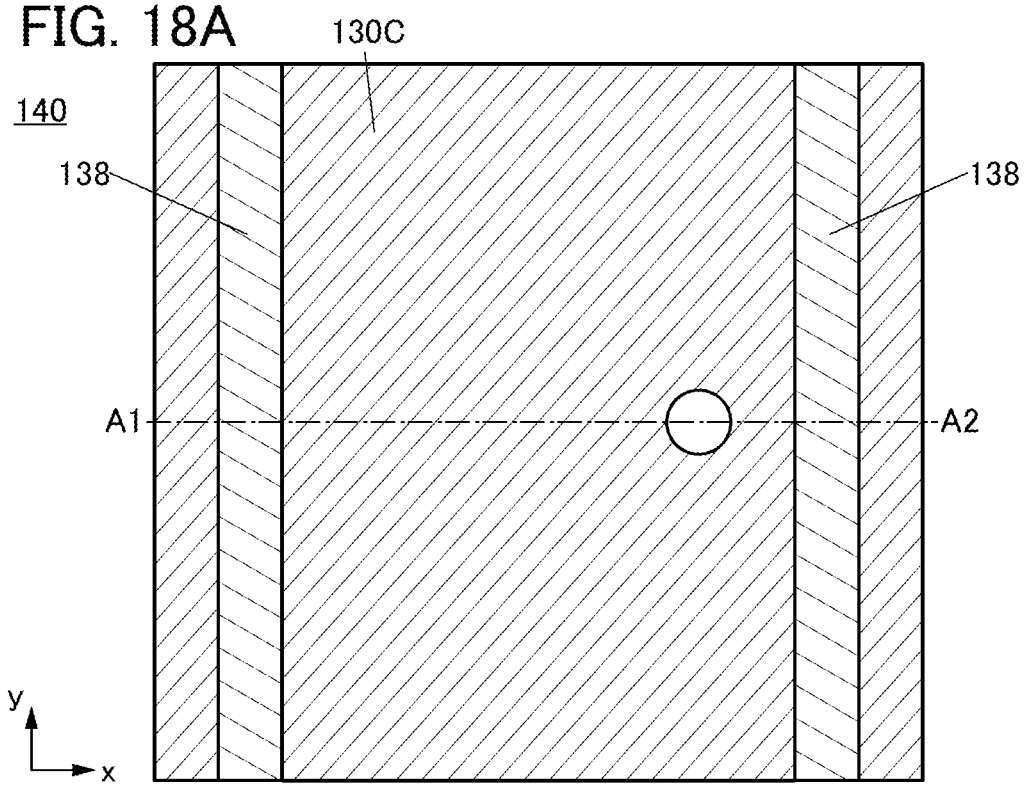
FIGS. 18A and 18B are a plan view and a cross-sectional view illustrating a method for manufacturing a semiconductor device of one embodiment of the present invention.
Figure 18B:
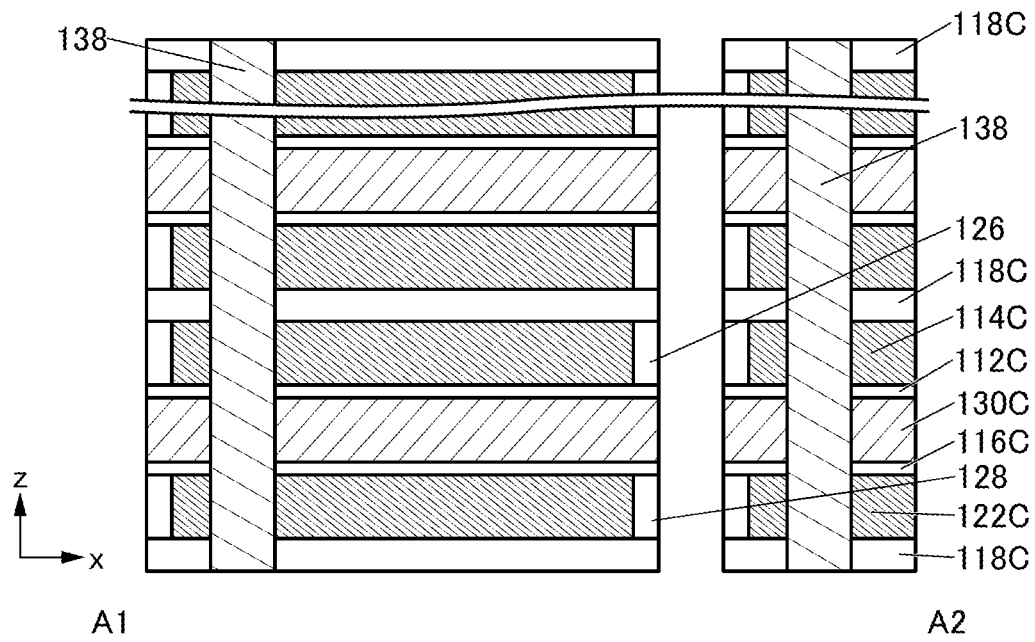

Then, surfaces of the conductor 114C and the conductor 122C that face the second opening are oxidized, whereby the insulator 126 is formed on a side surface of the conductor 114C and the insulator 128 is formed on a side surface of the conductor 122C (see FIGS. 18(A) and 18(B)). The insulator 126 and the insulator 128 are formed, for example, by performing heat treatment in an atmosphere containing oxygen. Here, by using different conductive materials for the conductor 114C and the conductor 122C, the formation speed is varied between the insulator 126 and the insulator 128, and the thickness of the insulator 126 can be larger.

Before the insulator 126 and the insulator 128 are formed, etching treatment may be performed to selectively remove the conductor 122C. By using different conductive materials for the conductor 114C and the conductor 122C, the etching rate is varied between the conductor 114C and the conductor 122C, and the side surface of the conductor 122C can be positioned closer to the A1 side than the side surface of the conductor 114C.

Figure 19A:
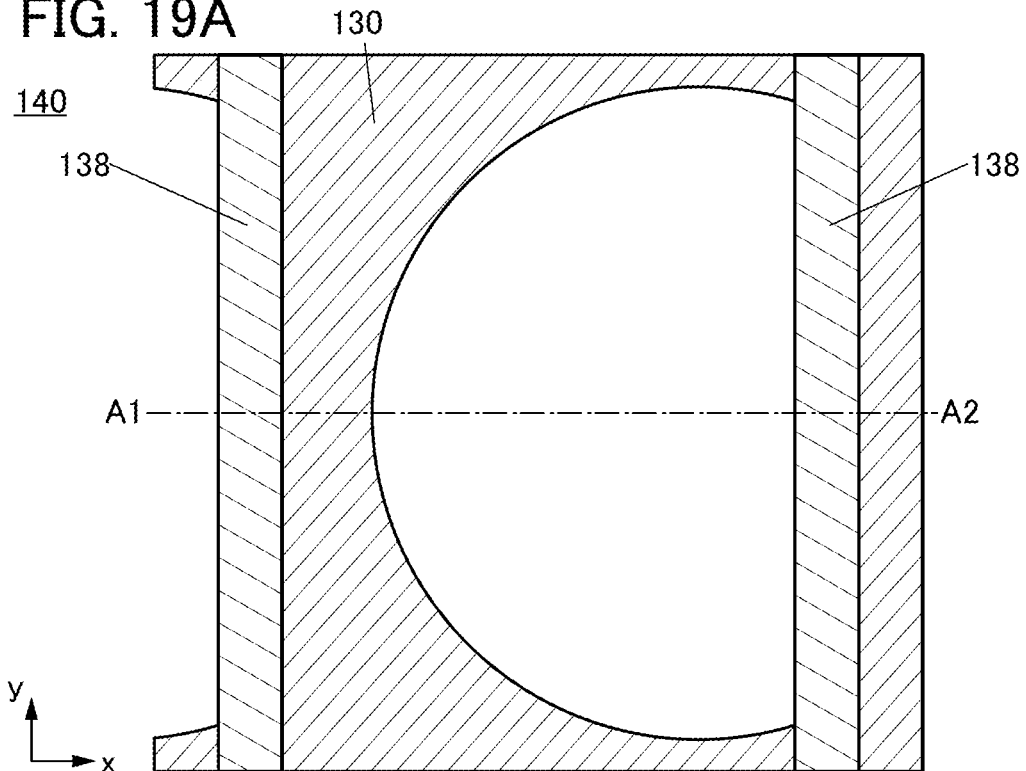
FIGS. 19A and 19B are a plan view and a cross-sectional view illustrating a method for manufacturing a semiconductor device of one embodiment of the present invention.
Figure 19B:
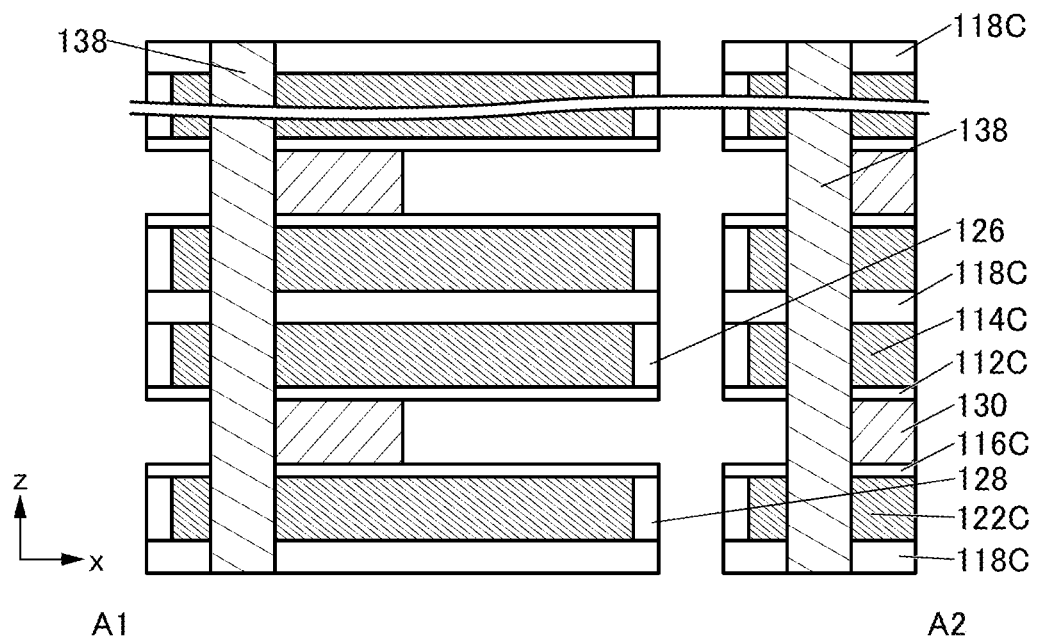

Next, isotropic etching is performed so that the insulator 130C provided in the layer 140 is selectively removed to form the insulator 130 (FIGS. 19(A) and 19(B)). As the isotropic etching, wet etching or etching using a reactive gas is used, for example. In the etching using a reactive gas, the etching isotropy is increased by intentionally refraining from applying a bias to a substrate or the like. Moreover, in the etching using a reactive gas, the reactivity of the etching gas may be improved by increasing the temperature of the reactive gas or making the reactive gas into plasma.

In the etching treatment, it is preferred that the etching rate of the insulator 130C be significantly higher than the etching rates of the insulator 118C, the insulator 116C, the insulator 112C, and the insulator 138. Given that the etching rates of the insulator 118C, the insulator 116C, the insulator 112C, and the insulator 138 are 1, the etching rate of the insulator 130C is preferably 5 or more, further preferably 10 or more. Accordingly, the etching conditions are selected as appropriate so that the above etching rates can be satisfied.

For example, when the insulator 130C is formed using silicon nitride and the insulator 118C, the insulator 116C, the insulator 112C, and the insulator 138 are formed using silicon oxide, wet etching using a phosphoric acid solution is performed.

At this time, as illustrated in FIG. 19(A), the top surface of the etched region of the insulator 130 in the layer 140 may have a substantially circular shape as though it is cut by the insulator 138.

Figure 20A:
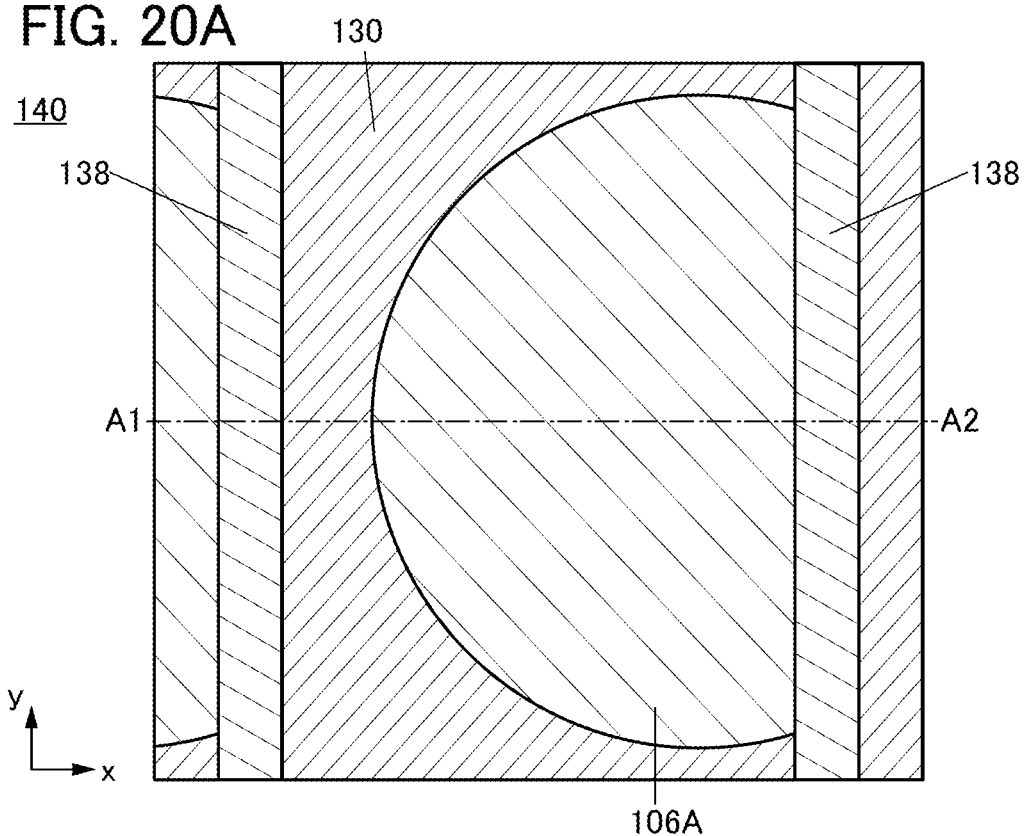
FIGS. 20A and 20B are a plan view and a cross-sectional view illustrating a method for manufacturing a semiconductor device of one embodiment of the present invention.
Figure 20B:
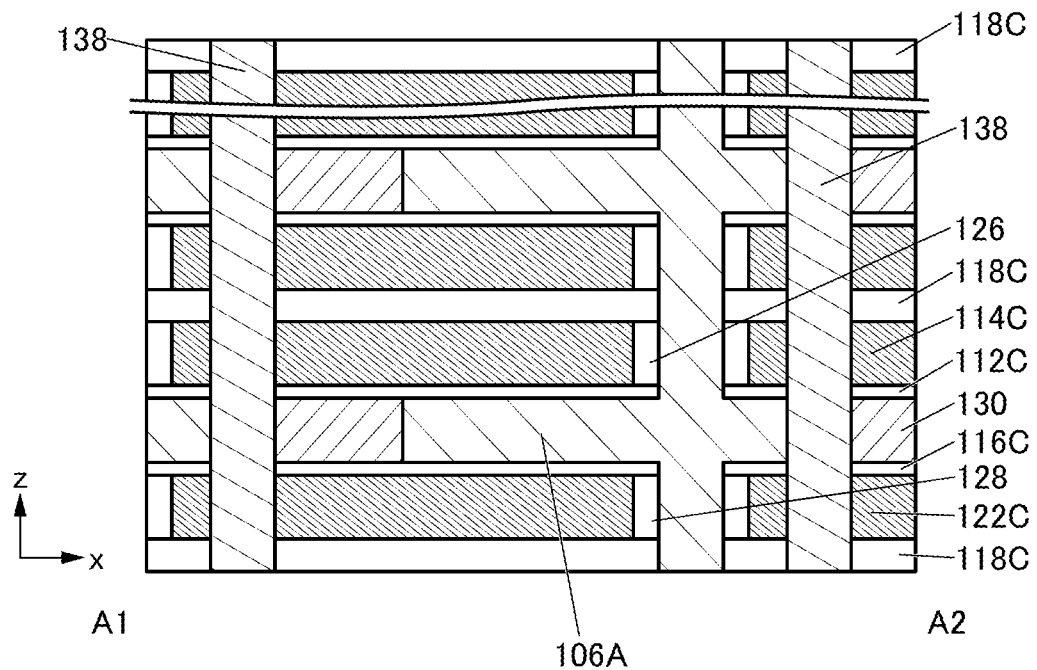

Next, an oxide 106A is formed in an opening formed in the stack including the insulator 118C, the conductor 122C, the insulator 116C, the insulator 130, the insulator 112C, and the conductor 114C (see FIGS. 20(A) and 20(B)). Here, the oxide 106A becomes the oxide 106 in a later step, and thus can be formed using the oxide described in this embodiment. The oxide 106A can be formed by a CVD method or an ALD method. It is particularly preferable to employ an ALD method, in which case a film with a uniform thickness can be formed in a groove or an opening having a large aspect ratio. Alternatively, the oxide 106A may be formed by a combination of an ALD method and a CVD method. In the case of using a CVD method, an MOCVD method or an MCVD method may be employed. When stacked films are used as the oxide 106A, they may be formed with the same deposition apparatus or different deposition apparatuses.

In each layer 140, the oxide 106A is formed in a region surrounded by the insulator 130 and the insulator 138. Thus, the oxide 106A is formed in an island shape in each layer 140, and the oxides 106A can be prevented from being in contact with each other.

Here, the oxide 106A formed on the uppermost surface of the memory cell array is preferably removed by a CMP method or the like.

Figure 21A:
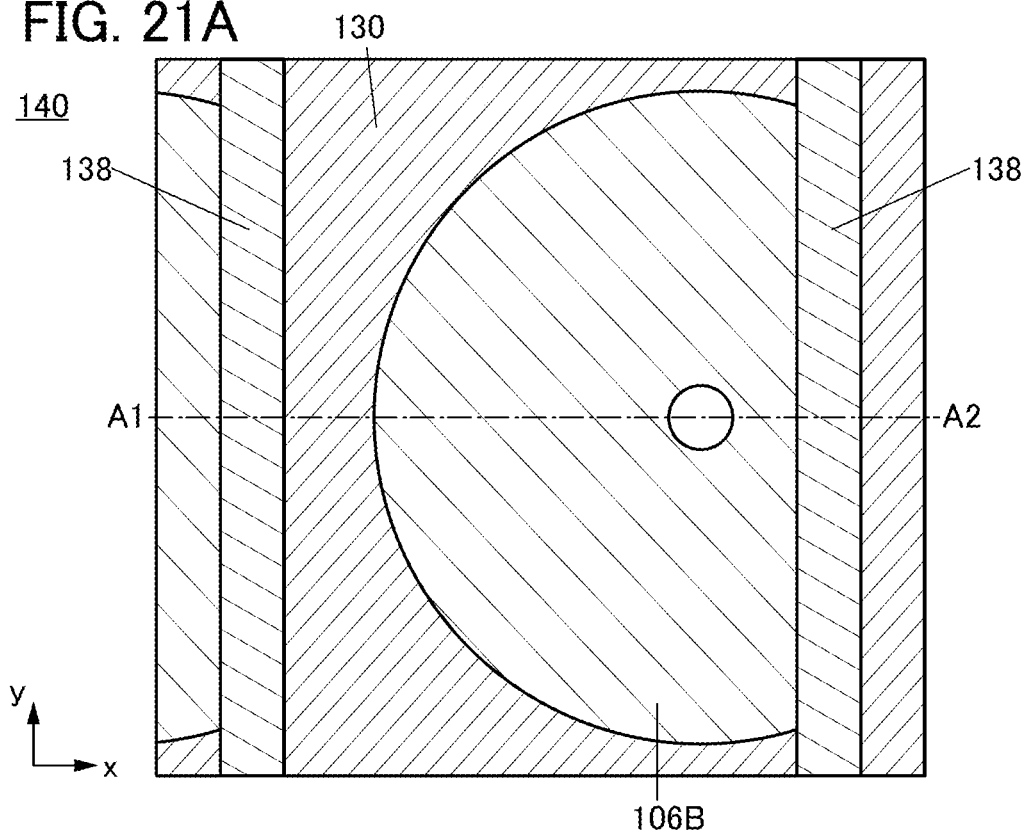
FIGS. 21A and 21B are a plan view and a cross-sectional view illustrating a method for manufacturing a semiconductor device of one embodiment of the present invention.
Figure 21B:
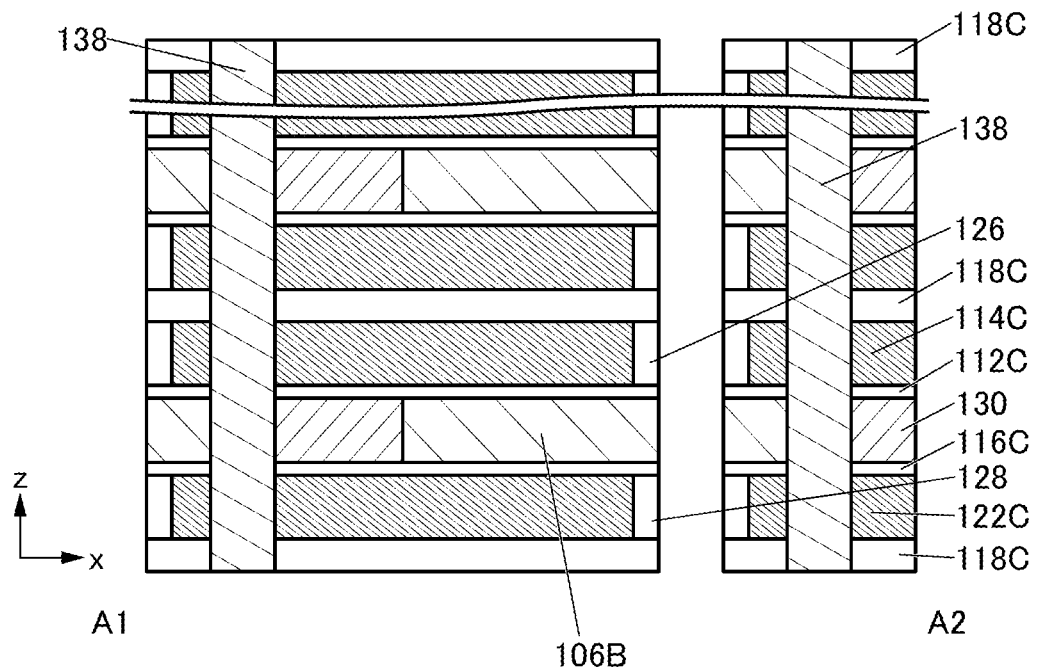

Next, the oxide 106A formed in the second opening is selectively removed to form an oxide 106B (see FIGS. 21(A) and 21(B)). Accordingly, the oxide 106B is divided among the layers 140. To selectively remove the oxide 106A in the second opening, anisotropic etching treatment such as dry etching treatment is performed, for example.

Figure 22A:
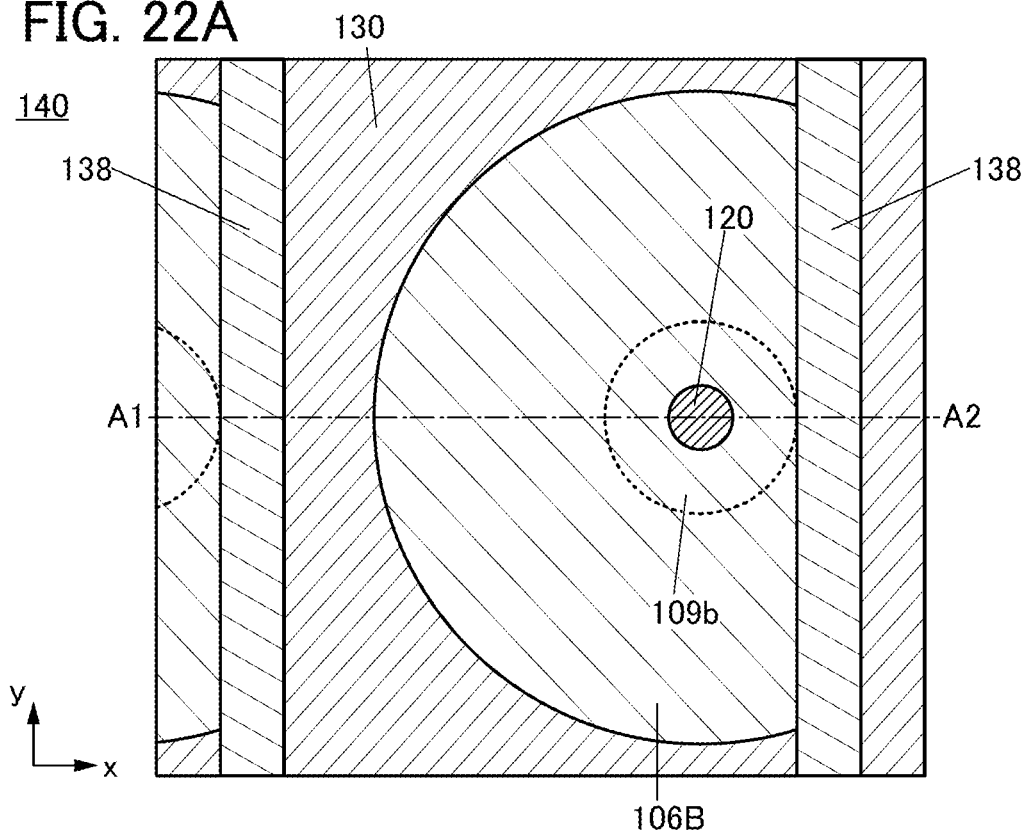
FIGS. 22A and 22B are a plan view and a cross-sectional view illustrating a method for manufacturing a semiconductor device of one embodiment of the present invention.
Figure 22B:
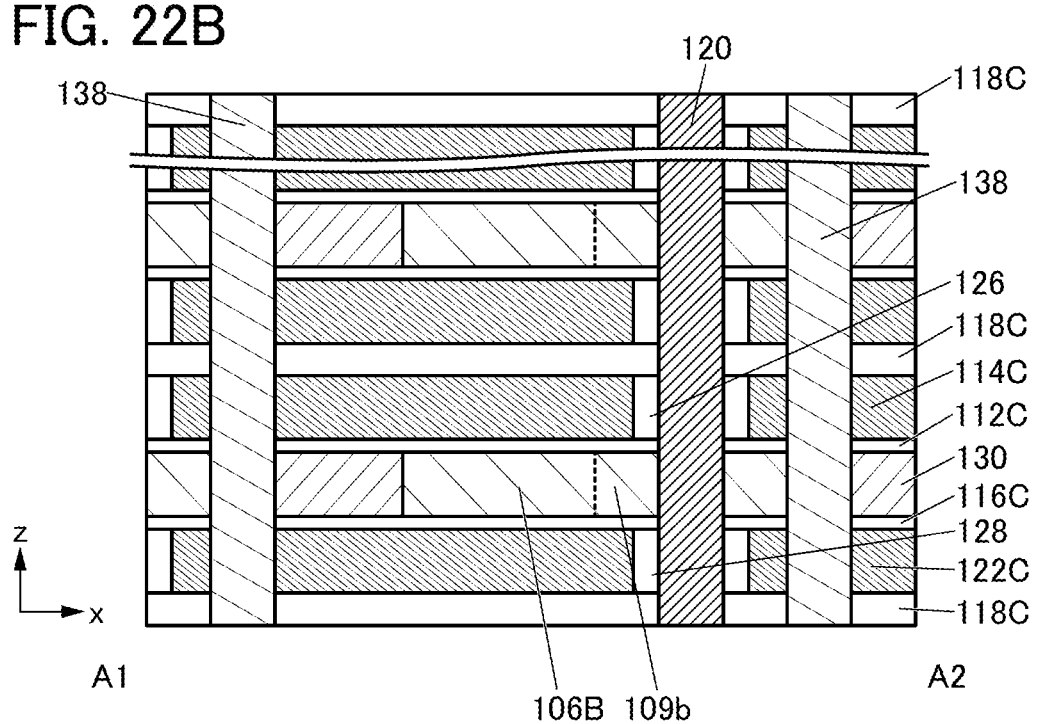

Then, the conductor 120 is formed in the second opening formed in the stack including the insulator 118C, the conductor 122C, the insulator 116C, the insulator 130, the oxide 106B, the insulator 112C, and the conductor 114C (see FIGS. 22(A) and 22(B)). The conductor 120 can be formed by a CVD method or an ALD method. It is particularly preferable to employ an ALD method, in which case a film with a uniform thickness can be formed in a groove or an opening having a large aspect ratio. Alternatively, the conductor 120 may be formed by a combination of an ALD method and a CVD method. In the case of using a CVD method, an MOCVD method or an MCVD method may be employed.

Here, the bottom portion of the conductor 120 is electrically connected to the region 172c of the transistor 62 as illustrated in FIG. 13(C).

In the layer 140, the oxide 106B is in contact with the side surface of the conductor 120 so as to surround the conductor 120. A metal element contained in the conductor 120 is added to the vicinity of a region of the oxide 106B in contact with the conductor 120, so that the resistance of the region of the oxide 106B is lowered and the region 109b is formed in some cases. When heat treatment is performed after the formation of the conductor 120, the metal element contained in the conductor 120 can be added to the oxide 106 and the region 109b can be formed more surely. Here, when the diameter of the second opening where the conductor 120 is provided is made sufficiently large, for example, approximately greater than or equal to 10 nm and less than or equal to 200 nm, the conductivity of the conductor 120 can be maintained sufficiently even if the region 109b is formed by heat treatment.

Figure 23A:
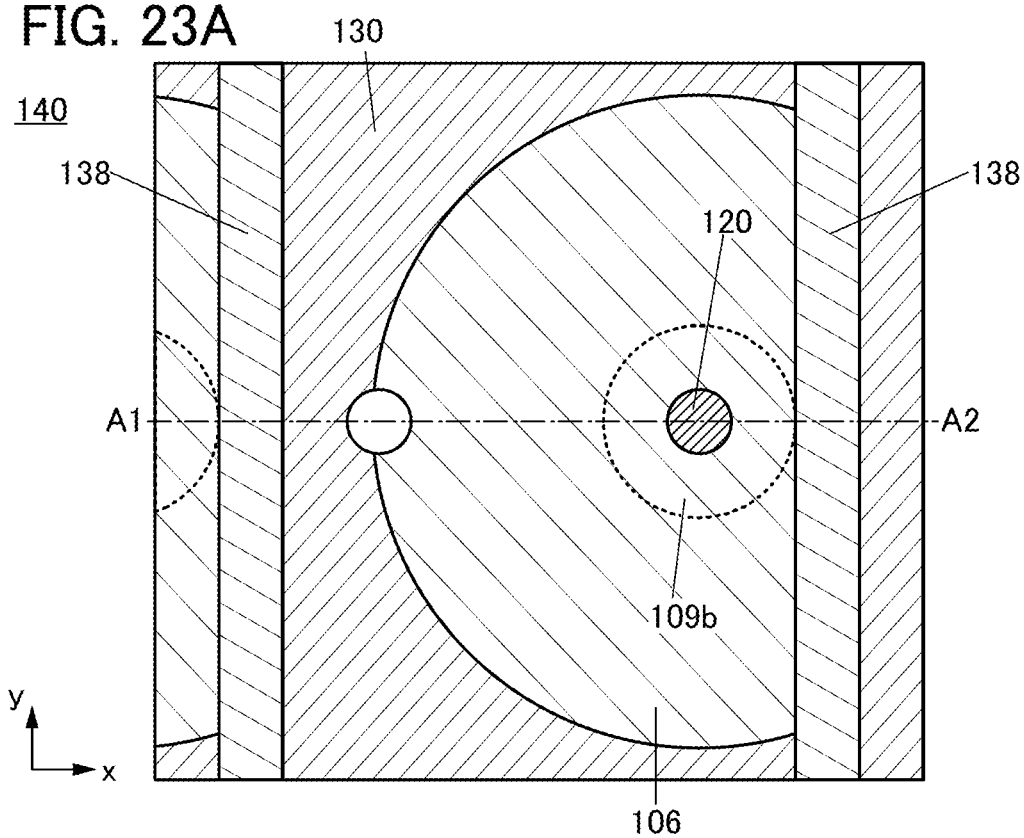
FIGS. 23A and 23B are a plan view and a cross-sectional view illustrating a method for manufacturing a semiconductor device of one embodiment of the present invention.
Figure 23B:
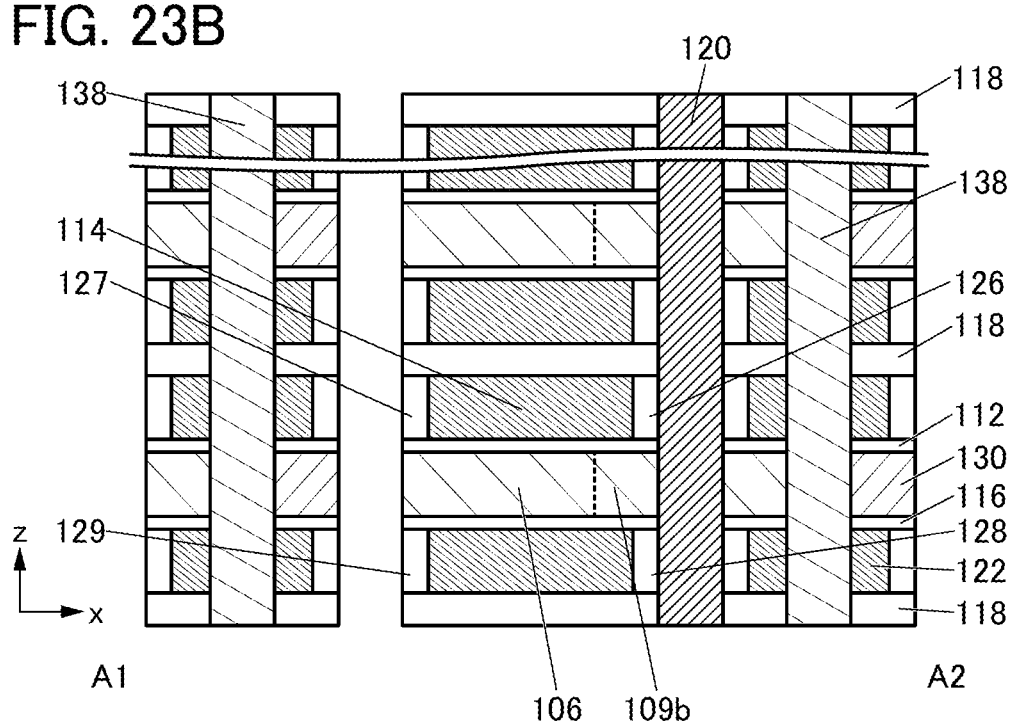

Next, with the use of a mask, a vertical-hole-shaped opening is formed in the stack including the insulator 118C, the conductor 122C, the insulator 116C, the insulator 130, the oxide 106B, the insulator 112C, and the conductor 114C, thereby forming a stack including the insulator 118, the conductor 122, the insulator 116, the insulator 130, the insulator 112, and the conductor 114 (see FIGS. 23(A) and 23(B)). In the stack including the insulator 118, the conductor 122, the insulator 116, the insulator 130, the insulator 112, and the conductor 114, the first opening in which the insulator 132 and the oxide 134 are embedded in a later step is formed. The first opening is formed, for example, by anisotropic etching treatment such as dry etching treatment.

Then, surfaces of the conductor 114 and the conductor 122 that face the first opening are oxidized, whereby the insulator 127 is formed on a side surface of the conductor 114 and the insulator 129 is formed on a side surface of the conductor 122 (see FIGS. 23(A) and 23(B)). The insulator 127 and the insulator 129 are formed, for example, by performing heat treatment in an atmosphere containing oxygen. Here, by using different conductive materials for the conductor 114 and the conductor 122, the formation speed is varied between the insulator 127 and the insulator 129, and the thickness of the insulator 127 can be larger.

Before the insulator 127 and the insulator 129 are formed, etching treatment may be performed to selectively remove the conductor 114. By using different conductive materials for the conductor 114 and the conductor 122, the etching rate is varied between the conductor 114 and the conductor 122, and the side surface of the conductor 122 can be positioned closer to the A2 side than the side surface of the conductor 114.

Figure 24A:
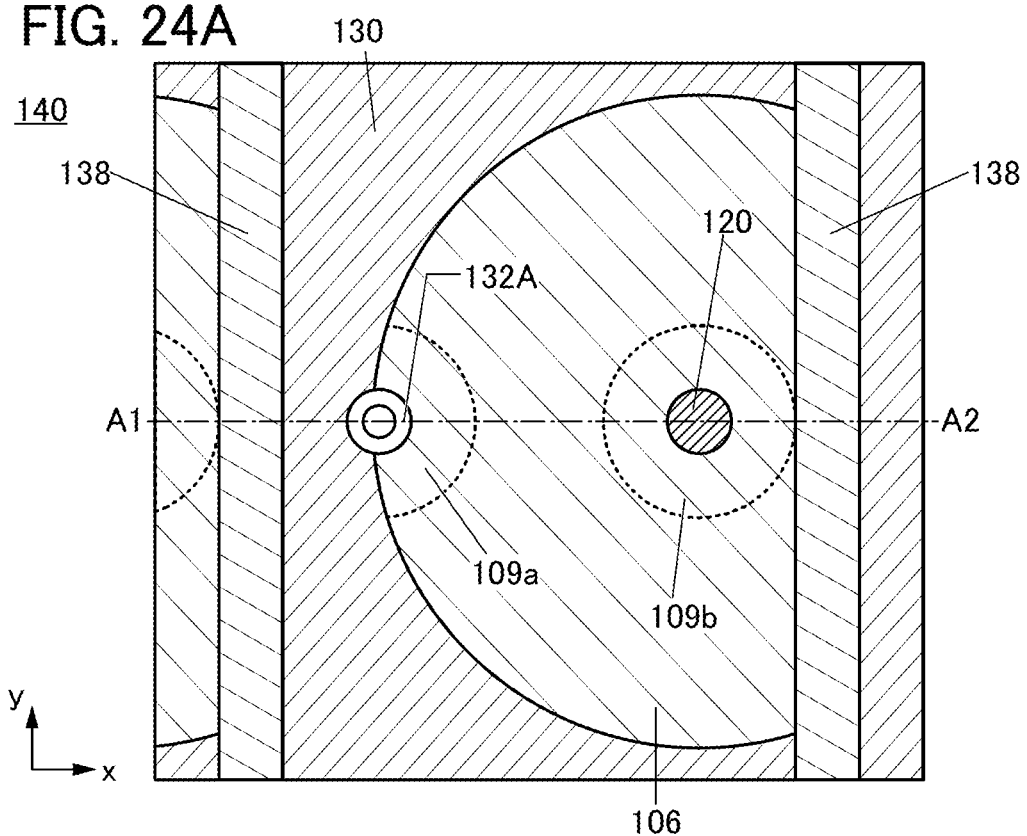
FIGS. 24A and 24B are a plan view and a cross-sectional view illustrating a method for manufacturing a semiconductor device of one embodiment of the present invention.
Figure 24B:
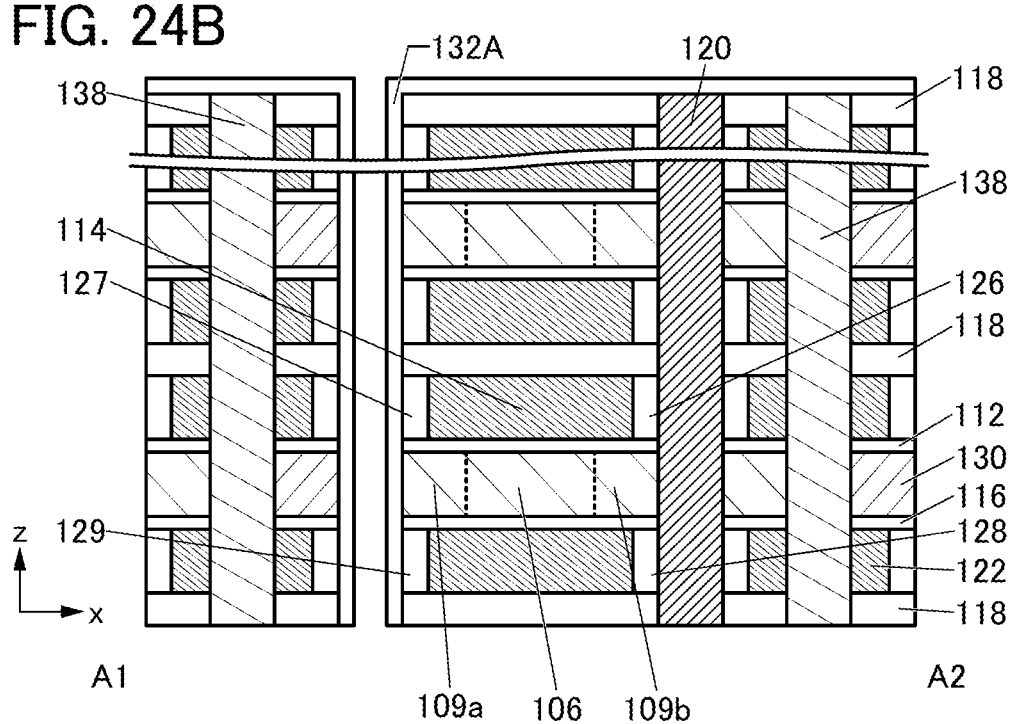

Next, an insulator 132A is formed in the first opening formed in the stack including the insulator 118, the conductor 122, the insulator 116, the insulator 130, the insulator 112, and the conductor 114 (see FIGS. 24(A) and 24(B)). Here, the insulator 132A becomes the insulator 132 in a later step, and thus can be formed using the insulator described in this embodiment. The insulator 132A can be formed by a CVD method or an ALD method. It is particularly preferable to employ an ALD method, in which case a film with a uniform thickness can be formed in a groove or an opening having a large aspect ratio. Alternatively, the insulator 132A may be formed by a combination of an ALD method and a CVD method.

Here, the insulator 132A is preferably provided to be in contact with the inner side of the first opening and have a cylinder shape with internal space.

The insulator 132A does not necessarily have to be an insulator immediately after deposition. For example, a metal film of aluminum, ruthenium, titanium, tantalum, chromium, tungsten, or the like may be formed thin, and oxygen may be supplied to the metal film by heat treatment or the like to form an insulating metal oxide film to be used as the insulator 132A. In that case, the thickness of the metal film is, for example, greater than or equal to 0.5 nm and less than or equal to 5 nm, preferably greater than or equal to 1 nm and less than or equal to 2 nm. When the heat treatment is performed in an atmosphere containing oxygen, the insulator 132A can be formed more surely. Moreover, in the heat treatment, heat treatment in an atmosphere containing nitrogen followed by heat treatment in an atmosphere containing oxygen may be performed.

Here, in the layer 140, the oxide 106 is in contact with the side surface of the metal film to be the insulator 132A so as to surround the metal film. Thus, at the same time as the formation of the insulator 132A, a metal element contained in the metal film to be the insulator 132A is added to the vicinity of a region of the oxide 106 in contact with the metal film to be the insulator 132A. Consequently, the resistance of the region of the oxide 106 is lowered, and the region 109a is formed (see FIGS. 24(A) and 24(B)).

Figure 25A:
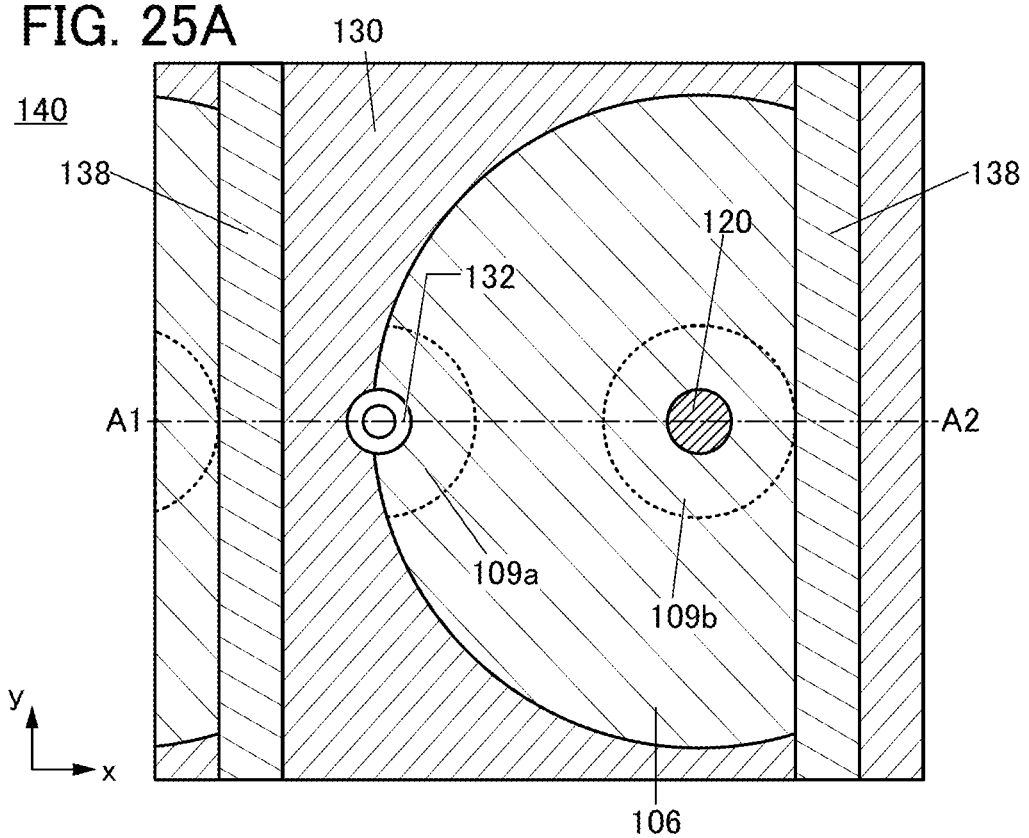
FIGS. 25A and 25B are a plan view and a cross-sectional view illustrating a method for manufacturing a semiconductor device of one embodiment of the present invention.
Figure 25B:
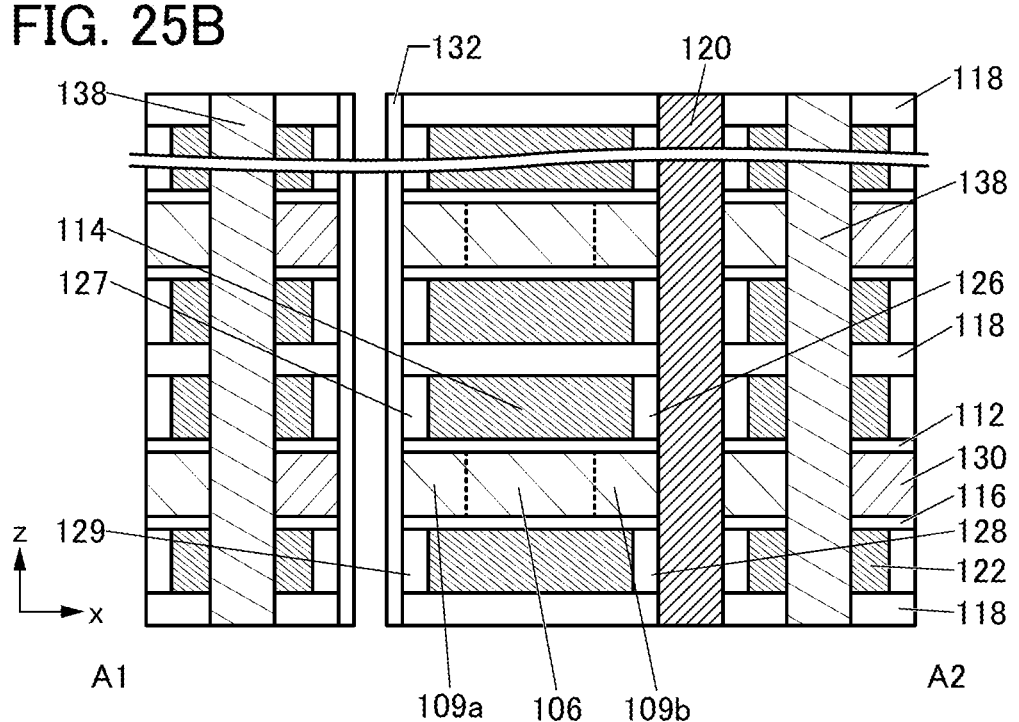

Next, the insulator 132A formed in the bottom portion of the first opening is selectively removed to form the insulator 132 (see FIGS. 25(A) and 25(B)). Anisotropic etching is preferably used to remove the insulator 132A. At this time, the insulator 132A over the insulator 118, the insulator 138, and the like is also removed, whereby the insulator 132 is provided only on the sidewall of the first opening.

Subsequently, the oxide 134 is formed in the first opening formed in the stack including the insulator 118, the conductor 122, the insulator 116, the insulator 130, the insulator 112, and the conductor 114 (see FIGS. 26(A) and 26(B)). Here, the oxide described in this embodiment is used as the oxide 134. The oxide 134 can be formed by a CVD method, an ALD method, or a sputtering method. It is particularly preferable to employ an ALD method, in which case a film with a uniform thickness can be formed in a groove or an opening having a large aspect ratio. Alternatively, the oxide 134 may be formed by a combination of an ALD method and a CVD method. In the case of using a CVD method, an MOCVD method or an MCVD method may be employed. When stacked films are used as the oxide 134, they may be formed with the same deposition apparatus or different deposition apparatuses.

Here, the bottom portion of the oxide 134 is electrically connected to the region 172a of the transistor 61 as illustrated in FIG. 13(A).

The oxide 134 formed on the uppermost surface of the memory cell array is preferably removed by a CMP method or the like.

By manufacturing the memory cell array in this manner, the memory cells 10 in a plurality of layers can be formed at once without layer-by-layer patterning for manufacturing the memory cells 10. Furthermore, in the case where the memory cell array is manufactured by the above method, even when the number of layers of the memory cells 10 is increased, the number of steps of patterning and etching treatment for the memory cells 10 does not increase. In this manner, the process of manufacturing the memory cell array can be shortened; thus, a semiconductor device with high productivity can be provided.

With the above structure, a three-dimensional memory cell array in which the memory cells 10 are stacked in the direction perpendicular to the top surface of a substrate can be provided. Providing the memory cells to be stacked in such a manner can increase the storage capacity per unit area in accordance with the number of stacked layers. The memory cell includes two transistors and one capacitor; that is, the number of elements is relatively large. The use of the semiconductor device described in this embodiment makes it possible to provide a semiconductor device that has a storage capacity per unit area equivalent to or larger than that of a conventional memory in addition to favorable characteristics as described above.

Note that the structure of the semiconductor device described in this embodiment is an example, and the present invention is not limited to the number, position, and the like of the circuit element, the wiring, and the like illustrated in the drawings and the like according to this embodiment. The number, position, and the like of the circuit element, the wiring, and the like included in the semiconductor device in this embodiment can be set as appropriate in accordance with the circuit configuration and the driving method.

The structure, method, and the like described above in this embodiment can be used in combination as appropriate with the structures, methods, and the like described in the other embodiments.

Embodiment 3

In this embodiment, application examples of a memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, computers refer not only to tablet computers, notebook computers, and desktop computers but also to large computers such as server systems. Alternatively, the semiconductor device described in the above embodiment is applied to a variety of removable memory devices such as memory cards (e.g., SD cards), USB memories, and SSDs (solid state drives). FIG. 27 schematically illustrates some structure examples of removable memory devices. For example, the semiconductor device described in the above embodiment is processed into a packaged memory chip and used in a variety of storage devices and removable memories.

Figure 27A:
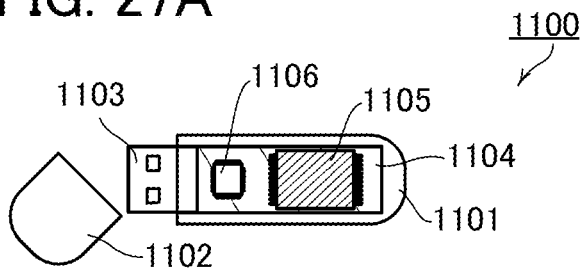
FIGS. 27A-27E are schematic views of memory devices of one embodiment of the present invention.

FIG. 27(A) is a schematic diagram of a USB memory. A USB memory 1100 includes a housing 1101, a cap 1102, a USB connector 1103, and a substrate 1104. The substrate 1104 is held in the housing 1101. A memory chip 1105 and a controller chip 1106 are attached to the substrate 1104, for example. The semiconductor device described in the above embodiment can be incorporated in the memory chip 1105 or the like on the substrate 1104.

Figures 27B, 27C:
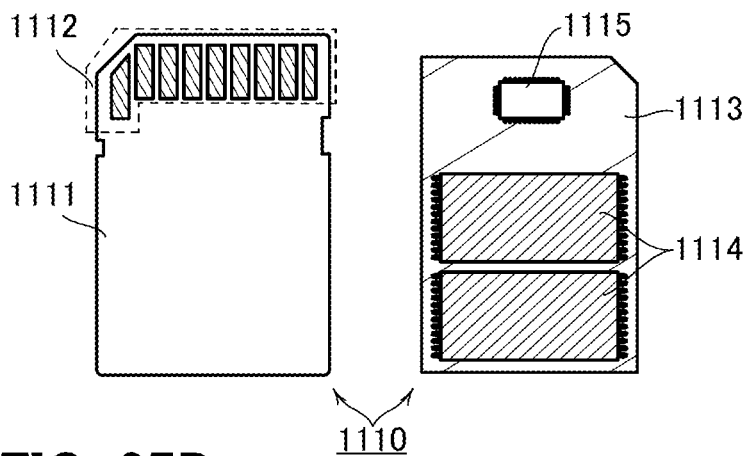

FIG. 27(B) is a schematic diagram of the appearance of an SD card, and FIG. 27(C) is a schematic diagram of the internal structure of the SD card. An SD card 1110 includes a housing 1111, a connector 1112, and a substrate 1113. The substrate 1113 is held in the housing 1111. A memory chip 1114 and a controller chip 1115 are attached to the substrate 1113, for example. When the memory chip 1114 is also provided on the rear side of the substrate 1113, the capacity of the SD card 1110 can be increased. In addition, a wireless chip with a radio communication function may be provided on the substrate 1113, in which case data reading and writing in the memory chip 1114 can be performed by radio communication between a host device and the SD card 1110. The semiconductor device described in the above embodiment can be incorporated in the memory chip 1114 or the like on the substrate 1113.

Figures 27D, 27E:
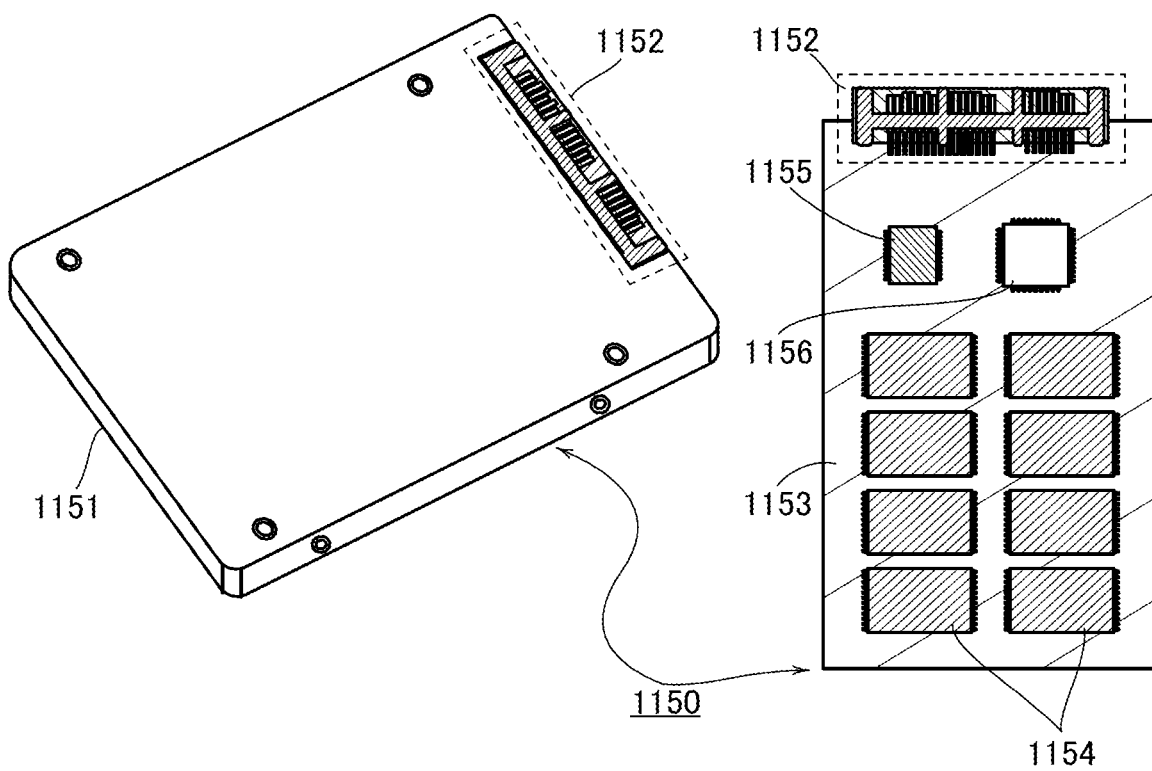

FIG. 27(D) is a schematic diagram of the appearance of an SSD, and FIG. 27(E) is a schematic diagram of the internal structure of the SSD. An SSD 1150 includes a housing 1151, a connector 1152, and a substrate 1153. The substrate 1153 is held in the housing 1151. A memory chip 1154, a memory chip 1155, and a controller chip 1156 are attached to the substrate 1153, for example. The memory chip 1155 is a work memory of the controller chip 1156, and a DRAM chip is used, for example. When the memory chip 1154 is also provided on the rear side of the substrate 1153, the capacity of the SSD 1150 can be increased. The semiconductor device described in the above embodiment can be incorporated in the memory chip 1154 or the like on the substrate 1153.

Embodiment 4

In this embodiment, an AI system in which the semiconductor device described in the above embodiment is used will be described with reference to FIG. 28.

Figure 28:
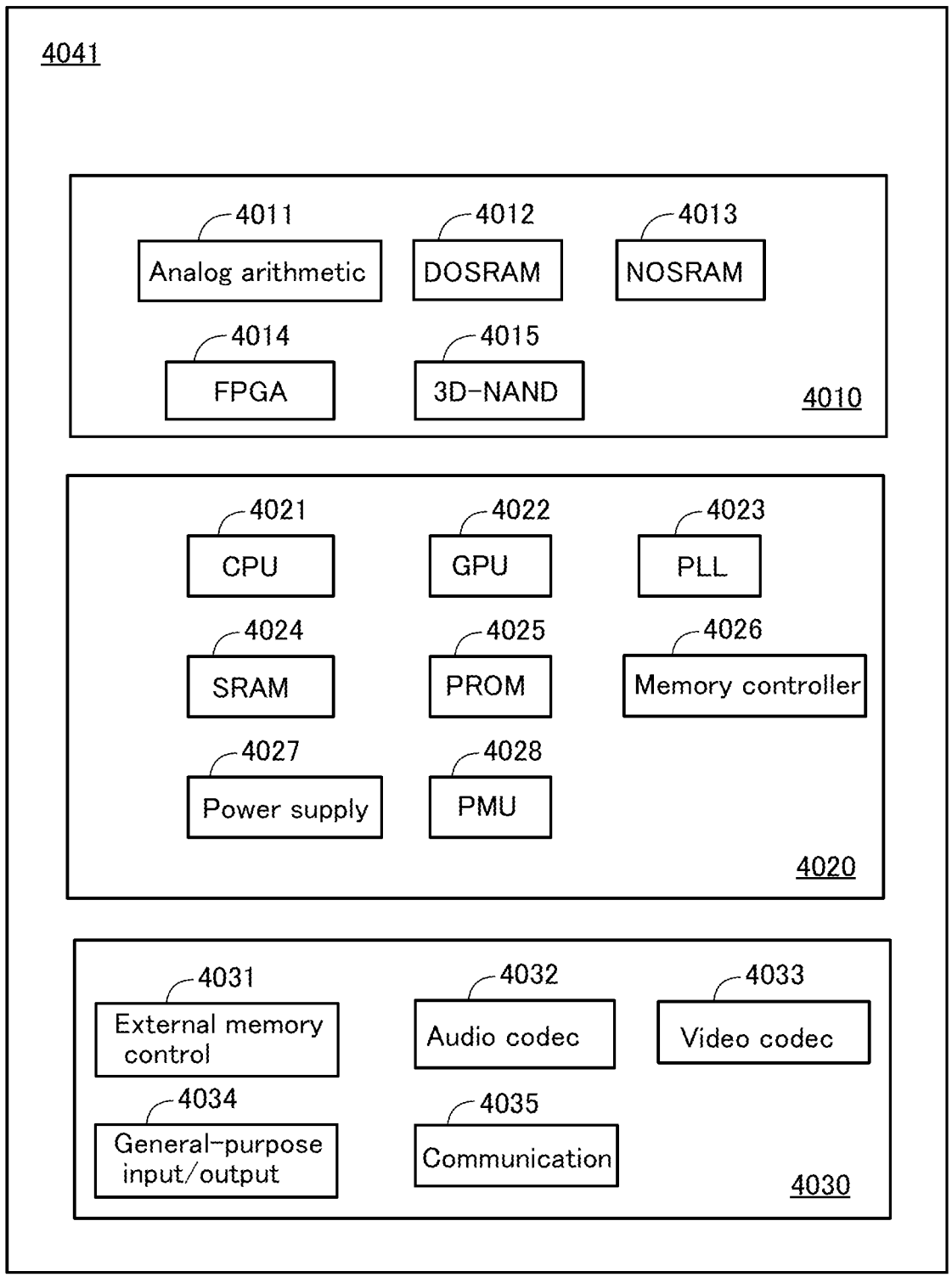
FIG. 28 is a block diagram showing a structure example of an AI system of one embodiment of the present invention.

FIG. 28 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015.

Here, DOSRAM (registered trademark) is an abbreviation of "Dynamic Oxide Semiconductor RAM", which is a RAM including a 1T (transistor)-1C (capacitor) memory cell.

Moreover, NOSRAM (registered trademark) is an abbreviation of "Nonvolatile Oxide Semiconductor RAM", which is a RAM including a gain cell (2T or 3T) memory cell. The DOSRAM and NOSRAM are memories utilizing the low off-state current of an OS transistor.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes memory cells including OS transistors and a read circuit portion including Si transistors. The above-described memory cells and read circuit portion can be provided in different layers that are stacked, whereby the entire circuit area of the DOSRAM 4012 can be small.

In calculation with a neural network, the number of input data exceeds 1000 in some cases. In the case where the input data is stored in an SRAM, the input data has to be stored piece by piece because of the circuit area limitation and small storage capacity of the SRAM. The DOSRAM 4012 has a larger storage capacity than the SRAM because the memory cells can be highly integrated even in a limited circuit area. Thus, the DOSRAM 4012 can efficiently store the input data.

The NOSRAM 4013 is a nonvolatile memory using an OS transistor. The NOSRAM 4013 consumes less power in writing data than other nonvolatile memories such as flash memory, ReRAM (Resistive Random Access Memory), and MRAM (Magnetoresistive Random Access Memory). Moreover, unlike flash memory and ReRAM, elements do not deteriorate when data is written, and there is no limitation on data write cycles.

The NOSRAM 4013 can store multilevel data of two or more bits as well as 1-bit binary data. The multilevel data storage in the NOSRAM 4013 leads to a reduction of the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The above data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 can have a longer bit line than the DOSRAM 4012 and thus can have an increased storage capacity.

The FPGA 4014 is an FPGA using an OS transistor (OS-FPGA). With the use of the FPGA 4014, the AI system 4041 can form connections in a neural network such as a deep neural network (DNN), a convolutional neural network (CNN), a recurrent neural network (RNN), an autoencoder, a deep Boltzmann machine (DBM), or a deep belief network (DBN) described later, with hardware. Forming the connections in the neural network with hardware enables higher-speed performance.

The OS-FPGA can have a smaller memory area than an FPGA composed of an SRAM. Thus, adding a context switching function only causes a small increase in area. Moreover, the OS-FPGA can transmit data and parameters at high speed by boosting.

The 3D-NAND 4015 is a nonvolatile memory using an OS transistor. The 3D-NAND 4015 is a highly integrated memory and has a large storage capacity per unit area.

The 3D-NAND 4015 can store multilevel data of two or more bits as well as 1-bit binary data. The multilevel data storage in the 3D-NAND 4015 leads to a further reduction of the memory cell area per bit.

As the 3D-NAND 4015, for example, the semiconductor device in the above embodiment can be used. Accordingly, the area occupied by the memory cells can be reduced, so that the semiconductor device including the memory circuit of this embodiment can be further highly integrated. As a result, the storage capacity per unit area of the memory device of this embodiment can be increased.

In the AI system 4041, the analog arithmetic circuit 4011, the DOSRAM 4012, the NOSRAM 4013, and the FPGA 4014 can be provided on one die (chip). Thus, the AI system 4041 can execute the neural network calculation quickly with low power consumption. In addition, the analog arithmetic circuit 4011, the DOSRAM 4012, the NOSRAM 4013, and the FPGA 4014 can be manufactured through the same manufacturing process. Hence, the AI system 4041 can be manufactured at low cost.

Note that the arithmetic portion 4010 does not need to include all of the following: the DOSRAM 4012, the NOSRAM 4013, and the FPGA 4014. One or more of the DOSRAM 4012, the NOSRAM 4013, and the FPGA 4014 are selected and provided in accordance with an issue that the AI system 4041 intends to solve.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with an issue that is intended to be solved. The PROM 4025 can store a program for executing at least one of these methods. Part or the whole of the program may be stored in the NOSRAM 4013.

The existing programs that exist as libraries are mostly premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily cutting off the power supply in the AI system 4041.

The CPU 4021 and the GPU 4022 preferably include OS memories as registers. By including the OS memories, the CPU 4021 and the GPU 4022 can retain data (logic values) in the OS memories even when the power supply is cut off. As a result, the AI system 4041 can save the power.

The PLL 4023 has a function of generating a clock. The AI system 4041 operates on the basis of the clock generated by the PLL 4023. The PLL 4023 preferably includes an OS memory. By including the OS memory, the PLL 4023 can retain an analog potential for controlling the clock oscillation cycle.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010, in which case the AI system 4041 can execute the neural network calculation at high speed with low power consumption.

Data used for the neural network calculation is stored in an external memory device (such as an HDD (Hard Disk Drive) or an SSD (Solid State Drive)) in many cases. Therefore, the AI system 4041 preferably includes the external memory control circuit 4031 functioning as an interface with the external memory device.

Because learning and inference using the neural network often deal with audio and video, the AI system 4041 includes the audio codec 4032 and the video codec 4033. The audio codec 4032 encodes and decodes audio data, and the video codec 4033 encodes and decodes video data.

The AI system 4041 can perform learning or inference by using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like, for example.

The AI system 4041 can perform learning or inference by using data obtained via the Internet. For this reason, the AI system 4041 preferably includes the communication module 4035.

The analog arithmetic circuit 4011 may use a multilevel flash memory as an analog memory. However, the flash memory has a limitation on the number of rewrite cycles. In addition, it is extremely difficult to embed the multilevel flash memory (to form the arithmetic circuit and the memory on the same die).

Alternatively, the analog arithmetic circuit 4011 may include a ReRAM as an analog memory. However, the ReRAM has a limitation on the number of rewrite cycles and also has a problem in storage accuracy. Moreover, as the ReRAM is a two-terminal element, it has a complicated circuit design for separating data writing and reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structure described in this embodiment can be used in combination with the structures described in the other embodiments as appropriate.

Embodiment 5

<Application Example of AI System>

In this embodiment, application examples of the AI system described in the above embodiment will be described with reference to FIG. 29.

Figure 29A:
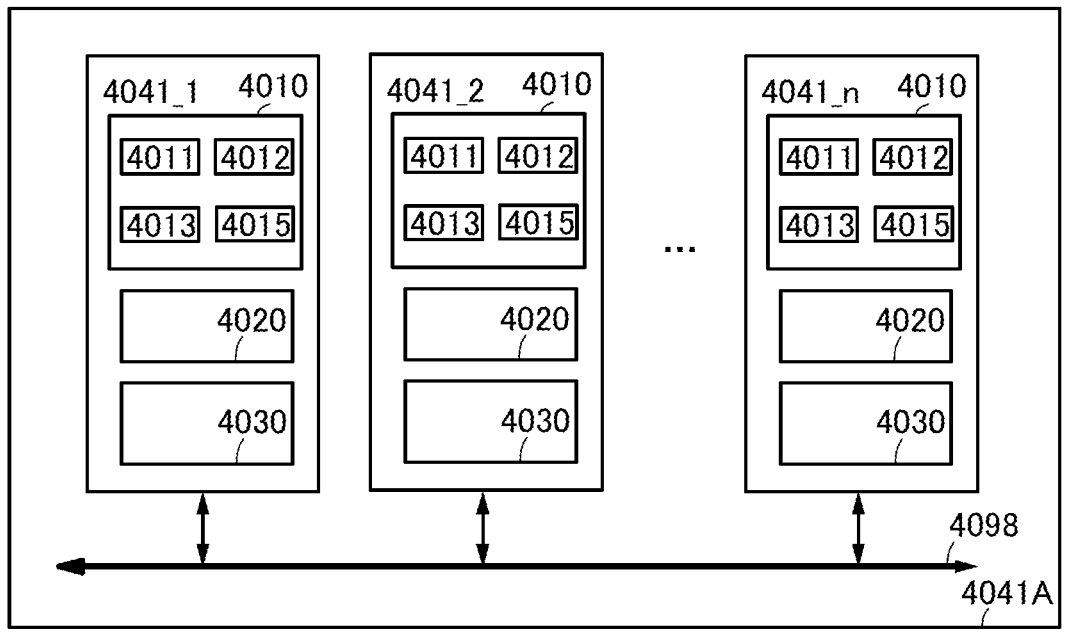
FIGS. 29A and 29B are block diagrams illustrating application examples of an AI system of one embodiment of the present invention.

FIG. 29(A) shows an AI system 4041A in which the AI systems 4041 described with FIG. 28 are arranged in parallel so that signals can be transmitted and received between the systems via a bus line.

The AI system 4041A illustrated in FIG. 29(A) includes a plurality of AI systems 4041_1 to 4041_n (n is a natural number of 2 or more). The AI system 4041_1 to the AI system 4041_n are connected to each other via a bus line 4098.

Figure 29B:
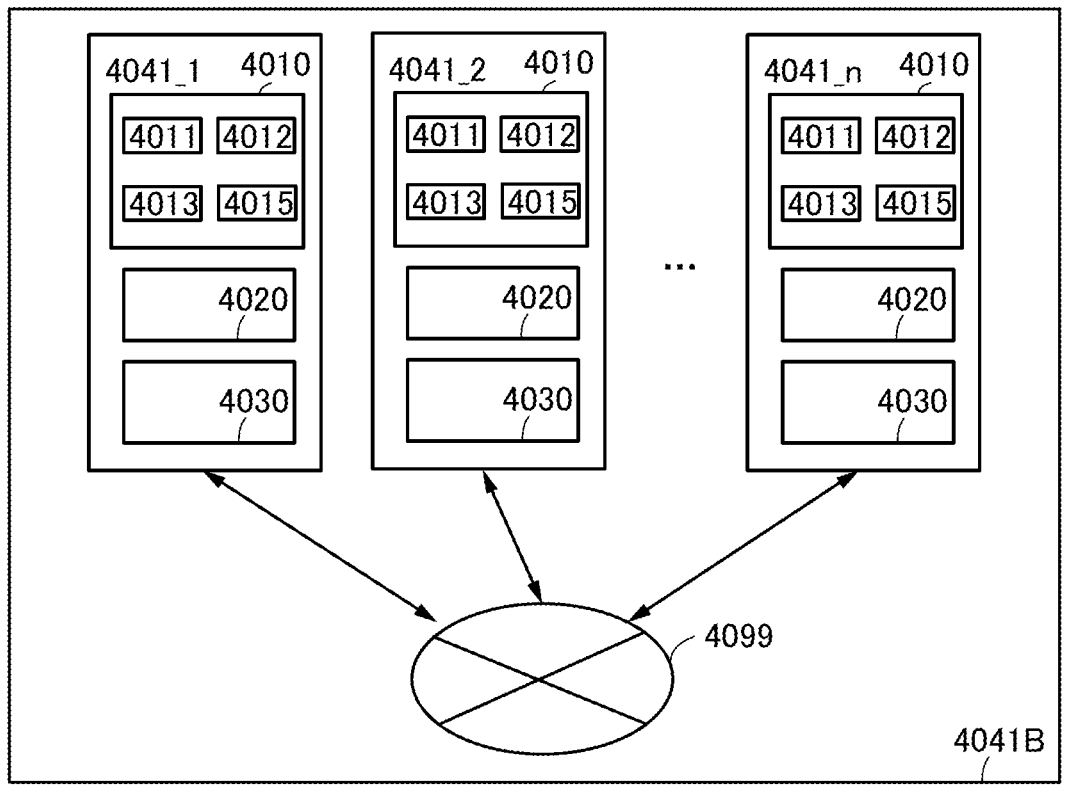

FIG. 29(B) shows an AI system 4041B in which the AI systems 4041 described with FIG. 28 are arranged in parallel as in FIG. 29(A) so that signals can be transmitted and received between the systems via a network.

The AI system 4041B illustrated in FIG. 29(B) includes the plurality of AI systems 4041_1 to 4041_n. The AI system 4041_1 to the AI system 4041_n are connected to each other via a network 4099.

The network 4099 has a structure in which wireless or wired communication is performed with a communication module provided in each of the AI system 4041_1 to the AI system 4041_n. The communication modules can perform communication via an antenna. For example, communication can be performed by connecting each of the AI systems to a computer network such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE, such as Wi-Fi (registered trademark), Bluetooth (registered trademark), or ZigBee (registered trademark).

With the structure in FIG. 29(A) or FIG. 29(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When signal processing or learning is performed by different AI systems, the amount of information processed by each AI system can be reduced. Accordingly, signal processing or learning can be performed with a smaller amount of arithmetic processing. As a result, the recognition accuracy can be increased. The information obtained with each AI system is expected to enable instant and collective understanding of a complex change in biological information.

The structure described in this embodiment can be used in combination with the structures described in the other embodiments as appropriate.

Embodiment 6

In this embodiment, an example of an IC into which the AI system described in the above embodiment is incorporated will be described.

In the AI system described in the above embodiment, a digital processing circuit formed of Si transistors, such as a CPU; an analog arithmetic circuit using OS transistors; an OS-FPGA; and an OS memory such as DOSRAM or NOSRAM can be integrated into one die.

Figure 30:
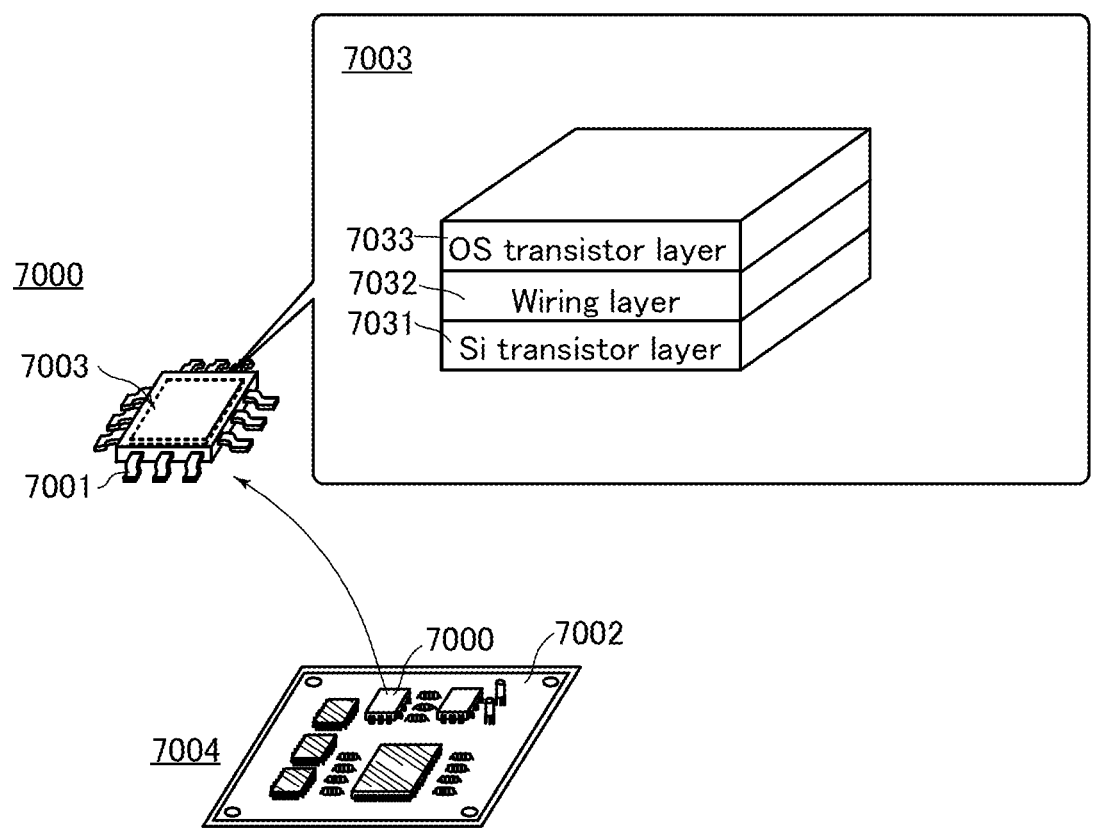
FIG. 30 is a perspective schematic view showing a structure example of an IC into which an AI system of one embodiment of the present invention is incorporated.

FIG. 30 illustrates an example of an IC into which the AI system is incorporated. An AI system IC 7000 illustrated in FIG. 30 includes a lead 7001 and a circuit portion 7003. The AI system IC 7000 is mounted on a printed circuit board 7002, for example. A plurality of such IC chips are combined and electrically connected to each other on the printed circuit board 7002, whereby a substrate on which electronic components are mounted (a circuit board 7004) is completed. In the circuit portion 7003, various circuits described in the above embodiment are provided on one die. The circuit portion 7003 has a stacked-layer structure as described in the above embodiment, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 30, the embodiment of the package is not limited thereto.

The digital processing circuit such as a CPU, the analog arithmetic circuit using OS transistors, the OS-FPGA, and the OS memory such as DOSRAM or NOSRAM can all be formed in the Si transistor layer 7031, the wiring layer 7032, and the OS transistor layer 7033. In other words, the elements included in the AI system can be formed through the same manufacturing process. Consequently, the number of steps in the manufacturing process of the IC described in this embodiment does not need to be increased even when the number of constituent elements is increased, and accordingly the AI system can be incorporated into the IC at low cost.

The structure described in this embodiment can be used in combination with the structures described in the other embodiments as appropriate.

Embodiment 7

<Electronic Devices>

A semiconductor device of one embodiment of the present invention can be used for a variety of electronic devices. FIG. 31 to FIG. 33 illustrate specific examples of electronic devices using the semiconductor device of one embodiment of the present invention.

Figure 31A:
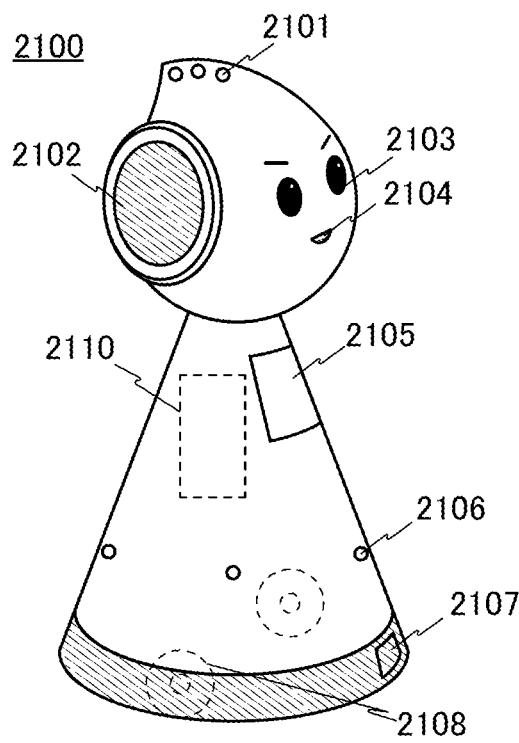
FIGS. 31A-31D are diagrams illustrating electronic devices of one embodiment of the present invention.

A robot 2100 illustrated in FIG. 31(A) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user by using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

Figure 31B:
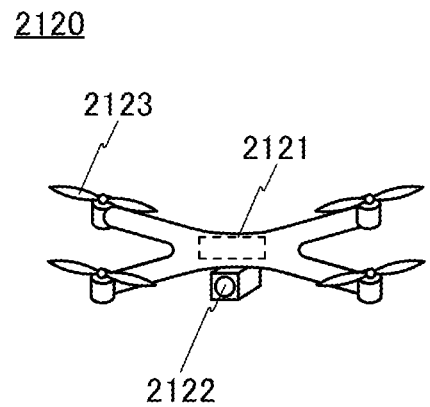

A flying object 2120 illustrated in FIG. 31(B) includes an arithmetic device 2121, a propeller 2123, and a camera 2122 and has a function of flying autonomously.

The above semiconductor device can be used in the arithmetic device 2121 and the camera 2122 of the flying object 2120.

Figure 31C:
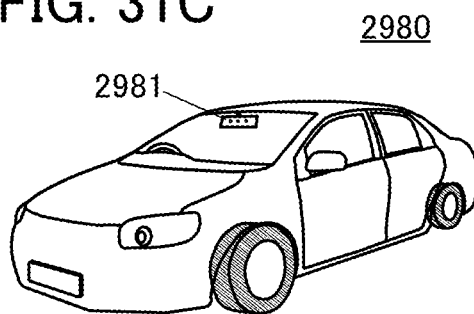

FIG. 31(C) is an external view illustrating an example of an automobile. An automobile 2980 includes a camera 2981 and the like. The automobile 2980 also includes various sensors such as an infrared radar, a millimeter wave radar, and a laser radar. The automobile 2980 can perform automatic driving by analyzing images taken by the camera 2981 and judging surrounding traffic information such as the presence of a pedestrian.

Figure 31D:
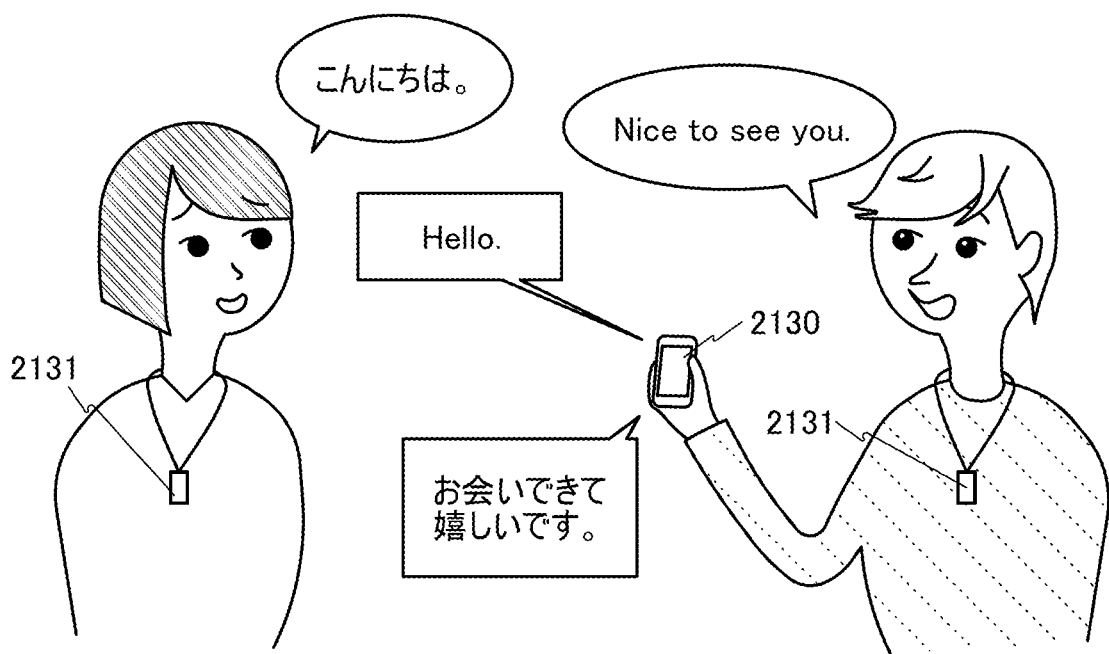

FIG. 31(D) illustrates a situation where a portable electronic device 2130 performs simultaneous interpretation in communication between people who speak different languages.

The portable electronic device 2130 includes a microphone, a speaker, and the like and has a function of recognizing a user's speaking voice and translating it into a language spoken by a conversational partner.

In FIG. 31(D), the user employs a portable microphone 2131. The portable microphone 2131 has a radio communication function and a function of transmitting a detected sound to the portable electronic device 2130.

Figure 32A:
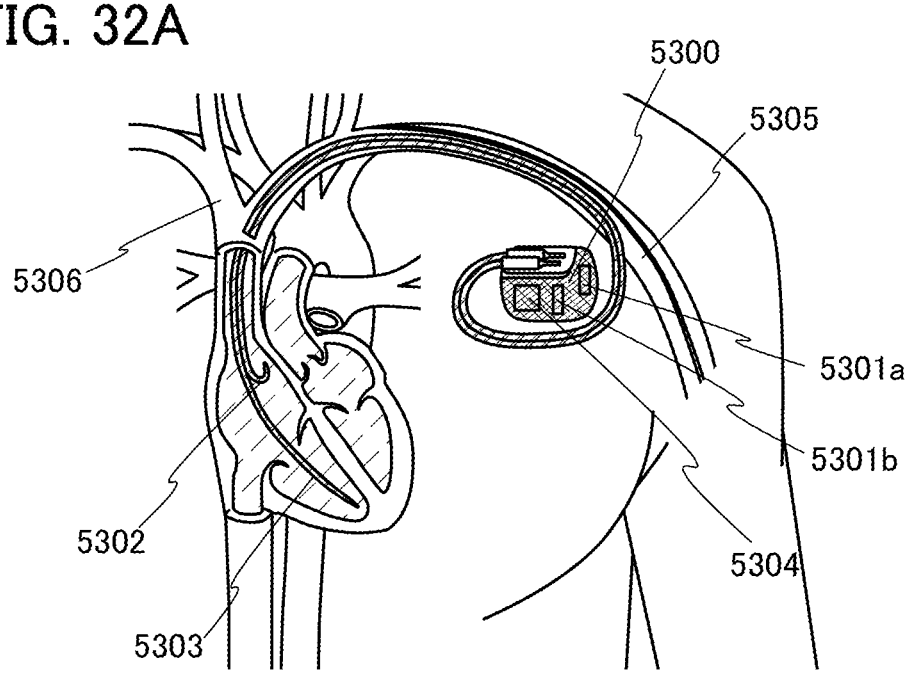
FIGS. 32A and 32B are diagrams illustrating electronic devices of one embodiment of the present invention.
Figure 33:
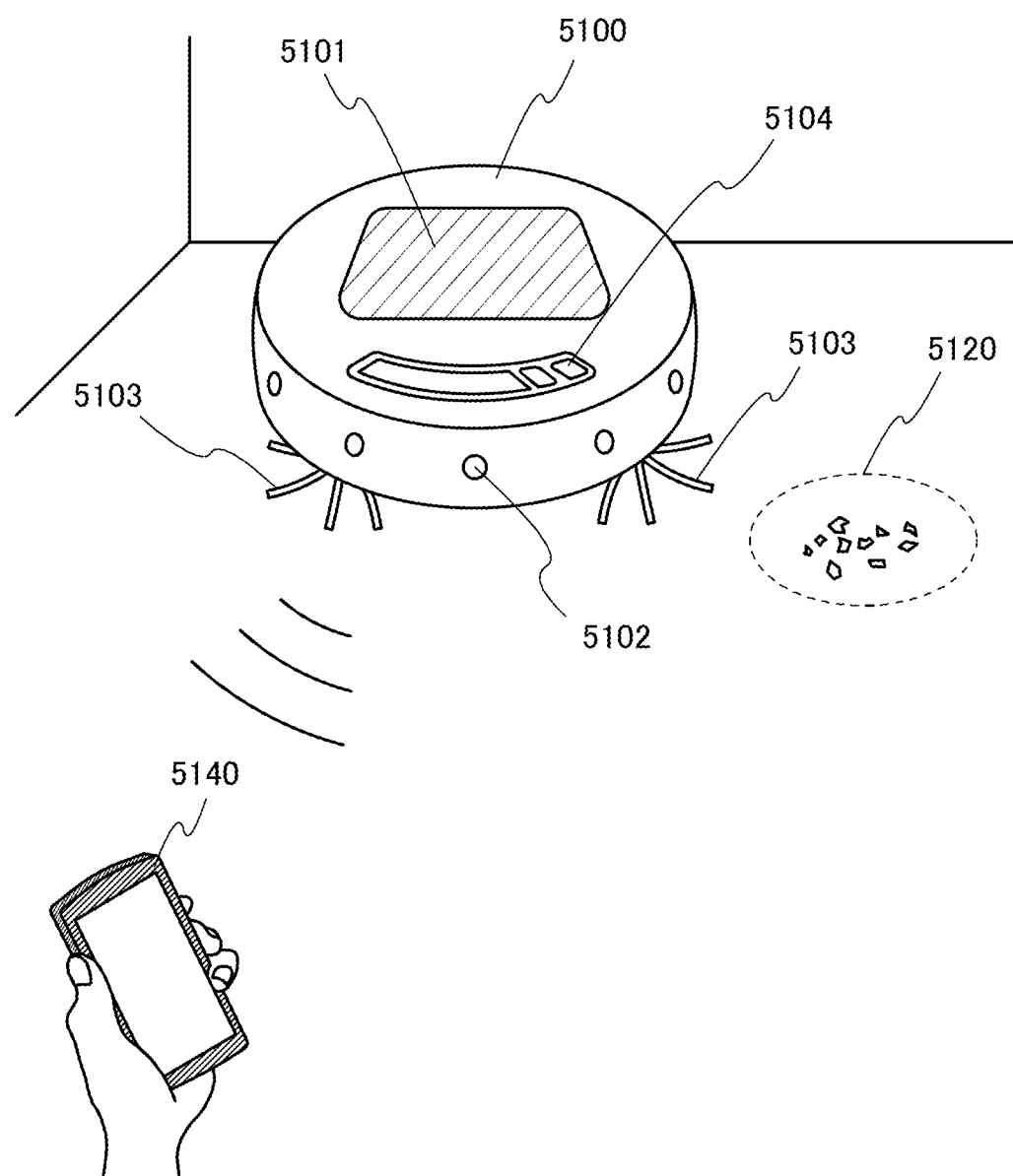
FIG. 33 is a diagram illustrating an electronic device of one embodiment of the present invention.

FIG. 32(A) is a cross-sectional schematic view illustrating an example of a pacemaker.

A pacemaker body 5300 includes at least batteries 5301*a* and 5301*b*, a regulator, a control circuit, an antenna 5304, a wire 5302 reaching a right atrium, and a wire 5303 reaching a right ventricle.

The pacemaker body 5300 is implanted in the body by surgery, and the two wires pass through a subclavian vein 5305 and a superior vena cava 5306 of the human body, with the end of one of the wires placed in the right ventricle and the end of the other wire placed in the right atrium.

The antenna 5304 can receive electric power, and the plurality of batteries 5301*a* and 5301*b* are charged with the electric power, which can reduce the frequency of replacing the pacemaker. The pacemaker body 5300, which includes the plurality of batteries, provides a high level of safety, and the plurality of batteries also function as auxiliary power supplies because even when one of them fails, the other can function.

Other than the antenna 5304 capable of receiving electric power, an antenna that can transmit physiological signals may be included. For example, a system that monitors the cardiac activity so as to check physiological signals such as a pulse, a respiratory rate, a heart rate, and body temperature with an external monitoring device may be constructed.

Figure 32B:
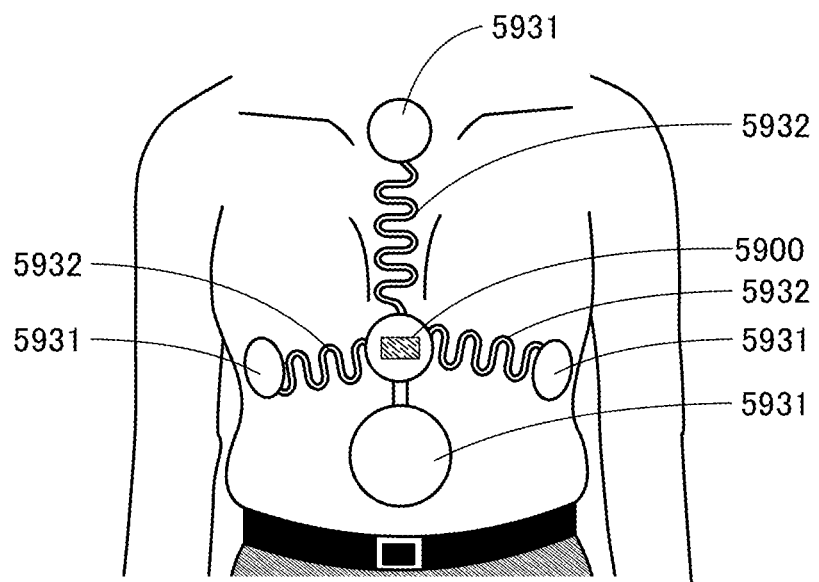

A sensor 5900 illustrated in FIG. 32(B) is attached to a human body with the use of a bond pad or the like. The sensor 5900 obtains biological information such as a heart rate or an electrocardiogram, for example, by supplying a signal through a wiring 5932 to an electrode 5931 or the like attached to the human body. The obtained data is transmitted to a terminal such as a reading device as a wireless signal.

FIG. 33 is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. In addition, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of collected dust, and the like. The display 5101 may display a path on which the cleaning robot 5100 has run. Moreover, a touch panel may be used as the display 5101, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device such as a smartphone.

For example, a memory device using the semiconductor device of one embodiment of the present invention can retain control data, a control program, or the like of the above electronic device for a long time. With the use of the semiconductor device of one embodiment of the present invention, a highly reliable electronic device can be achieved.

An IC into which the above AI system is incorporated can be used for the arithmetic device or the like of the above electronic device, for example. Accordingly, the AI system enables the electronic device described in this embodiment to perform operations appropriate for situations with low power consumption.

This embodiment can be implemented in combination with the structures described in the other embodiments as appropriate.

REFERENCE NUMERALS

10: memory cell, 11: transistor, 12: transistor, 14: capacitor, 20: memory cell string, 30: dimensional memory cell array, 40: dimensional memory cell array, 50: selection transistor array, 51: driver circuit, 52: read circuit, 53: driver circuit, 54: driver circuit, 60: selection transistor cell, 61: transistor, 62: transistor, 106: oxide, 106A: oxide, 106B: oxide, 109*a*: region, 109*b*: region, 112: insulator, 112A: insulator, 112B: insulator, 112C: insulator, 114: conductor, 114A: conductor, 114B: conductor, 114C: conductor, 116: insulator, 116A: insulator, 116B: insulator, 116C: insulator, 118: insulator, 118A: insulator, 118B: insulator, 118C: insulator, 120: conductor, 122: conductor, 122A: conductor, 122B: conductor, 122C: conductor, 126: insulator, 127: insulator, 128: insulator, 129: insulator, 130: insulator, 130A: insulator, 130B: insulator, 130C: insulator, 132: insulator, 132A: insulator, 134: oxide, 138: insulator, 140: layer, 141: layer, 142: layer, 150: semiconductor substrate, 154*a*: conductor, 154*b*: conductor, 160: region, 162*a*: insulator, 162*b*: insulator, 164: insulator, 165: insulator, 166: insulator, 168: insulator, 170: insulator, 172*a*: region, 172*b*: region, 172*c*: region, 172*d*:

region, 174*a*: conductor, 174*b*: conductor, 176*a*: conductor, 176*b*: conductor, 178*a*: conductor, 178*b*: conductor, 178*c*: conductor, 178*d*: conductor, 180*a*: conductor, 180*b*: conductor, 180*c*: conductor, 180*d*: conductor, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 2120: flying object, 2121: arithmetic device, 2122: camera, 2123: propeller, 2130: portable electronic device, 2131: portable microphone, 2980: automobile, 2981: camera, 4010: arithmetic portion, 4011: analog arithmetic circuit, 4012: DOSRAM, 4013: NOSRAM, 4014: FPGA, 4015: 3D-NAND, 4020: control portion, 4021: CPU, 4022: GPU, 4023: PLL, 4024: SRAM, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_1: AI system, 4041_*n*: AI system, 4041A: AI system, 4041B: AI system, 4098: bus line, 4099: network, 5100: cleaning robot, 5101 display, 5102: camera, 5103: brush, 5104: operation button, 5120: dust, 5140: portable electronic device, 5300: pacemaker body, 5301*a*: battery, 5301*b*: battery, 5302: wire, 5303: wire, 5304: antenna, 5305: subclavian vein, 5306: superior vena cava, 5900: sensor, 5931: electrode, 5932: wiring, 7000: AI system IC, 7001: lead, 7002: printed circuit board, 7003: circuit portion, 7004: circuit board, 7031: Si transistor layer, 7032: wiring layer, 7033: OS transistor layer.

This application is based on Japanese Patent Application Serial No. 2017-113842 filed with Japan Patent Office on Jun. 8, 2017, the entire contents of which are hereby incorporated herein by reference.

The invention claimed is:

1. A semiconductor device comprising:
   a substrate;
   a conductive layer over the substrate, the conductive layer parallel to a surface of the substrate;
   a first insulating layer over the conductive layer;
   an oxide semiconductor layer over the first insulating layer;
   a second insulating layer over the oxide semiconductor layer;
   a first penetrating portion perpendicular to the surface of the substrate; and
   a second penetrating portion perpendicular to the surface of the substrate,
   wherein the oxide semiconductor layer comprises a first region, a second region, and a third region between the first region and the second region,
   wherein the first penetrating portion comprises an oxide semiconductor material portion in an inner portion and an insulating material portion in an outer portion,
   wherein the second penetrating portion comprises a conductive material portion,
   wherein the insulating material portion is in contact with the first region,
   wherein the conductive material portion is in contact with the second region, and
   wherein each of the first region and the second region has a lower resistance than the third region.

2. The semiconductor device according to claim 1,
   wherein the semiconductor device comprises a first transistor and a second transistor electrically connected to each other,
   wherein the first transistor comprises a channel formation region in the oxide semiconductor material portion, and
   wherein the second transistor comprises a channel formation region in the oxide semiconductor layer.

3. The semiconductor device according to claim 2,
   wherein the semiconductor device further comprises a capacitor, and
   wherein the capacitor comprises a first electrode in the first region and a second electrode in the conductive layer.

4. The semiconductor device according to claim 1, wherein the oxide semiconductor layer comprises In, Zn and O.

5. The semiconductor device according to claim 1, wherein the oxide semiconductor material portion comprises In, Zn and O.

6. The semiconductor device according to claim 1, wherein each of the first region, the second region and the third region comprises In, Ga, Zn and O.

7. The semiconductor device according to claim 1, wherein each of the first penetrating portion and the second penetrating portion penetrates the conductive layer, the first insulating layer, the oxide semiconductor layer and the second insulating layer.

8. A semiconductor device comprising:
   a substrate;
   a first conductive layer over the substrate, the first conductive layer parallel to a surface of the substrate;
   a first insulating layer over the first conductive layer;
   a second conductive layer over the first insulating layer;
   an oxide semiconductor layer over the first insulating layer;
   a second insulating layer over the oxide semiconductor layer;
   a first penetrating portion perpendicular to the surface of the substrate; and
   a second penetrating portion perpendicular to the surface of the substrate,
   wherein the oxide semiconductor layer comprises a first region, a second region, and a third region between the first region and the second region,
   wherein the first penetrating portion comprises an oxide semiconductor material portion in an inner portion and an insulating material portion in an outer portion,
   wherein the second penetrating portion comprises a conductive material portion,
   wherein the insulating material portion is in contact with the first region,
   wherein the conductive material portion is in contact with the second region, and
   wherein each of the first region and the second region has a lower resistance than the third region.

9. The semiconductor device according to claim 8,
   wherein the semiconductor device comprises a first transistor and a second transistor electrically connected to each other,
   wherein the first transistor comprises a channel formation region in the oxide semiconductor material portion, and wherein the second transistor comprises a channel formation region in the oxide semiconductor layer.

10. The semiconductor device according to claim 9, wherein the semiconductor device further comprises a capacitor, and
wherein the capacitor comprises a first electrode in the first region and a second electrode in the first conductive layer.

11. The semiconductor device according to claim 8, wherein the oxide semiconductor layer comprises In, Zn and O.

12. The semiconductor device according to claim 8, wherein the oxide semiconductor material portion comprises In, Zn and O.

13. The semiconductor device according to claim 8, wherein each of the first region, the second region and the third region comprises In, Ga, Zn and O.

14. The semiconductor device according to claim 8, wherein each of the first penetrating portion and the second penetrating portion penetrates the first conductive layer, the first insulating layer, the oxide semiconductor layer, the second insulating layer and the second conductive layer.

* * * * *